United States Patent
Ahn et al.

(10) Patent No.: US 6,937,535 B2
(45) Date of Patent: Aug. 30, 2005

(54) SEMICONDUCTOR MEMORY DEVICE WITH REDUCED DATA ACCESS TIME

(75) Inventors: Jin-Hong Ahn, Ichon-shi (KR); Sang-Hoon Hong, Ichon-shi (KR); Se-Jun Kim, Ichon-shi (KR); Jae-Bum Ko, Ichon-shi (KR)

(73) Assignee: Hynix Semiconductor Inc., Kyoungki-Dom (KR)

( * ) Notice: Subject to any disclaimer, the term of this patent is extended or adjusted under 35 U.S.C. 154(b) by 0 days.

(21) Appl. No.: 10/696,144

(22) Filed: Oct. 28, 2003

(65) Prior Publication Data

US 2004/0085835 A1 May 6, 2004

(30) Foreign Application Priority Data

Oct. 29, 2002 (KR) .............................. 10-2002-0066269
Feb. 21, 2003 (KR) .............................. 10-2003-0011121

(51) Int. Cl.$^7$ ................................................ G11C 7/00
(52) U.S. Cl. .............. 365/222; 365/189.04; 365/230.05
(58) Field of Search .............................. 365/63, 189.04, 365/230.03, 230.04, 230.05, 222

(56) References Cited

U.S. PATENT DOCUMENTS

| 5,210,723 | A | | 5/1993 | Bates et al. | |
|---|---|---|---|---|---|
| 5,892,724 | A | * | 4/1999 | Hasegawa et al. | ..... 365/230.03 |
| 5,917,745 | A | * | 6/1999 | Fujii | ............................ 365/63 |
| 6,125,071 | A | | 9/2000 | Kohno et al. | |
| 6,191,988 | B1 | | 2/2001 | DeBrosse | |
| 6,445,611 | B1 | | 9/2002 | Fifield et al. | |
| 6,522,600 | B2 | * | 2/2003 | Ohshima et al. | ............ 365/233 |
| 6,545,936 | B1 | | 4/2003 | Yoo et al. | |
| 6,768,663 | B2 | * | 7/2004 | Ogata | .......................... 365/63 |
| 2002/0016967 | A1 | | 2/2002 | Carlile | |
| 2002/0154536 | A1 | | 10/2002 | Perner | |
| 2002/0159319 | A1 | | 10/2002 | Kirihata et al. | |
| 2003/0051148 | A1 | | 3/2003 | Garney | |

FOREIGN PATENT DOCUMENTS

| JP | 03-127144 | 5/1991 |
|---|---|---|
| JP | 11-339466 | 12/1999 |
| JP | 2002-334579 | 11/2002 |
| JP | 2002-334580 | 11/2002 |

* cited by examiner

*Primary Examiner*—Son Mai

(57) ABSTRACT

A memory device includes at least two cell blocks connected to a global bit line for outputting data in response to an instruction; at least one global bit line connection unit for selectively connecting the global bit line to each cell block under control of a control block, one global bit line connection unit being allocated between the two cell blocks; and said control block for controlling output of data stored in each cell block to the global bit line and restoration of the outputted data of the global bit line to the original cell block or another cell block which is determined by depending upon whether data in response to a next instruction is outputted from the original cell block or another cell block.

6 Claims, 37 Drawing Sheets

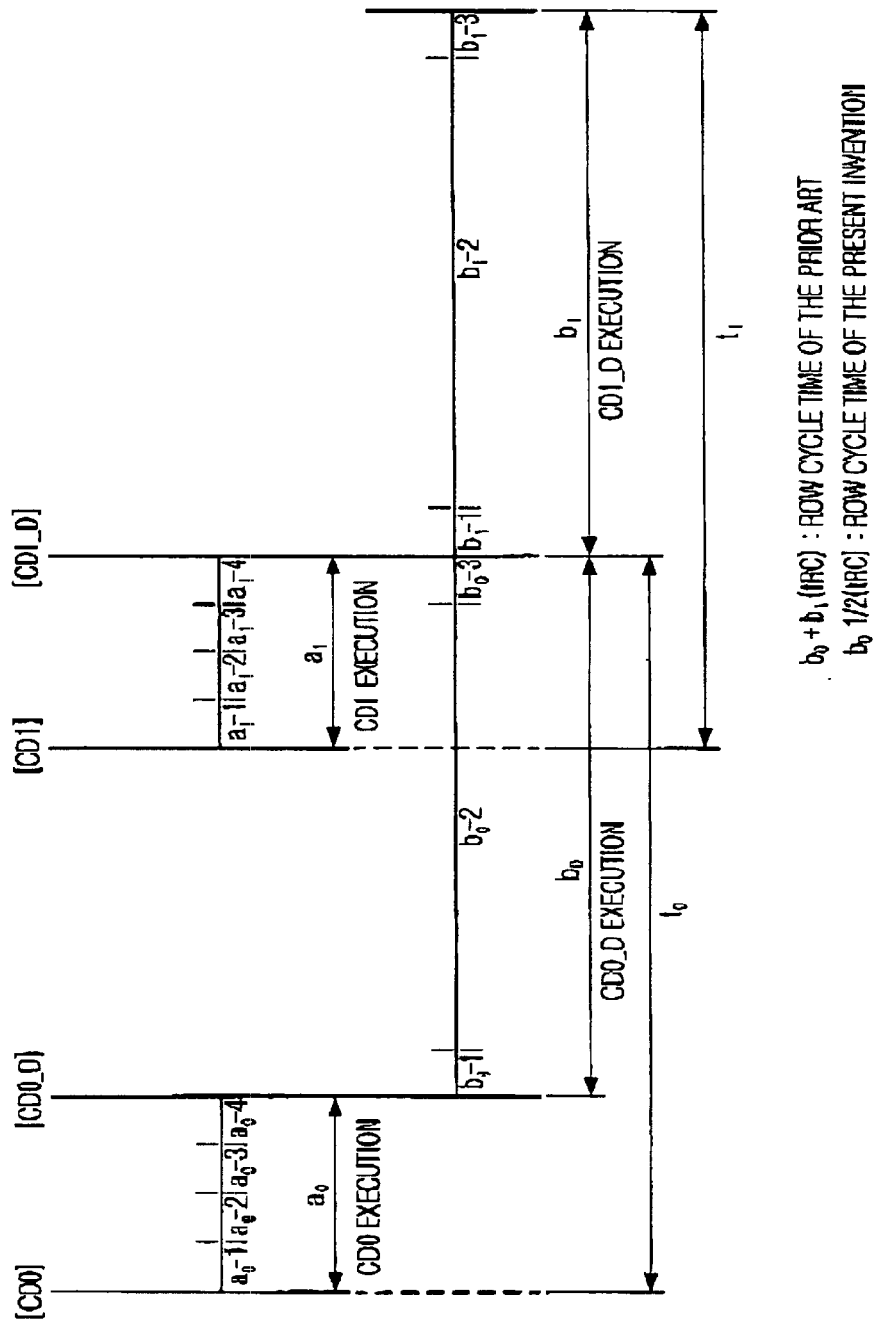

SEMICONDUCTOR MEMORY DEVICE WITH REDUCED DATA ACCESS TIME

FIELD OF THE INVENTION

The present invention relates to a semiconductor memory device; and, more particularly, to the semiconductor memory device capable of providing a reduced data access time.

DESCRIPTION OF RELATED ART

Generally, a semiconductor memory device is classified as a random access memory (RAM) and a read only memory (ROM).

The RAM includes a Dynamic RAM (DRAM) and a Static RAM (SRAM). One cell of the dynamic RAM has one transistor and one capacitor and that of the static RAM does four transistors and two load resistances. The DRAM is used more widespread than the SRAM because the DRAM is more efficient than SRAM in a chip integration and a manufacturing process.

Today, an operation speed of a central processing unit (CPU) is more dramatically advanced than that of the DRAM. As a result, many problems may arise because the operation speed of the memory device is slower than that of CPU. For overcoming these problems, several kinds of scheme in the memory device have been developed for a high speed data transmission.

FIG. 1 is a block diagram showing a conventional memory device.

As shown, the memory device is provided with an instruction controller 200, more than one banks 100, and a data input-output buffer 300. The instruction controller 200 controls the bank 100 in various operation modes, e.g., read, write and refresh execution mode, in response to a plurality of the instructions /RAS, /CAS, /WE, /CS, CKE, CK and the like, inputted from an external part (not shown). The bank 100 has a number of segments 120A to 120H, each segment includes a row address decoder 121 and a column address decoder 122 so that data stored in a unit cell block read out in response to an inputted address or an inputted data is written in the unit cell block of the segment 120A. The data input-output buffer 300 serves to buffering the inputted or the outputted data for the unit cell block of the bank 100.

Typically, the memory device has, e.g., four banks. However, FIG. 1 describes only one bank 100 in detail, because each of the banks has the same structure. Although, for the sake of convenience, elements of the conventional memory device are simplified in FIG. 1, another element may be contained in the conventional memory device.

One bank has input/output (I/O) sense amplifier blocks 110A and 110B for amplifying sensed data outputted from, e.g., eight segments 120A to 120D and 120E to 120H to provide the amplified data to the data input/output (I/O) buffer 300. Each segment is constituted of several unit cell blocks. Furthermore, the I/O sense amplifier blocks 110A and 110B supplies the data inputted from the data input/output (I/0) buffer 300 to the first to eighth segments 120A to 120H.

The first segment 120A includes the row address decoder 121, the column address decoder 122 and a cell area 120A_1. The row address decoder 121 decodes a row address to output the decoded row address to the cell area 120A_1. The column address decoder 122 decodes a column address to output the decoded column address to the cell area 120A_1.

The cell area 120A_1 is constituted of a plurality of unit cell blocks, each having a number of unit cells. One unit cell block 124A is coupled to a pair of the bit line sense amplifier block, e.g., 123A and 123B, for sensing and amplifying the data outputted from the unit cell block, e.g., 124A.

For example, the 256 Mb memory device includes typically, four 64 Mb banks. In this case, a size of the segment is 8 Mb because each bank 100 includes eight segments 120A to 120H. Each segment, e.g., 120A has eight unit cell blocks 124A to 124H and each unit cell block, e.g., 124A has 256 word lines and 4 Kb(4×1024) bit lines. Thus, each unit cell block, e.g., 124A has 256×4 Kb unit cells. Hereinafter, it is assumed that the size of the segment is 8 Mb and each unit cell block has 256 word lines.

As mentioned, if each unit cell block, e.g., 124A is coupled to two sense amplifier blocks, e.g., 123A and 123B, it is needed that the segment 120A having eight unit cell blocks 124A to 124H should have sixteen bit line sense amplifier blocks. However, the segment 120A of the conventional memory device is implemented by using nine bit line sense amplifier blocks 123A to 123I. Each bit line sense amplifier block, e.g., 123B is commonly connected to the two neighboring unit cell blocks, e.g., 124A and 124B. Namely, two neighboring unit cell blocks, e.g., 124A and 124B commonly hold one bit line sense amplifier block, e.g., 123B for efficiency of chip integration. In this case, the bit line sense amplifier block, e.g., 123B may be selectively coupled to the unit cell blocks 124A and 124B under control of the instruction controller 200.

FIG. 2 is a schematic circuit diagram demonstrating a bit line sense amplifier block and a unit cell block shown in FIG. 1. That is, the partial structure of two unit cell blocks 124A and 124B and the bit line sense amplifier block 123B is described.

As shown, the first unit cell block 124A has 256×4 Kb unit cells, each having one MOS transistor and one capacitor, wherein a word line is coupled to the gate of the MOS transistor and each of bit lines BL and /BL is coupled to the drain of the MOS transistor. The source of the MOS transistor is coupled to one electrode of the capacitor and the other electrode of the capacitor is coupled to a cell plate supplier, e.g., a ground voltage. For the sake of convenience, since the structure of the second unit cell block 124B is identical to first unit cell blocks 124A, the structure of the second unit cell block 124B is not described in detail.

The bit line sense amplifier block 123B is provided with a bit line sense amplifier 123B_4, a precharge block 123B_3, an equalization block 123B_2, a data output block 123B_5 and first and second bit line sense amplifier connection units 123B_1 and 123B_6.

The bit line sense amplifier 123B_4 is enabled by bit line sense amplifier enable signals RTO and /S for amplifying the difference between two voltage levels supplied to the bit line pair BL0 and /BL0 as a sensed data. The precharge block 123B_3 precharge the bit line pair BL0 and /BL0 up to a bit line precharge voltage Vblp in response to a precharge enable signal BLEQ'. The precharge enable signal BLEQ' is enabled if the bit line sense amplifier 123B_4 is disabled. The equalization block 123B_2 is enabled by an equalization signal BLEQ so as to equalize voltage levels appearing on the bit line pair BL0 and BL1 connected to the first cell unit block 124A. The data output block 123B_5 outputs the data sensed and amplified by the bit line senses amplifier 123B_4 to a data line pair DB0 and /DB0 by a column control signal, e.g., CD0, generated by using a column address. If the first connection unit 123B_1 is enabled by a first sense amplifier connection signal BISH, the bit line sense amplifier 123B_4 is connected to the first unit cell block 124A. Otherwise, if the second sense bit line sense amplifier connection unit 123B_6 is enabled by a second connection signal BISL, the bit line sense amplifier 123B_4 is connected to the second unit cell block 124B.

Herein, the first unit cell block 124A is provided with a plurality of unit cells coupled to N number of bit line pairs, e.g., BL0 and /BL0, . . . , BLN−1 and /BLN−1, and M number of word lines e.g., WL0, . . . , WLM-1. Namely, a size of the first unit cell block is N×M bits. Herein, M and N are positive integers. Since the first unit cell block 124A is coupled to the first and second bit line sense amplifier blocks 123A and 123B, the number of the sense amplifiers included in each bit line sense amplifier block 123A or 123B is N/2. So, in the first unit cell block 124A, some of the data coupled to some bit line pairs, e.g., BL1 and /BL1, . . . , BLN−1 and /BLN−1, in response to an instruction is outputted to the first bit line sense amplifier block 123A; and others coupled to other bit line pairs, e.g., BL0 and /BL0, BL2 and /BL2, . . . , is outputted to the second bit line sense amplifier block 123B.

Moreover, the second bit line sense amplifier block 123B is selectively connected to one of the first and second unit cell blocks 124A and 124B in response to the first and second sense amplifier connection signals BISH and BISL.

FIGS. 3 and 4 are timing diagrams describing operation of the conventional memory device described in FIGS. 1 and 2.

Hereinafter, referring FIGS. 1 to 4, the operation of the conventional memory device is described in detailed.

First, when an address is inputted to the memory device, the inputted address is classified into a bank address, a row address and a column address. Furthermore, the row address is split into a cell block address and a local address. The bank address is used for selecting one among four banks. One segment and one unit cell block in the selected bank are selected by the cell block address. The local address is used for selecting one word line in the selected unit cell block, and the column address is used for selecting one unit cell in 4 Kb unit cells selected by the word line.

Continuously, it is described the operation of the memory device in a read mode.

First of all, one bank, e.g., 100, is selected by a bank address in response to a read instruction RD0. Herein, a row address is then inputted to a row address decoder 121, included in each segment of the selected bank 100.

Then, the row address decoder 121 decodes the cell block address and the local address included in the inputted row address and one unit cell block 124A in a selected segment 120A of the bank 100 is selected by using the cell block address and the local address.

Next, a word line, e.g., WL0, of 256 word lines in the first unit cell block 124A, is activated by the local address outputted from the row address decoder 121 when the bit line pairs BL0 and /BL0, . . . , BLN−1 and /BLN−1 included in the first unit cell block is typically precharged with a half of a supply voltage by the precharge blocks 123A_3 and 123B_3 shown in FIG. 2.

After that, each bit of 4 Kb data stored in unit cells connected to the activated word line WL0 is individually supplied to each of bit line pairs BL0 and /BL0, . . . , BLN−1 and /BLN−1. At this time, if the first sense amplifier connection signal BISH shown in FIG. 2 is enabled and the second sense amplifier connection signal BISL is disabled, the bit line sense amplifier blocks 123A and 123B are connected to the selected first unit cell block 124A.

Next, the bit line sense amplifiers 123A_4 and 123B_4 senses and amplifies the data supplied at the bit line pairs BL0 and /BL0, . . . , BLN−1 and /BLN−1.

That is, the bit line sense amplifier 123B senses and amplifies data supplied to some bit line pairs BL0 and /BL0, BL2 and /BL2, . . . , BLN−2 and /BLN−2. Simultaneously, the bit line sense amplifier 123B senses and amplifies data supplied to other bit line pairs BL1 and /BL1, BL3 and /BL3, . . . , BLN−1 and /BLN−1. Of course, the bit line sense amplifier block 123B allocated between two unit cell blocks 124A and 124B is selectively connected to the two neighboring unit cell blocks 124A and 124B at a preferred timing scheme determined by the instructions /RAS, /CAS, /WE, /CS, CKE, and CK etc, for obtaining a high integration and a high operation speed of the memory device.

And then, the column address decoder 122 decodes the inputted column address in response to the read instruction RD0 to output the column select signal, e.g., CD0, CD1, CD2, . . . The 4 Kb data is amplified by the bit line sense amplifier blocks 123A and 123B; and the selected data by the column select signal is outputted to the I/O sense amplifier block 110A shown in FIG. 1 through the use of the data line pair DB and /DB.

The I/O sense amplifier block, e.g., 110A, amplifies the selected data signal for compensating a loss occurred in a relatively long data line pair DB and /DB and outputs the amplified data signal to the data I/O buffer 300. The data input-output buffer 300 temporarily stores and outputs the amplified data outputted from each bank to an external part (not shown) at predetermined data output timing scheme.

In the meanwhile, selected 4 Kb data latched after sensed and amplified by the bit line sense amplifier blocks 123A and 123B should be restored in selected 4 Kb unit cells connected to the word line WL0 activated by the read instruction RD0.

In the conventional memory device, a capacitance of the capacitor included in the unit cell is a few femto-farad and charge amount stored in the capacitor is very small. As a result, after the charge stored in the capacitor of the cell-unit is discharged to the bit line as sensed data, the sense data is amplified by the sense amplifier and should be restored in the capacitor. Typically, the capacitor can be recharged over 90 percentages of a charging capability of the capacitor by using the above restoration operation.

Furthermore, since a small amount of charges stored in the capacitor may be lost with lapse of time, the memory device needs a refresh operation for periodically recharging the capacitor. Therefore, it is necessary that the memory device spends an additional time for the refresh or the data restoration operation in order to prohibit the data loss in the capacitor.

FIG. 3 is a timing diagram showing the operation of continuously and sequentially accessing at least two data in one bank of the memory device shown in FIG. 1. Hereinafter, the operation of continuously and sequentially retrieving at least two data in one bank is referred as a intra bank data access.

As shown, if the first read instruction RD0 is inputted to the memory device, the inputted row address is divided into the cell block address and the local address at a first timing period t0. Herein, the cell block address and local address are individually used for selecting one unit cell block and one word line, e.g., the first unit cell block 124A and the word line WL0. Then, at the first timing period t0, 4 Kb data stored in unit cells are sensed and amplified in response to the activated word line WL0 by the bit line sense amplifier blocks 123A and 123B connected to the first unit cell block 124A.

Next, in a second timing period t1, a selected data D0 of the amplified 4 Kb data is selected and outputted by the column select signal CD0 generated from the inputted column address and, at the same time, the amplified 4 Kb data are restored in the original unit cells coupled to the activated word line WL0. As above described, one read operation is completed during two timing periods t0 and t1.

Likewise, after the two timing periods t0 and t1, if a second read instruction RD1 is inputted, the second read operation by the second read instruction RD1 is then executed during two timing periods t2 and t3.

The normal row cycle time shown in FIG. 3 is defined as a time period since a word line is activated in response to a current row address or an instruction until a next word line is activated by a next row address or a next instruction.

Hereinafter, in detail, operation of a data writing mode is described.

Like the data reading mode, the writing operation also includes the step that 4 Kb data are sensed and amplified by the bit line sense amplifier blocks after a selected word line is activated.

In a first timing period t0, one word line is activated by the row address; and, then, 4 Kb data in response to the activated word line are sensed and amplified by the bit line sense amplifiers blocks, e.g., 123A and 123B.

In a second timing period t1, data inputted from external-part is latched in a bit line sense amplifier selected in response to a column select signal, e.g., CD0. Herein, the column select signal CD0 used for storing the new data is decoded from the column address. Then, 4 Kb data are stored in unit cells selected by the activated word line. Herein, it may be unnecessary to sense and amplify the inputted data which is latched in the bit line sense amplifier because voltage level of the inputted data are enough high to be sensed and stored. As above described, the writing operation is also carried out during the two timing periods t0 and t1.

As mentioned above, the memory device having a capacitor which is served as a storage element needs two timing periods for completing one data reading r writing operation. First, a data stored in the unit cells is sensed and amplified, or an inputted data is sensed at the first timing period t0. Second, the amplified data is outputted to external part, or the inputted data from external part is stored in each unit cell at the second timing period.

In a high integrated memory device, the quantity of stored charge stored as a data signal is relatively small because the size of the capacitor is very small. As a result, if the charge stored in the capacitor is not amplified periodically, the charge stored in the capacitor may be lost to thereby allow the stored data to be corrupted. Namely, the refresh operation including the data restoration operation should be periodically carried out for preserving the data of the unit cell after the reading or writing operation as described.

In the conventional memory device, after the data are accessed by one instruction, the next data can not be accessed immediately, since the initially accessed data should be restored to the original unit cells.

On the other hand, the conventional memory device employs a bank interleaving mode for reducing the data restoration time in a inter bank data access, i.e., to thereby improve the operation speed of the memory device. The inter bank data access means that at least two data stored in different banks are continuously and sequentially accesses.

In the bank interleaving mode, the conventional memory device may continuously output data to the external part in response to the inputted instructions, without any additional data access time for a restoration operation. Namely, the next data may be accessed and outputted from the neighboring bank, during the current data is restored in the original bank.

FIG. 4 is a timing diagram describing a bank interleaving mode of the conventional memory device shown FIG. 1.

As shown, in the bank interleaving mode of the memory device, a first word line of a first bank, e.g., WL0 of B0, is activated by a first read instruction RD0 at a first timing period t0 and a first data D0 in response to the first activated word line WL0 is outputted and restored at a second timing period t1. Simultaneously, at the second timing period t1, a next read instruction RD1 is continuously inputted in a second bank B1. And, a second word line of the second bank, e.g., WL0 of B1, is activated; and a second data D1 in response to the second activated word line WL0 is outputted at the second timing period t1. Thus, in the bank interleaving mode, the first to third data D0, D1 and D2 are continuously outputted in response to the continuously first to third read instructions RD0, RD1 and RD2.

As describe above, if the data outputted from the neighboring bank are sensed and amplified by the next inputted instruction in neighboring bank while the present data are restored in the current bank, the data access time may be reduced.

However, as mentioned above, it is difficult to apply the bank interleaving mode in the intra bank data access of the conventional memory device and, to obtain higher data access time in the convention memory device. That is, in the intra bank data access of the convention memory device, the conventional memory device should receive the next instruction after the current data outputted in response to the present instruction are restored in the original unit cell.

Therefore, even though the conventional memory device may use the bank interleaving mode, the data access speed in the memory device is greatly depend on a data access pattern, i.e., the inter bank data access or the intra bank data access.

If a system uses the conventional memory device whose data access speed is seriously affected by the data access pattern, there may be occurred some critical problems about the operation reliability of the system because the operation speed of the system may not be stable.

Therefore, it is necessary to develop a memory device which can access the data on high speed less sensitive to the data access pattern.

SUMMARY OF THE INVENTION

It is, therefore, an object of the present invention to provide a method and an apparatus of a memory device for accessing data on high speed so that the data restoration time does not affect seriously the data access time.

In addition, there is provided a method and a apparatus of the memory device for high speed data access unrelated a data access pattern by using inter or intra cell block interleaving mode which can make the memory device operate on high speed without reduction of data access time when at least two data accesses are sequentially occurred in the same bank.

In accordance with an aspect of the present invention, there is provided a memory device including at least two cell blocks connected to a global bit line for outputting data in response to an instruction; at least one global bit line connection unit for selectively connecting the global bit line to each cell block under control of a control block, one global bit line connection unit being allocated between the two cell blocks; and said control block for controlling output of data stored in each cell block to the global bit line and restoration of the outputted data of the global bit line to the original cell block or another cell block which is determined by depending upon whether data in response to a next instruction is outputted from the original cell block or another cell block.

In accordance with another aspect of the present invention, there is provided a memory device including a plurality of unit cell blocks, each having a plurality of unit cells, a first local bit line sense amplifier block for sensing and amplifying data from a unit cell, and a second local bit line sense amplifier block for sensing and amplifying data from another cell unit; a first global bit line sense amplifier block for latching data sensed and amplified from the first local bit line sense amplifier block; a second global bit line sense amplifier block for latching data sensed and amplified from the second local bit line sense amplifier block; a first global bit line connection unit, in response to a first control signal, for selectively connecting either the second local bit line sense amplifier block of a first unit cell block to the second global bit line sense amplifier block or the first local bit line sense amplifier block of a second unit cell block to the first global bit line sense amplifier block; a second global bit line connection unit, in response to a second control signal, for selectively connecting either the second local bit line sense amplifier block of a third unit cell block to the second global bit line sense amplifier block or the first local bit line sense amplifier block of a forth unit cell block to the first global bit line sense amplifier block; and a control unit for generating the control signals to thereby control a storing operation of the data latched in the first and the second global bit line sense amplifier block.

In accordance with another aspect of the present invention, there is provided a memory device including a plurality of first unit cell blocks, each having a plurality of unit cells, a first local bit line sense amplifier block for sensing and amplifying data from a unit, and a second local bit line sense amplifier block for sensing and amplifying data from another unit cell; a first global bit line sense amplifier block for latching data sensed and amplified by the first local bit line sense amplifier block; a second global bit line sense amplifier block for latching data sensed and amplified by the second local bit line sense amplifier block; and a control unit for controlling a restoration execution of data latched in the first and the second global bit lines.

In accordance with another aspect of the present invention, there is provided a memory device including a plurality of unit cell blocks, each including a local bit line sense amplifier block for sensing and amplifying data stored in a plurality of unit cell and having the plurality of th unit cells; a global bit line sense amplifier block for latching data sensed and amplified by the plurality of the local bit line sense amplifier block; and a control unit for controlling the use of the latched data in a restoration execution.

In accordance with another aspect of the present invention, there is provided a memory device including a cell area including N+1 number of unit cell blocks, each having M number of word lines for responding to inputted row address; and a control unit for controlling the cell area to thereby restoring data accessed in a first unit cell block selected out of the N+1 number of the unit cell blocks either in the first unit cell block or in a second unit cell block.

In accordance with another aspect of the present invention, ther is provided a memory device including a cell area having N+1 number of unit cell blocks, each including M number of word lines for responding to an inputted row address; a predetermined cell block table for storing information wherein at least more than one word line among the (N+1)×M number of the word lines is assigned as a predetermined restorable word line by using the information; a tag block for sensing an input logical cell block address for designating a unit cell block to be accessed to converting the input logical cell block address into a physical cell block-address for designating a unit cell block to be restored; and a control unit for controlling the tag block and the predetermined cell block table for activating one word line of the unit cell block selected by the physical cell block address.

In accordance with another aspect of the present invention, there is provided a memory device including a cell area including N+1 number of unit cell blocks adding N number of the unit cell blocks individually having M number of word lines for responding to an inputted row address and an additional unit cell block having M number of the word lines; a data access control unit for controlling operation that data accessed in a first unit cell block selected in the N+1 number of the unit cell blocks are restored either in the first unit cell block or in a second unit cell block; and an instruction control unit for controlling an operation that a cell block address in response to a second instruction being at an active next timing period is conversed and a bit line in response to a first Instruction is precharged during accessing data in response to the first present active instruction.

In accordance with another aspect of the present invention, there is provided a method for operating a memory device having first and second cell blocks, each having a number of cell units including the steps of: (A) sensing and amplifying a first data in the first cell block; (B) restoring the first data in the second cell block; and (C) sensing and amplifying a second data in the first unit block, wherein both the step (B) and the step (C) are performed at a substantially simultaneous timing period.

In accordance with another aspect of the present invention, there is provided a method for operating a memory device having an N+1 number of unit cell blocks adding an N number of unit cell blocks and an additional unit cell block individually both corresponding to an inputted row address and having an M number of word lines, N and M being positive integers including steps of: (A) sensing and amplifying a first data in a first unit cell block selected out of the N+1 number of the unit cell blocks; (B) restoring the first data in a second unit cell block selected out of the N+1 number of the unit cell blocks; and (C) sensing and amplifying a second data in the first unit cell block, wherein both the step (B) and the step (C) are performed at a substantially simultaneous timing period.

In accordance with another aspect of the present invention, there is provided 67. A method for operating a memory devic including an N+1 number of unit cell blocks, adding a N number of unit cell blocks and an additional unit cell block, both corresponding to an inputted row address and having a M number of word lines, N and M being positive integers, comprising the steps of: (A) activating a first word line of a first unit cell block selected out of the N+1 number of the unit cell blocks; (B) sensing and amplifying a K number of data in response to the first word line; (C) moving the K number of the sensed and amplified date in response to the first word line to the other unit cell block having a predetermined word line in response to the first word line and restoring thereof; (D) activating a second word line of the first unit cell block; (E) sensing and amplifying a K number of data in response to the second word line, wherein the steps (C) and (E) are performed at substantially simultaneous timing period.

In accordance with another aspect of the present invention, there is provided a method for operating a memory device having a cell area containing an N+1 number of unit cell blocks, adding an N number of unit cell blocks and an additional unit cell block, both corresponding to an inputted row address and having an M number of word lines, N and M being positive integers including the steps of: (A) sensing data by both a logical cell block address for selecting a N number of logical unit cell blocks by receiving the row address and a local address for selecting one out of the M number of word lines included in the s lected unit cell block; (B) converting the logical cell block address to a physical cell block address for selecting one out of a N+1 number of the physical cell block addresses; (C) activating a first word line in response to the local address in a first unit cell block selected in response to the converted physical cell block address; (D) sensing and amplifying the data in response to the first word line; (E) moving the first data to a second unit cell block of which a predetermined word line is assigned in response to the first word line; (F) activating a second word line of the first unit cell block in response to the local address inputted for a next instruction; and (G) sensing and amplifying a second data in response to the second word line, wherein the steps E and G are occurred at a substantially simultaneous timing period.

In accordance with another aspect of the present invention, there is provided a method for operating a memory device including a cell area having an N+1 number of unit cell blocks, adding an N number of unit cell blocks and an additional unit cell block, individually both corresponding to an inputted logical cell block address and having an M number of word lines, N and M being positive integers including the steps of: (A) receiving a first logical cell block address in response to a first instruction and thereof converting to a first physical cell block address for selecting one out of a N+1 number of the physical cell block addresses; (B) sensing and amplifying a first data in a first unit cell block in response to the first physical cell block address; (C) moving the first data and latching thereof; (D) precharging the first data sensed and amplified in the first unit cell block; (E) converting to a second physical cell block address after receiving a second logical cell block address in response to a second instruction; (F) moving the first latched data to the second unit cell block selected out of the N+1 number of the unit cell blocks and restoring thereof; and (G) of sensing and amplifying the second data in the second unit cell block in response to the second physical cell block address, wherein the steps F and G are occurred at a substantially simultaneous timing period.

BRIEF DESCRIPTION OF THE DRAWINGS

The above and other objects and features of the instant invention will become apparent from the following description of preferred embodiments taken in conjunction with the accompanying drawings, in which:

FIG. 36 is a timing diagram showing operation of the memory device shown in FIG. 34 in comparison with that of the memory device shown in FIG. 18.

DETAILED DESCRIPTION OF THE INVENTION

Hereinafter, a semiconductor memory device in accordance with the present invention will be described in detail referring to the accompanying drawings.

Figure 5:
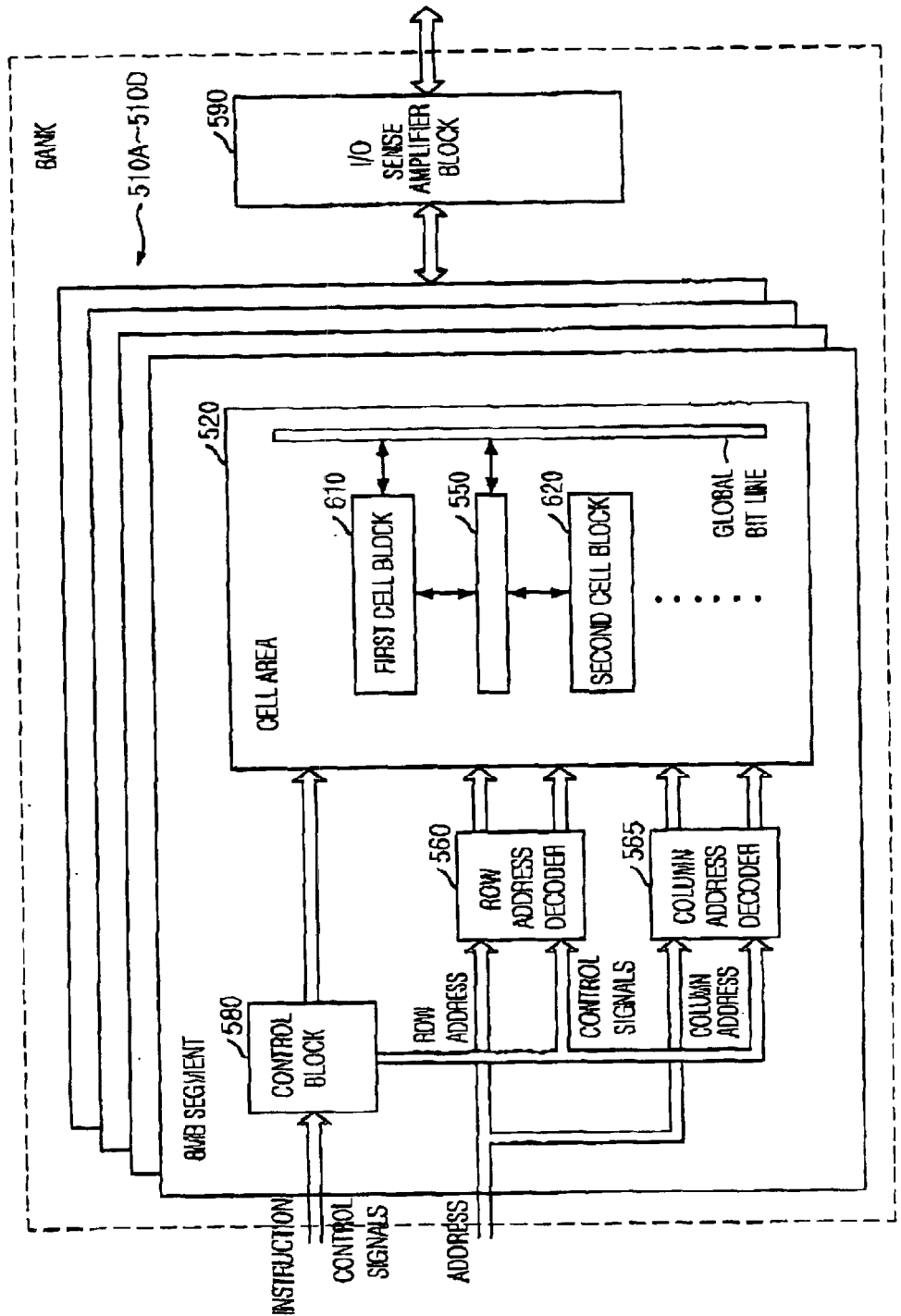
FIG. 5 is a block diagram describing a semiconductor memory device in accordance with a preferred embodiment of the present invention.

Referring to FIG. 5, there is shown a block diagram showing a semiconductor memory device in accordance with a preferred embodiment of the present invention.

Figure 1:
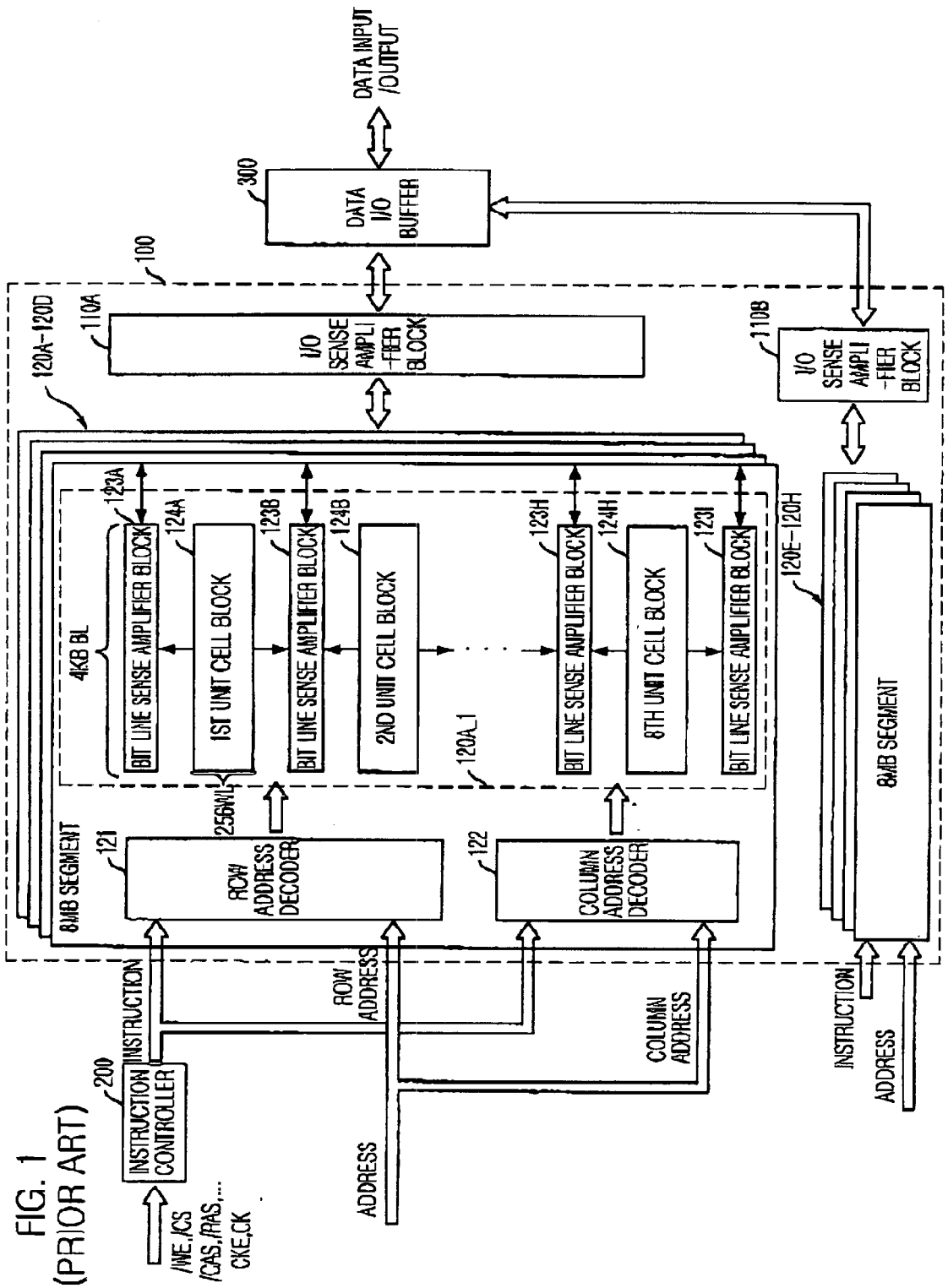
FIG. 1 is a block diagram showing a conventional memory device.

As shown, the semiconductor memory device includes a plurality of banks. Each bank has at least one segment 510A to 510D and an input/output (I/O) sense amplifier block 590. The segment, e.g., 510A, includes a cell area 520, a control block 580, a row address decoder 560 and a column address decoder 565. Herein, because the row and column address decoder 560 and 565 are similar to those of the conventional memory device as shown in FIG. 1, detailed descriptions about operation of the row and column address decoder 560 and 565 is omitted for the sake of convenience.

Figure 6:
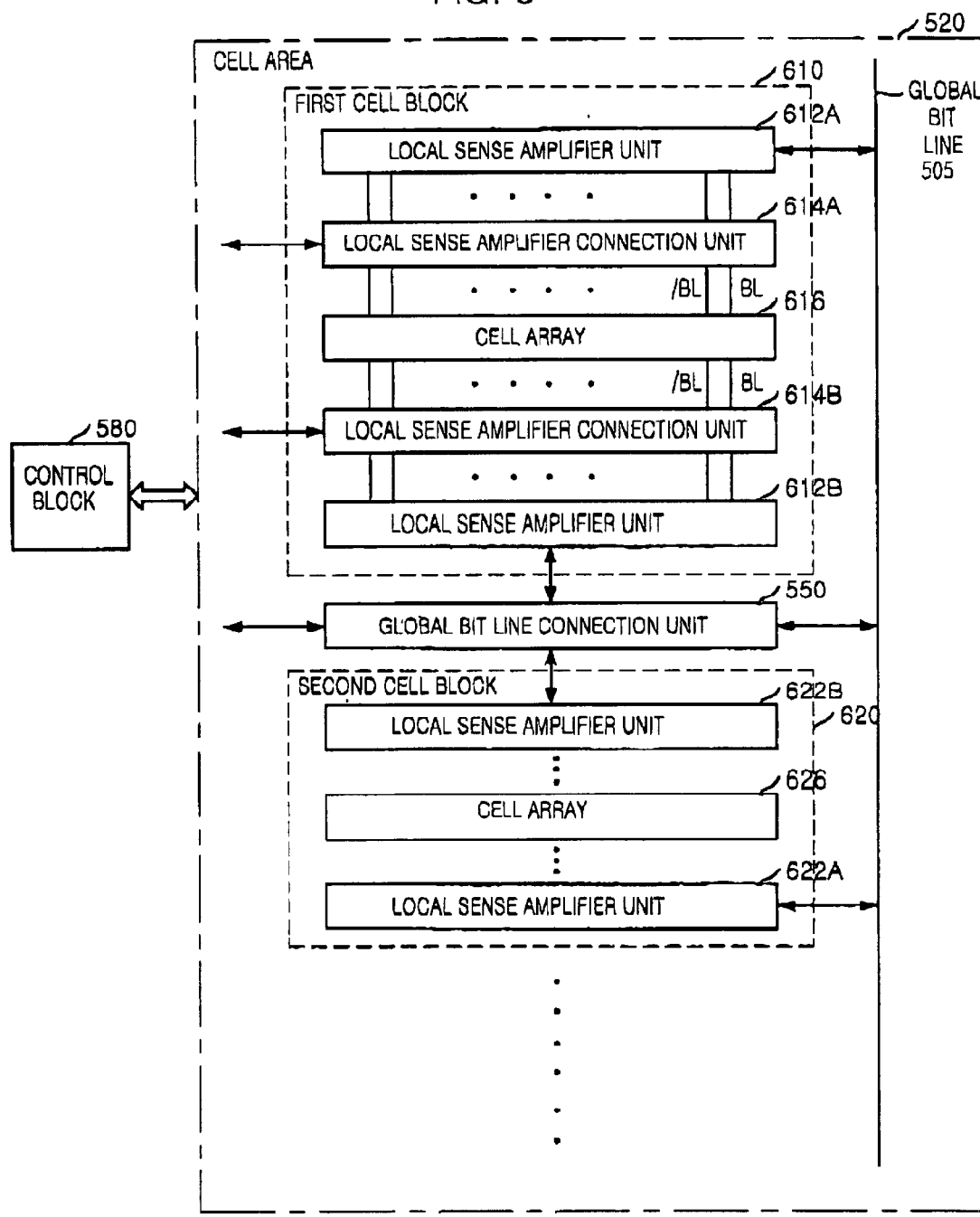
FIG. 6 is a block diagram showing a segment in the semiconductor memory device in accordance with an embodiment of the present invention.

Referring to FIG. 6, the cell area 520 includes at least two cell blocks, e.g., 610 and 620, at least one global bit line connection unit, e.g., 550. The cell block, e.g., 610, outputs data through the use of a global bit line 505 in response to an instruction. The global bit line connection unit 550 allocated between the two cell blocks, e.g., 610 and 620, serves to selectively connect the global bit line 505 to each cell block, e.g., 610 or 620. For the sake of convenience, the row address decoder and the column address decoder identical to those shown in FIG. 5 does not described in the segment embodiment, hereinafter.

The memory device can support an "intra cell block interleaving mode". Hereinafter, the inter cell block interleaving mode is defined as an operation that during a current data in response to a current instruction is restored in the original cell block or in another cell block, a next data in response to a next instruction is simultaneously outputted from the same cell block.

For implementing the intra cell block interleaving mode, the control block 580 controls the cell area in a manner that a first data is restored into the original cell block, e.g., 610 and a second data is simultaneously outputted from the same cell block, e.g., 610 in response to a next instruction, after the cell block, e.g., 610 outputs the first data to the global bit line 505 in response to an instruction.

In detail, a first cell block 610 includes a first cell array 616, a first local sense amplifier unit 612A and a first local sense amplifier connection unit 614A. The first cell block 610 further includes a second local sense amplifier unit 612B and a second local sense amplifier connection unit 614B.

The first cell array 616 has a plurality of unit cells and is coupled to the first and the second local sense amplifier units 612A and 612B through the first and second local sense amplifier connection units 614A and 614B. The first local sense amplifier block 612A amplifies and outputs a first data outputted from the first cell array 616 to the global bit line 505. The first local sense amplifier connection unit 614A serves to selectively connect the first cell array 616 to the first local sense amplifier block 612A. As soon as the first data from the first cell array 616 is supplied to the first local sense amplifier unit 612A, the first cell array 616 is isolated from the first local sense amplifier block 612A by the first local sense amplifier connection unit 614A.

After the first data is coupled to the input/output sense amplifier block 590, the first data should be restored. Thus, the global bit line connection unit 550 connects the global bit line 505 to the second local sense amplifier unit 612B. Then, the first data is amplified by the second local sense amplifier unit 612B; and the amplified first data is restored in the original cells. Simultaneously, a second data in response to the next instruction can be outputted from the same cell array 616 or another cell array, e.g., 626 after amplified by the local sense amplifier unit, e.g., 612A or 622A.

Thus, a data access time of the inventive memory device is not depended upon whether the first and second data are accessed on the same cell blocks or each different cell block in the intra cell block data access. Namely, the inventive memory device can guarantee stable operation speed without depending on a data access pattern.

Figure 7:
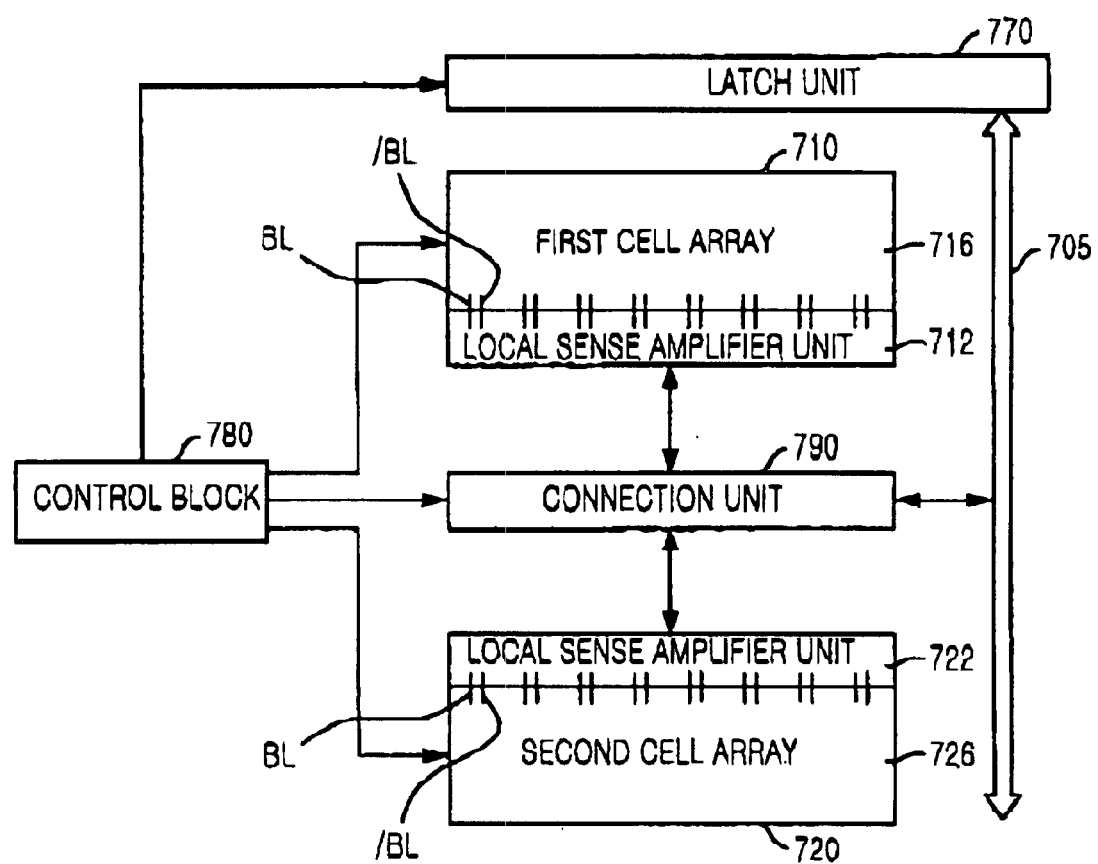
FIG. 7 is a block diagram describing a segment in the semiconductor memory device in accordance with another embodiment of the present invention.

FIG. 7 is a block diagram describing a segment in the semiconductor memory device in accordance with another embodiment of the present invention.

As shown, the segment of the semiconductor memory device includes a first cell block 710, a second cell block 720, a connection unit 790 and a control block. And the segment further includes a latch unit 770 and the cell area is couple to a control block 780 which is similar to the control block shown in FIG. 6.

Each of the first and the second cell blocks 710 and 720 has a plurality of unit cells and a local sense amplifier unit 712 or 722. The connection unit 790 is used for selectively connecting or disconnecting an alternative of the first and second cell block 710 and 720 to a global bit line 705. The latch unit 770 temporary latches a data supplied in the global bit line 705. The control block 780 supports an intra cell block interleaving mode.

For supporting the inter cell block interleaving mode, the control block 780 controls the cell area in a manner that a first data from the first cell block 710 is restored into the other cell block, e.g., 720, and a second data is simultaneously outputted from the same cell block, e.g., 710 in response to a next instruction, after a first cell block, e.g., 710 outputs a first data to the global bit line 705 in response to a instruction.

In detail, if the second data in response to the next instruction is sequentially accessed in the first cell block 710 after the first data in response to the current instruction is accessed in the same cell block 710, the first data is restored not in the original cell block 710 but in the second cell block 720. At this time, the latch unit 770 is used for temporarily latching the first data supplied to the global bit line 705.

Namely, first of all, the connection unit 790 connects the first cell block 710 to the global bit line 705 for outputting the first data. The first data is outputted to an external circuit and latched in the latch unit 770. Then, the connection unit 790 connects the second cell block 720 to the global bit line 705 for restoring the latch d first data, while the second data is accessed and amplified by the local sense amplifier unit 712 of the first cell block 710.

If the second data is accessed and outputted from the second cell block, the latched first data is restored in the original cell block 710 while the second data for the second cell block 720 is amplified by the local sense amplifier unit 722 of the first cell block 720.

Thus, the data access time of the inventive memory device of the present invention is not depended upon whether the first and second data are outputted from the same cell block or a different cell block. Namely, the inventive memory device can guarantee a stable operation speed less sensitive to a data access pattern.

Figure 8:
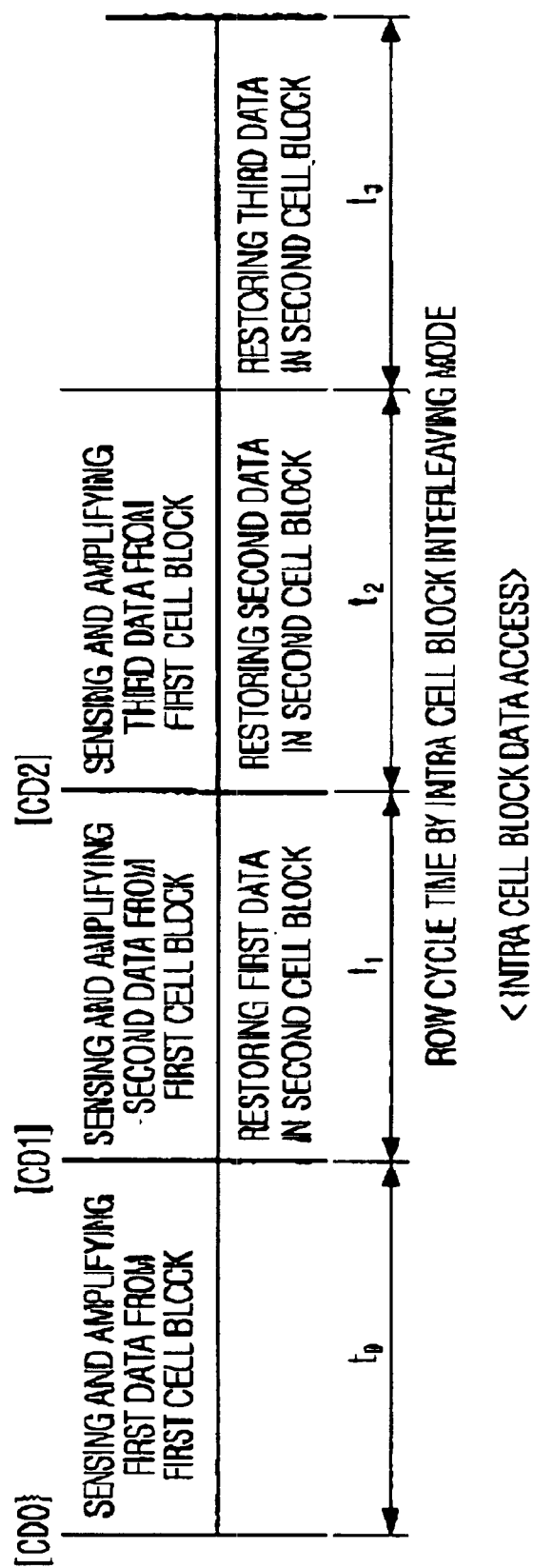
FIGS. 8 and 9 are timing diagrams depicting operation of the semiconductor memory device, depending upon a data access pattern.
Figure 9:
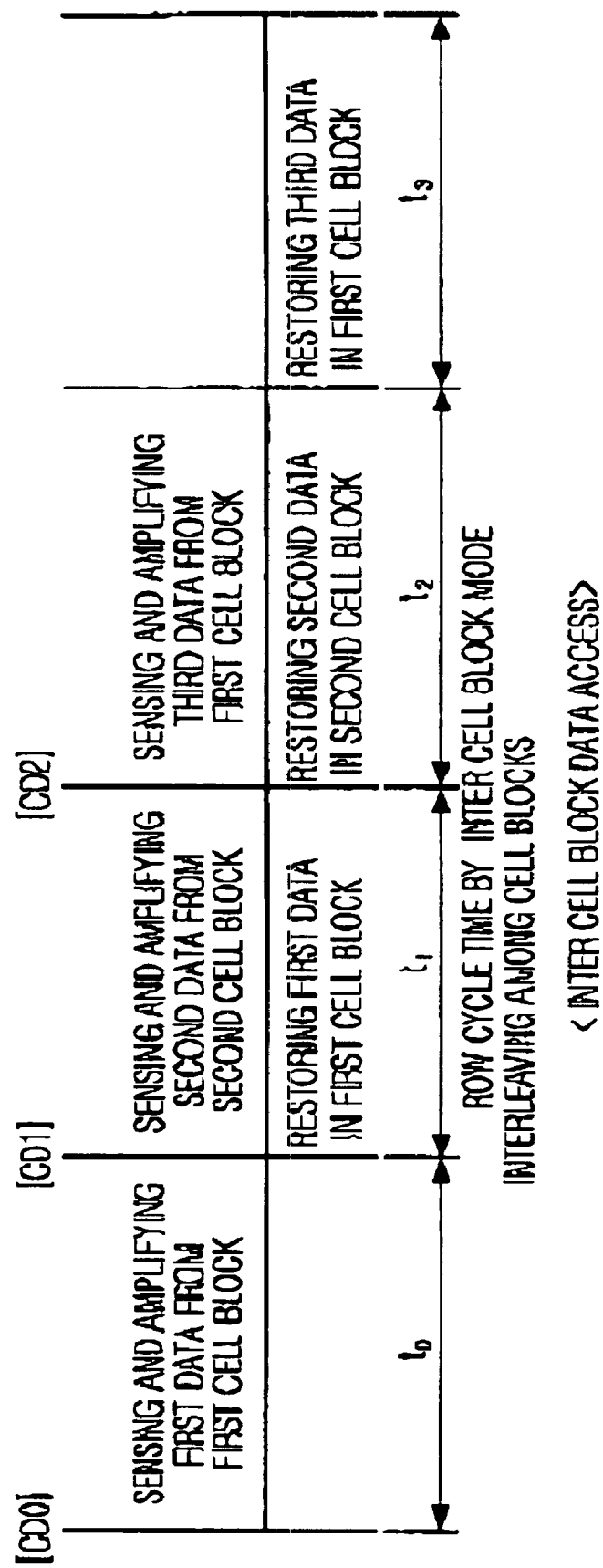

FIGS. 8 and 9 are timing diagrams depicting operation of the semiconductor memory device, depending upon a data access pattern.

Herein, as shown in FIGS. 7 to 9, there is described the operation of the memory device in accordance with the present invention. First, referring to FIG. 8, there is described the operation of the memory device in an intra cell block data access.

As shown, by sequentially inputted instructions CD0 to CD2, e.g., the first data is sensed and amplified in the first cell block 710 at a first timing period t0. Herein, at a second timing period t1, the first data is restored in the second cell block and the second data is sensed and amplified in the same first cell block 710.

Herein, at a third timing period t2, the second data is restored in the second cell block 720 and the third data is sensed and amplified in the same first cell block 710. And next, the third data is restored in the second cell block 720 at the forth timing period t3.

After the first data is sensed and amplified by the local sense amplifier 712 included in the first cell block 710, the first data latched by the latch block 770 moves to the second cell block 720 for first data restoration time.

The data exchange between the latch block 770 and the first or the second cell block 710 or 720 is performed through the use of the global bit line 705. The global bit line 705 is selectively connected to the first and the second cell blocks 710 and 720 by the connection unit 790.

Referring to FIG. 9, in an inter cell block data access, the second data is accessed in the second cell block 720 after the first data is accessed in the first cell blocks 710.

When first to third data are alternatively retrieved in the first and the second cell blocks 710 and 720 in response to continuously inputted instructions CD0 to CD2, the first data is sensed and amplified in the first cell block 710 at a first timing period t0; and then, at a second timing period t1, the first data is restored in the first cell block 710 and, at the same time, the second data is sensed and amplified in the second cell block 720.

Next, at a third timing period t2, the second data is restored in the second cell block 720; and, at the same time, the third data is sensed and amplified in the first cell block 710. And then, the third data is restored in the first cell block 710 at the forth timing period t3.

For instance, after the first data is sensed and amplified, the first data latched by the latch block 770 moves to the first or the second cell block 710 or 720 for the data restoration time. Namely, when the data are alternatively retrieved from the first and the second cell blocks 710 and 720 in the inter cell block data access, an inter cell block interleaving mode is performed in a manner that another data accessed by a next instruction is sensed and amplified during a first data latched in the latch block 770 is restored in the original cell block.

In the case that an inputted instruction is the read instruction, the data latched in the latch block 770 is outputted to the external part; otherwise, in a written mode, the data inputted from the external part is replaced with the latched data.

Since, in the memory device of the present invention, data access operation and restoration operation are simultaneously carried out at the same row cycle time, the data access time can be dramatically reduced.

Figure 10:
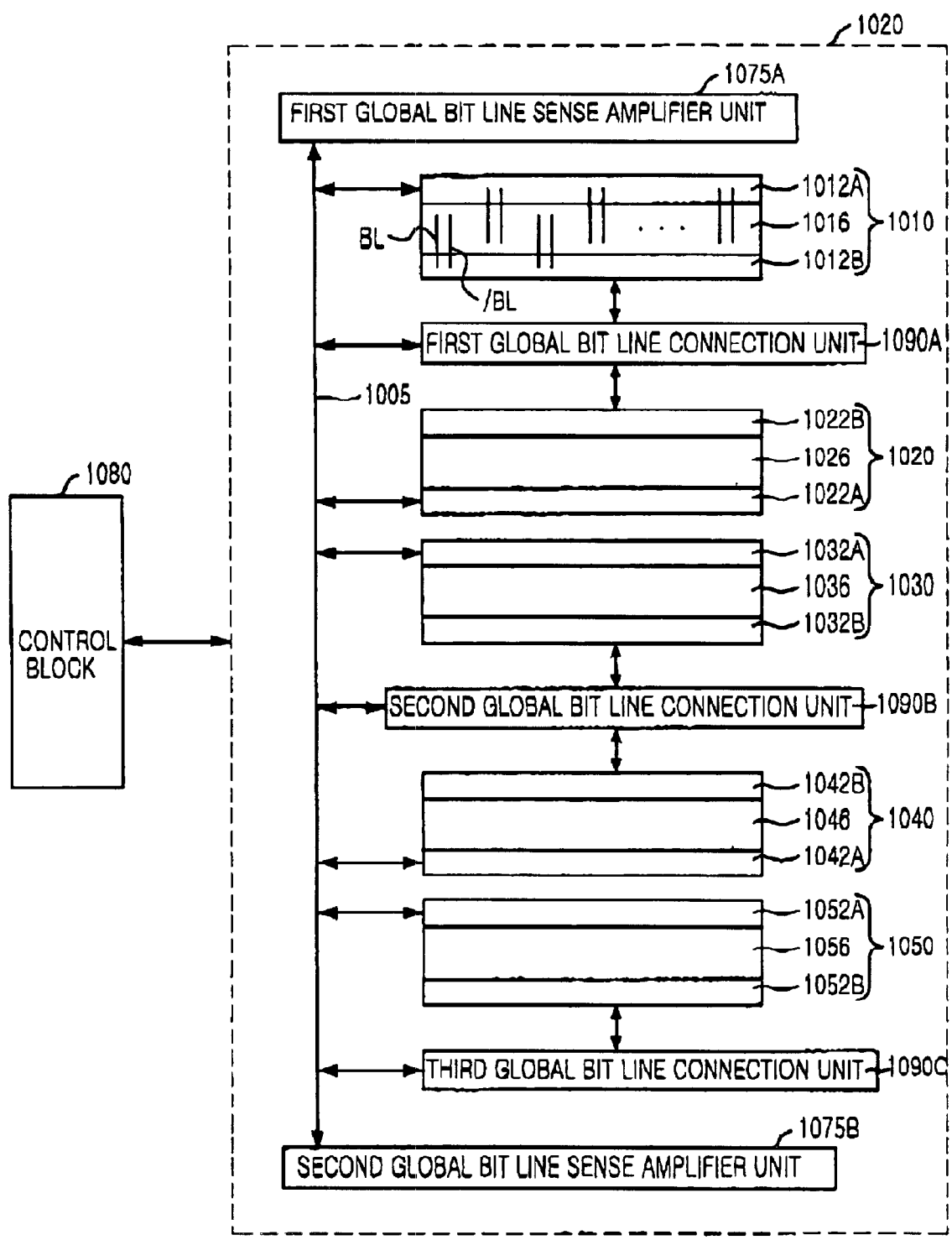
FIG. 10 is a block diagram describing a segment in the memory device in accordance with another embodiment of the present invention.

FIG. 10 is a block diagram describing a segment in the memory device in accordance with another embodiment of the present invention.

As shown, the segment of the memory device includes N+1 of unit cell blocks, e.g., 1010 to 1050, N/2+1 global bit line connection units, e.g., 1090A to 1090C, first and second global bit line sense amplifier units 1075A and 1075B and a control block 1080.

Each unit cell block, e.g., 1010 includes a cell array 1016 having a plurality of unit cells, a first local bit line sense amplifier block, e.g., 1012A and a second local bit line sense amplifier block, e.g., 1012B. The first global bit line sense amplifier unit 1075A serves to latch data sensed and amplified by the first local bit line sense amplifier block, e.g., 1012A, included in each unit cell block. The second global bit line sense amplifier unit 1075B is used for latching data sensed and amplified by the second local bit line sense amplifier block, e.g., 1012B, included in each unit cell block. Each global bit line connection unit, e.g., 1090A serves to selectively connect the global bit line 1005 to the second local bit line sense amplifier block, e.g., 1212B of one unit cell block, e.g., 1010 and the first local bit line sense amplifier block, e.g., 1022A of the other unit cell block, e.g., 1020. The control block 1080 is used for controlling operations of inputting and outputting data outputted from each unit cell block and restoring the outputted data in the original cell unit or another cell unit.

The control block 80 supports operation that, in the intra cell block data access, the first data is restored not in the first unit cell block 1010 but in another unit cell block, e.g., 1050, while the second data is accessed in the first unit cell block 1010.

In addition, the control block 80 supports operation that, in the inter cell block data access, the first data is restored in the first unit cell block 1010 while the second data is accessed in another unit cell block, e.g., 1020.

Figure 11:
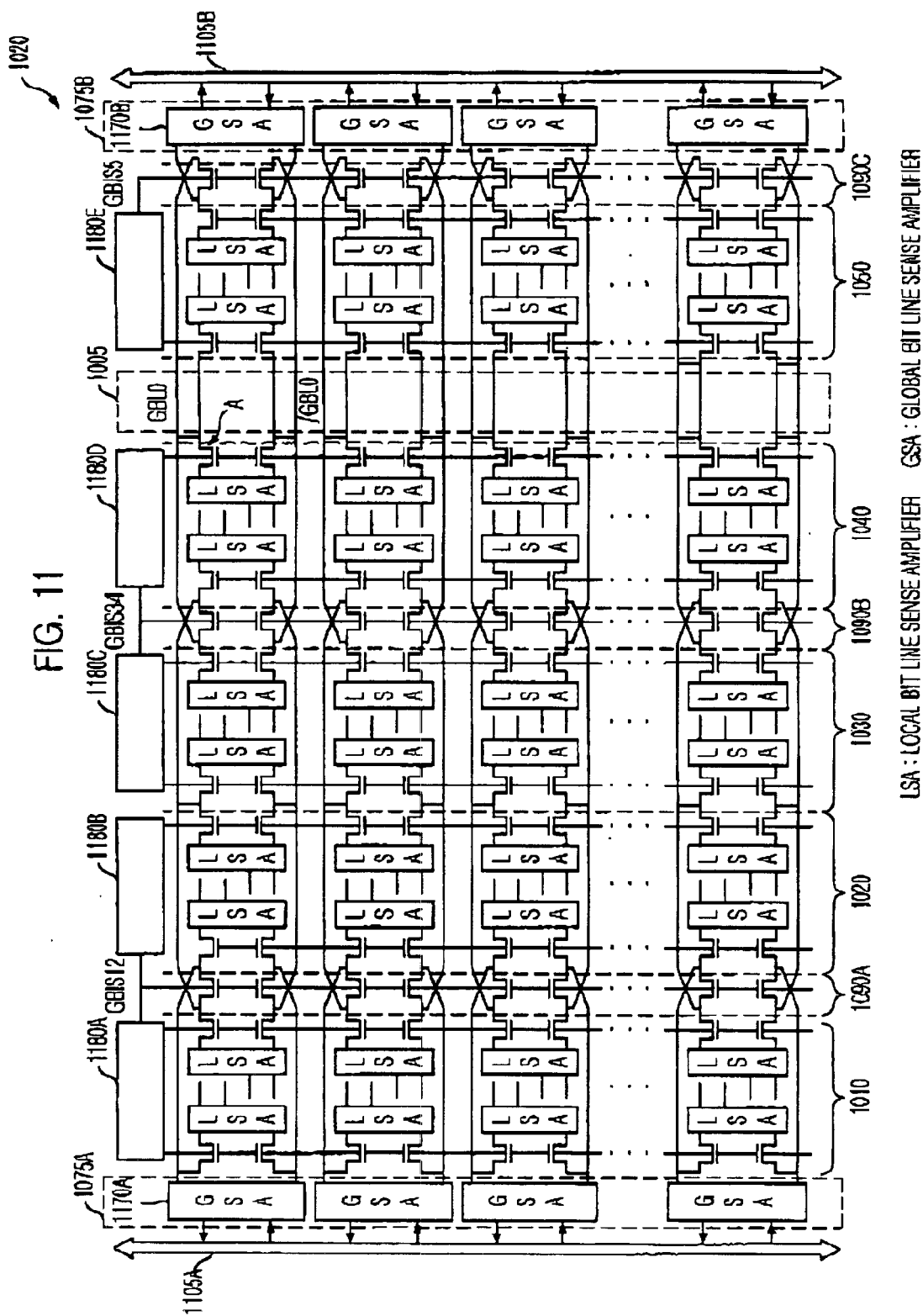
FIG. 11 is a schematic circuit diagram showing a cell area shown in FIG. 10.

FIG. 11 is a circuit diagram showing the cell area 1020 shown in FIG. 10.

As shown, the cell area 1020 of the memory device includes the first to the fifth cell blocks 1180A to 1180E, each having a plurality of the unit cell and the first and the second global bit line sense amplifier blocks 1175A and 1175B coupled to each unit cell block through the use of the global bit line 1005.

Each of the first and the second global bit line sense amplifier unit 1175A and 1175B has a plurality of the global bit line sense amplifier GSA. The global bit line sense amplifier 1170A included in the first global bit line sense amplifier unit 1075A is coupled to the global bit line sense amplifier 1170B included in the second global bit line sense amplifier block 1075B through use of the first global bit line pair GBL0 and /GBL0. The amplified data by the first and second global bit line sense amplifier units 1075A and 1075B is outputted through the use of global sense amplifier lines 1105A and 1105B.

The global bit line sense amplifier GSA latches and amplifies the data supplied from the local bit line sense amplifier LSA. The configuration of the global bit line sense amplifier GSA can be identical to that of the local bit line sense amplifier LSA.

The global bit line connection unit, e.g., 1090A, selectively connects the global bit line 1005 to the two neighboring local bit line sense amplifiers, e.g., 1212B and 1022B. Each of the global bit line connection units, e.g., 1090A, is allocated between two unit cell blocks 1010 and 1020. There are provided with three global bit line connection units if the number of the unit cell blocks is 5 as shown in FIG. 11. If the number of these is 9, there are provided with be five global bit line connection units.

As mentioned above, each unit cell block, e.g., 1010, includes the unit cell array, e.g., 1216 and the first and the second local bit line sense amplifiers, e.g., 1012A and 1012B. The first and the second local bit line sense amplifiers, e.g., 1012A and 1012B, have a plurality of the bit line sense amplifiers. Each first local bit line sense amplifier, e.g., 1012A, is connected to the global bit line 1005 through a switch transistor A.

The first to the fifth unit cell block control blocks 1180A to 1180E respectively output a switch control signal, e.g., GBIS12 or GBIS34, for selectively connecting the local bit line sense amplifier LSA, e.g., 1212A or 1212B, included in each the unit cell block, e.g., 1010, to the global bit line 1005 through the global bit line connection unit, e.g., 1090A, 1090B, 1090C.

Through the global bit line 1005 connected to the first and the second global bit line sens amplifier 1070A and 1070B, a data latched in the first and the second global bit line sense amplifier block 1070A and 1070B is outputted to the external part, or a data inputted from the external part is supplied to the first and the second global bit line sense amplifier block 1070A and 1070B.

Figure 12:
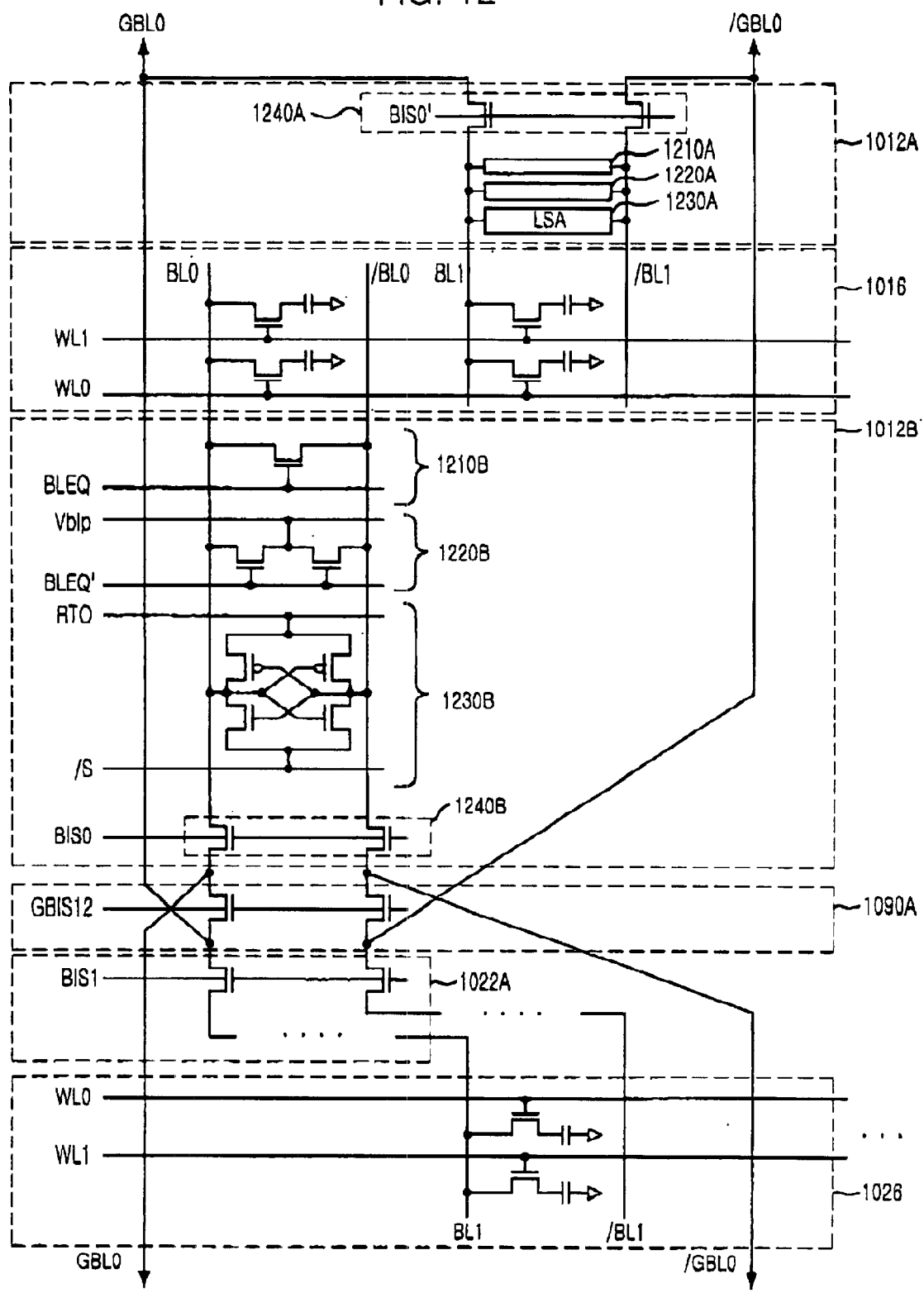
FIG. 12 is a schematic circuit diagram describing a cell block of the cell area shown in FIG. 11.

FIG. 12 is a schematic circuit diagram describing a partial circuit of the unit cell block of the cell area shown in FIG. 10.

Each unit cell array, e.g., 1016, included in each second unit cell blocks, e.g., 1010, has a plurality of the word lines WL0, WL1, . . . and WLN, a plurality of bit line pairs, e.g., BL0 and /BL0, . . . , BLN and /BLN, a plurality of unit cells. Herein, the unit cell includes a capacitor and a MOS transistor correspondently connected to each word line and each bit line pair.

Figure 2:
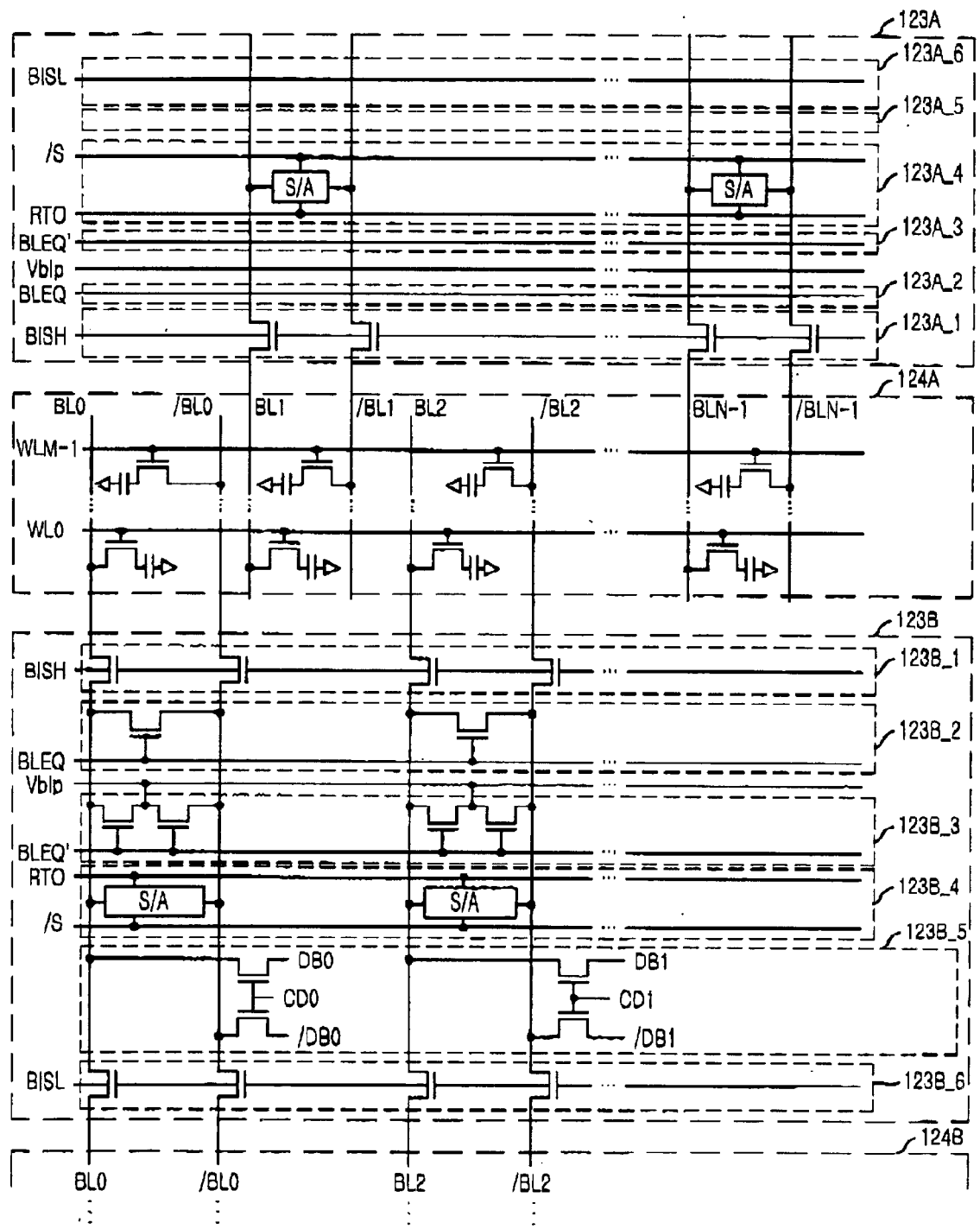
FIG. 2 is a schematic circuit diagram demonstrating a bit line sense amplifier block and a unit cell block shown in FIG. 1.
Figure 3:
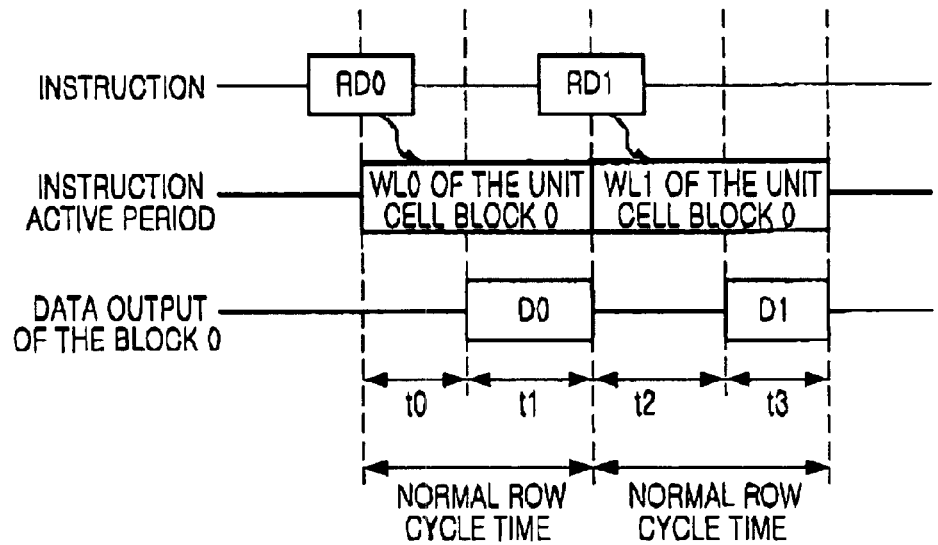
FIGS. 3 and 4 are timing diagrams describing data access operations of the conventional memory device described in FIG. 1.
Figure 4:
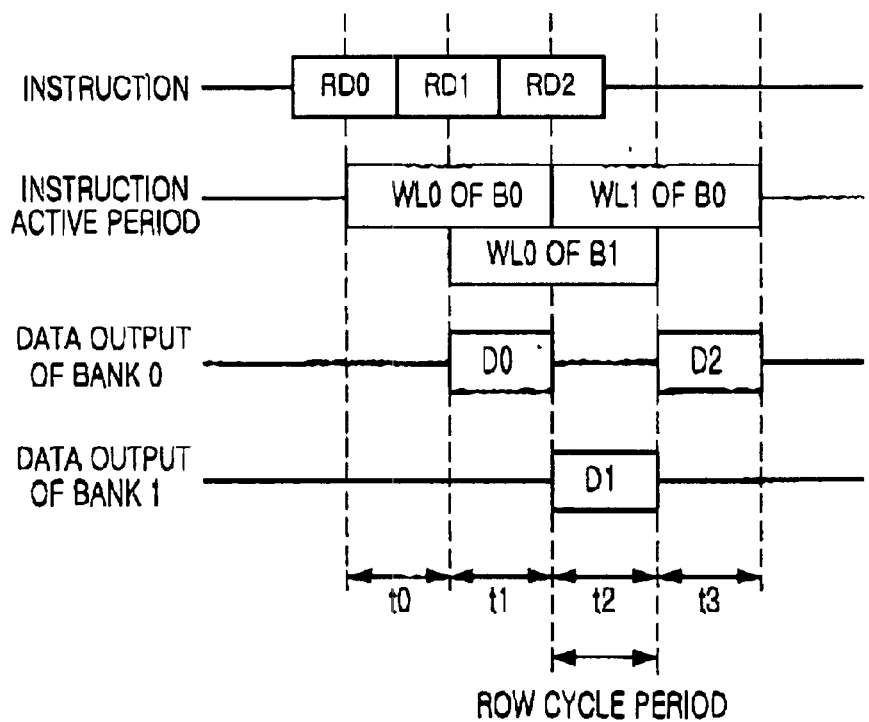

As shown, the second local bit line sense amplifier block 1012B of the first unit cell block 1010 includes a bit line sense amplifier 1230B, a precharge block 1210B, a bit line sense amplifier connection block 1040B and an equalization block 1220B. Since these block 1210B, 1220B, 1040B and 1230B are identical to those shown FIG. 2, for the sake of convenience, detail descriptions are omitted. However, especially, for preventing the data collision in each of global bit line pair GBL0 and /GBL0, the first local bit line sense amplifier LSA related to a cell array is coupled to one of global bit sense amplifier pair GSA, and the second local bit line sense amplifier LSA related to the same cell array is couple to the other of the global bit sense amplifier pair GSA.

Under the control of the cell block controller, e.g., 1180A, each bit line sense amplifier, e.g., 1012A and 1012B of the unit cell block, e.g., 1010, is selectively connected to the global bit line 1005 or the global bit line connection unit, e.g., 1090A.

FIGS. 13A to 13D are circuit diagrams depicting how to access the data in the cell block and output the access data to a global sense amplifier block.

FIGS. 13A to 13D describe the data transmission between the local bit line sense amplifier LSA and the global bit line sense amplifier GSA. Especially, two data respectively outputted from the first and second local bit line sense amplifier blocks are individually transmitted to the global bit line sense amplifiers 1170A and 1170B throughout the global bit line pair GBL0 and /GBL0.

Hereinafter, referring to FIGS. 10 to 12 and FIGS. 13A to 13D, the memory device shown in FIG. 10 is described in detail.

Figure 13A:
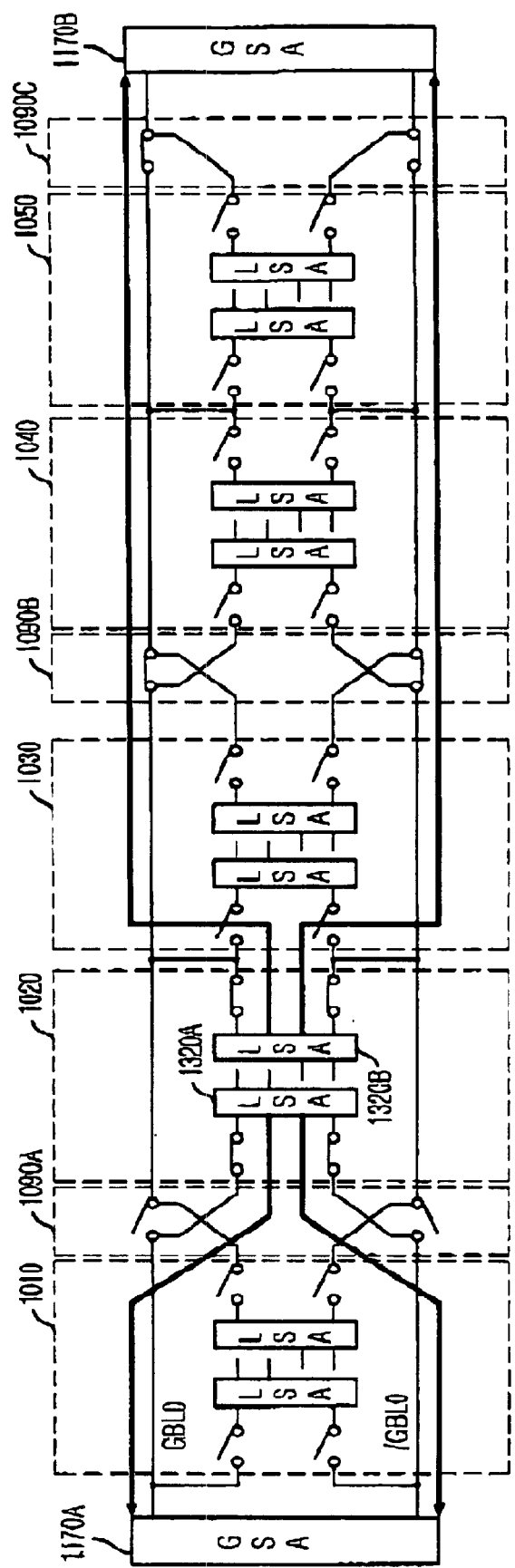
FIGS. 13A to 13D are explanatory diagrams depicting the operation of the cell area shown in FIG. 11.
Figure 13B:
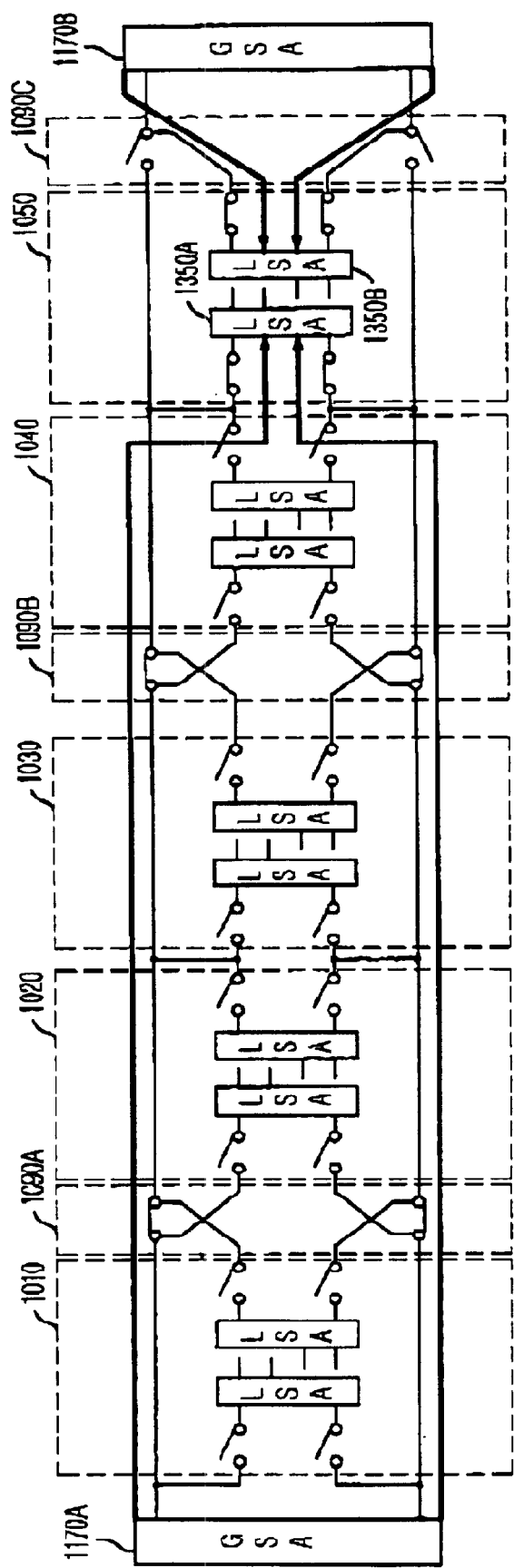
Figure 13C:
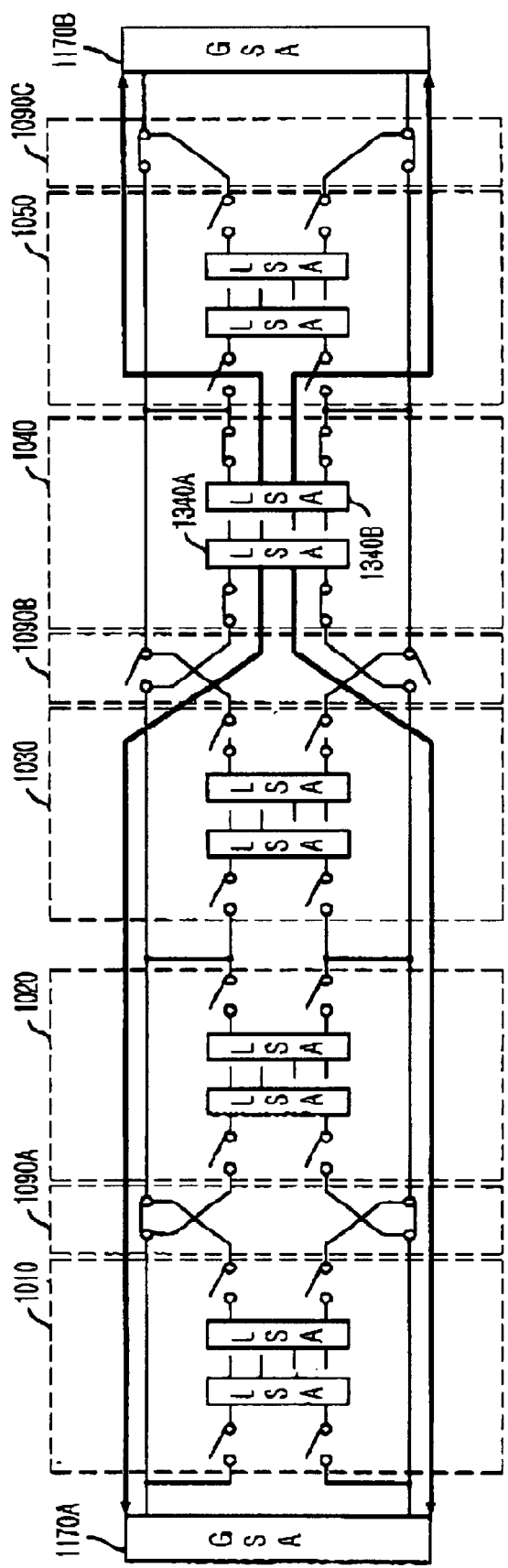

Referring to FIGS. 13A and 13C, in a read mode, operation of reading a data stored in unit cell block, e.g., 1020 and 1040, is described. After the instruction is inputted in the memory device, the data stored in the unit cell block, e.g., 1020, is selected by the inputted address in response to the instruction. Then, the selected data is sensed and amplified by two local bit line sense amplifiers, e.g., 1320A and 1320B, connected to the unit cell. The sensed and amplified data is moved and thereby latched into the global bit line sense amplifiers 1170A and 1170B (as designated by using a bold line shown in FIG. 13A to 13C).

For the sake of convenience, one-bit data transmission is described in FIG. 13A to 13D. However, several bit data, e.g., 4 Kb data in response to an activated word line, e.g., WL0 can be outputted at the same time.

Figure 13D:
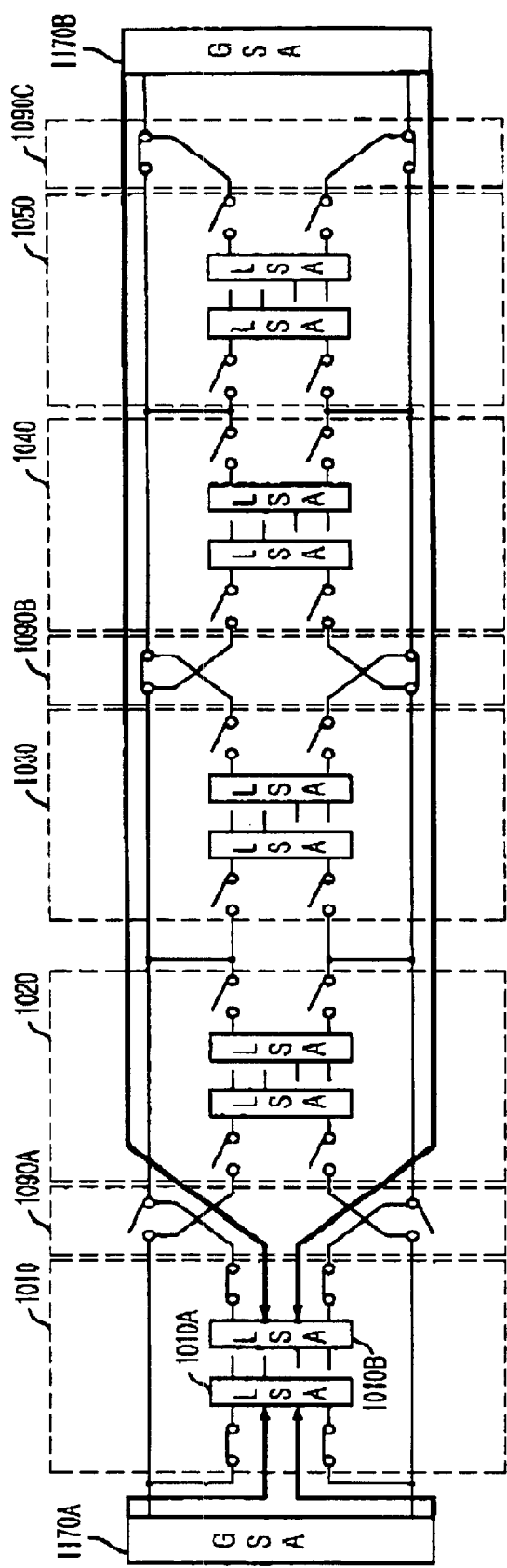

Referring to FIGS. 13B and 13D, operation of writing a data stored in unit cell block, e.g., 1010 and 1050, is described. After the instruction is inputted in the memory device, the data inputted from the external part is latched in the global bit line sense amplifiers 1170A and 1170B. Then, the latched data is moved to two local bit line sense amplifiers, e.g., 1350A and 1350B, of the unit cell block, e.g., 1050. Likewise, the writing operation is carried out between the global bit line sense amplifiers 1170A and 1170B and other unit cell blocks, e.g., 1010, 1020, 1030 and 1040 (as designated by using a bold line shown in FIG. 13B to 13D).

In addition, in the inventive memory device, each unit cell block has two local bit line sense amplifiers for sensing and amplifying data. Namely, when 4 Kb data in response to a word line is outputted, some data, e.g., 2 Kb data, is sensed and amplified by the first local bit line sense amplifier block; and the other data, e.g., 2 Kb data, is sensed and amplified by the second local bit line sense amplifier block. As a result, the bank should have two global bit line sense amplifier blocks, e.g., 1170A and 1170B.

Figure 14:
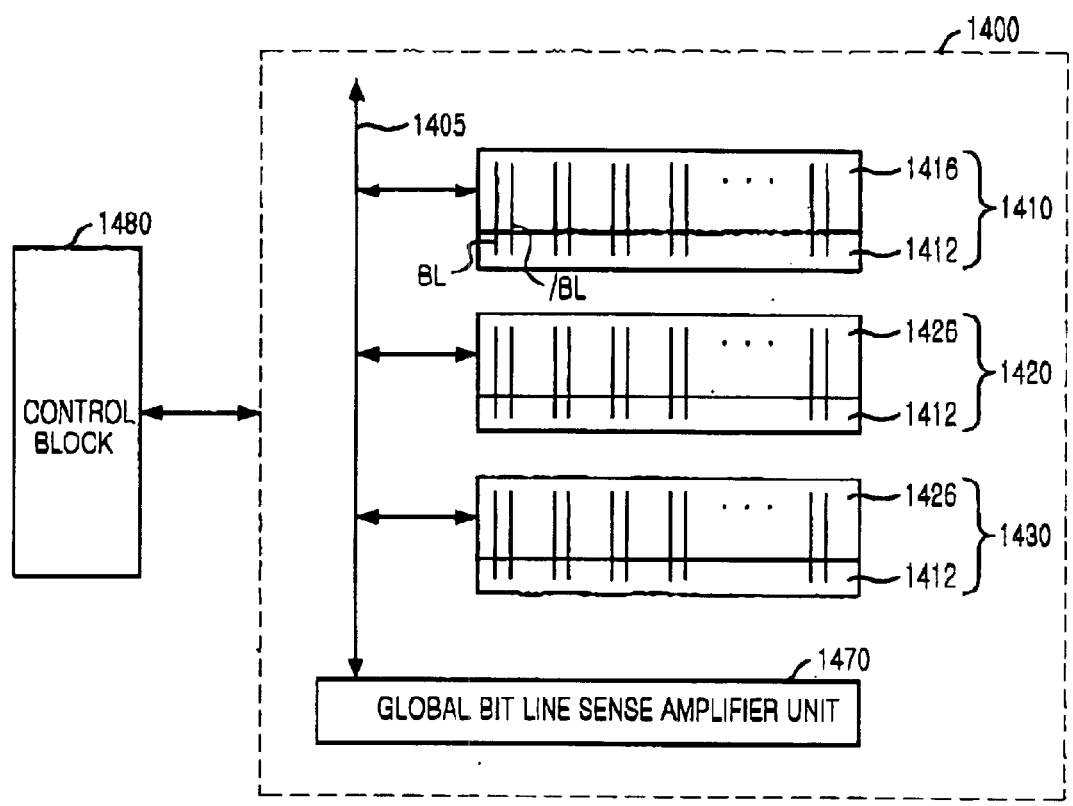
FIG. 14 is a block diagram showing a segment in the memory device in accordance with another embodiment of the present invention.
Figure 15:
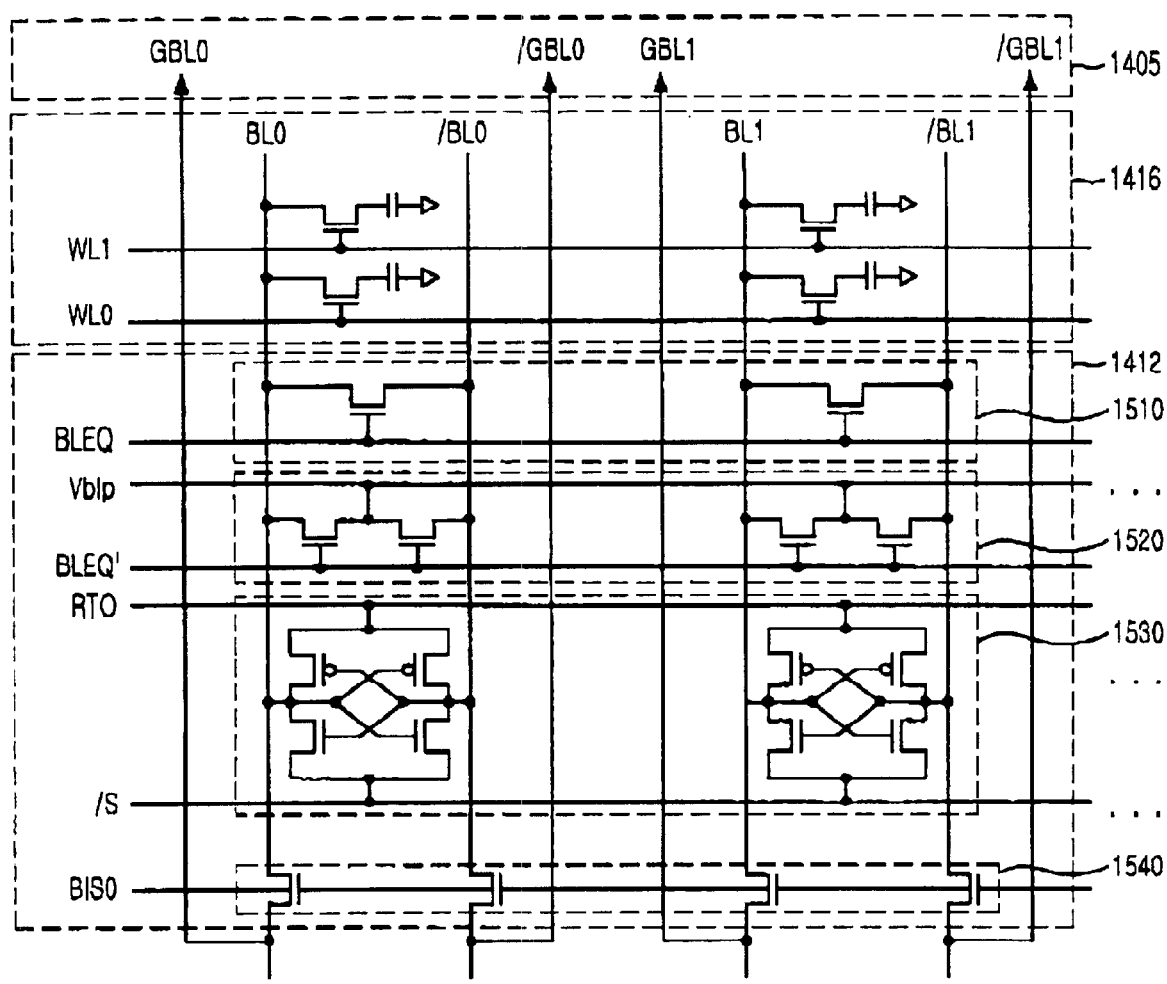
FIG. 15 is a schematic circuit diagram describing a cell block of the bank shown in FIG. 14.

FIG. 14 is a block diagram showing a segment in the memory device in accordance with another embodiment of the present invention, and FIG. 15 is a schematic circuit diagram describing a cell block of the bank shown in FIG. 14.

If the unit cell block, e.g., 1410 of the segment has one local bit line sense amplifier block, e.g., 1412 and all data, e.g., 4 Kb data in response to the activated word line is sensed and amplified by the local bit line sense amplifier 1412, the global bit line connection unit is unnecessary and only one global bit line sense amplifier block is needed.

Therefore, in FIGS. 14 and 15, there is described the bank in case that the unit cell block, e.g., 1410, has one local bit line sense amplifier block, e.g., 1412. Herein, for the sake of convenience, detail description about operation of the unit cell block, e.g., 1410, is omitted because each block, e.g., 1510, 1520, 1530 and 1540, included in the local bit line sense amplifier block, .e.g., 1412 is same to each block, e.g., 1210B, 1220B, 1230B and 1240B, shown in FIG. 12.

As shown in FIG. 15, data selected by a word line, e.g., WL0 is sensed by the bit line sense amplifier 1412. The sensed and amplified data is then coupled to the global bit line pair GBL0 and /GBL0 by a connection unit 1540 of the bit line sense amplifier 1412. Herein, the bit line sense amplifier includes an equalization unit 1510, a precharge unit 1520, a sense amplifier 1530 and the connection unit 1540.

Figure 16:
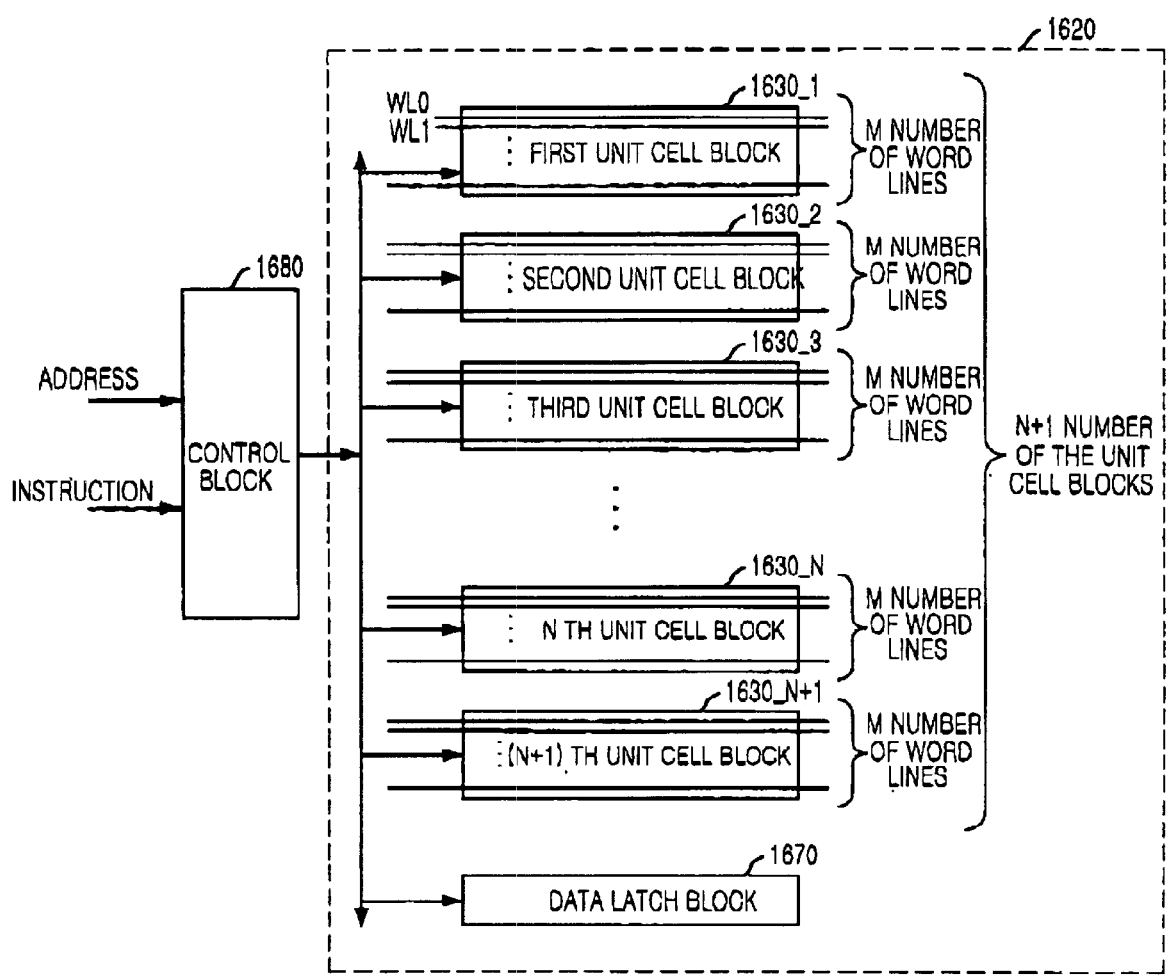
FIG. 16 is a block diagram showing a segment in the memory device in accordance with another embodiment of the present invention.

FIG. 16 is a block diagram showing a bank in the inventive memory device in accordance with another embodiment of the present invention.

As shown, the bank includes a cell area 1620 and a control block 1680. The cell area 1620 has N+1 number of unit cell blocks, e.g., 1630_1, . . . , 1630_N+1, and a data latch block 1670. Also, in each unit cell block, M number of word lines is coupled to a plurality of unit cells. The N and M are positive integers. Herein, a size of memory device, i.e., a storage capability, is calculated with the exception of the additional unit cell block. Namely, in the FIG. 16, a size of the bank is M(number of word lines)×N(number of unit cell blocks)×(number of bit lines).

The control block 1680 supports the intra cell block interleaving mode. The After a first data in response to a current instruction is outputted from, e.g., a first unit cell block 1630_1, the first data in latched in the data latch block 1670. Then, if a second data in response to a next instruction is outputted from the first unit cell block 1630_1, the first data is restored in another unit cell block, e.g., 1630_N+1. At this time, since the memory device can use an additional unit cell block and the data latch block, a row address of the first data is not changed.

Figure 17:
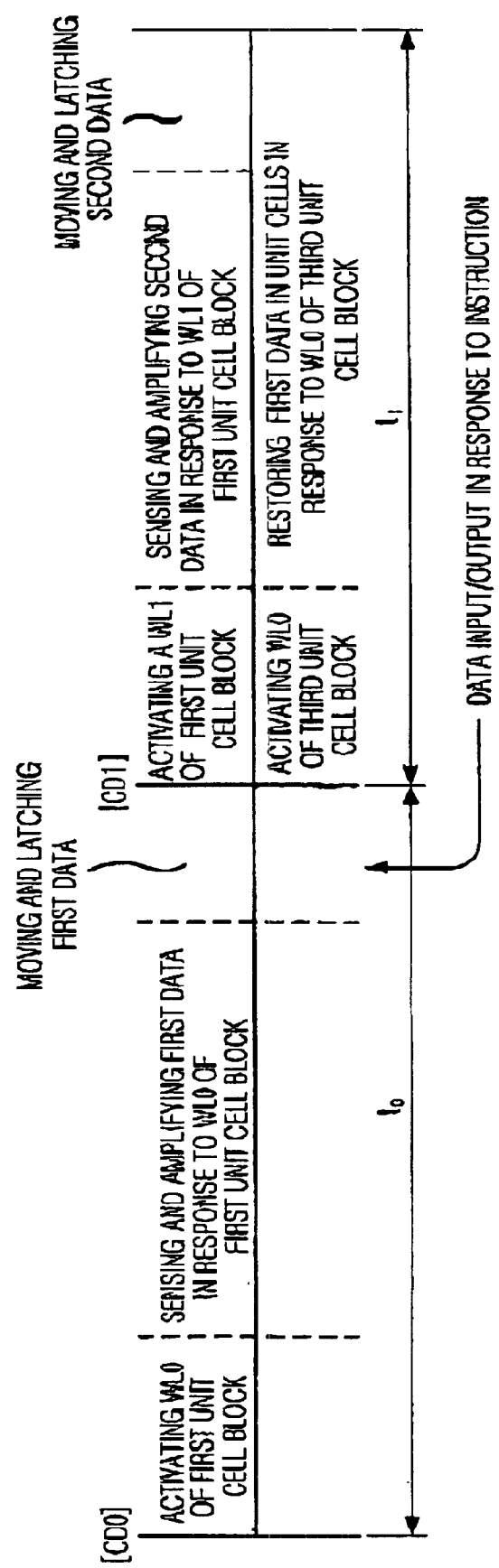
FIG. 17 is a timing diagram describing the operation of the memory device described in FIG. 16.

FIG. 17 is a timing diagram describing operation of the memory device shown in FIG. 16; and, especially, describes the intra cell block interleaving mode when a first and the second data are sequentially accessed in the same unit cell block among N+1 numbers of the unit cell blocks shown in FIG. 16.

Hereinafter, referring to FIGS. 16 and 17, there is described the execution of the memory device, shown in FIG. 16, in accordance with the present invention.

The additional unit cell block is used for restoring the first data when the second data are sequentially accessed in the same unit cell block. As shown in FIG. 17, the first data is stored in unit cells coupled to a first word line WL0, and the second data is stored in unit cells coupled to a second word line WL1 of the same unit cell block.

First, at a first timing period t0, the first word line WL0 of, e.g., first unit cell block 1630_1 is activated in response to a first instruction CD0; and, then, first data in response to the first word line WL0 is sensed and amplified. The amplified first data moves to the data latch block 1670.

At a second timing period t1, first, the second word line WL1 of, e.g., first unit cell block 1630_1 is activated in response to a second instruction CD1; and, at the same time, the first word line WL0 of, e.g., third unit cell block 1630_3 is activated. Then, the second data in response to the second word line WL1 is sense and amplified; and, at the same time, the first data is restored into unit cells in response to the first word line WL0 of the third unit cell block 1630_1.

As described above, the data access time of the memory device in accordance with the present invention can be actually precluded the data restoration time, because the second data can be sensed and amplified by the next instruction during the first data in response to the present instruction is restored. Thus, the data access time can be effectively reduced to thereby obtain a high speed operation of the memory device. In addition, in the memory device of the present invention, the data restoration operation can be simplified by simply changing only the cell block address of the data.

Figure 18:
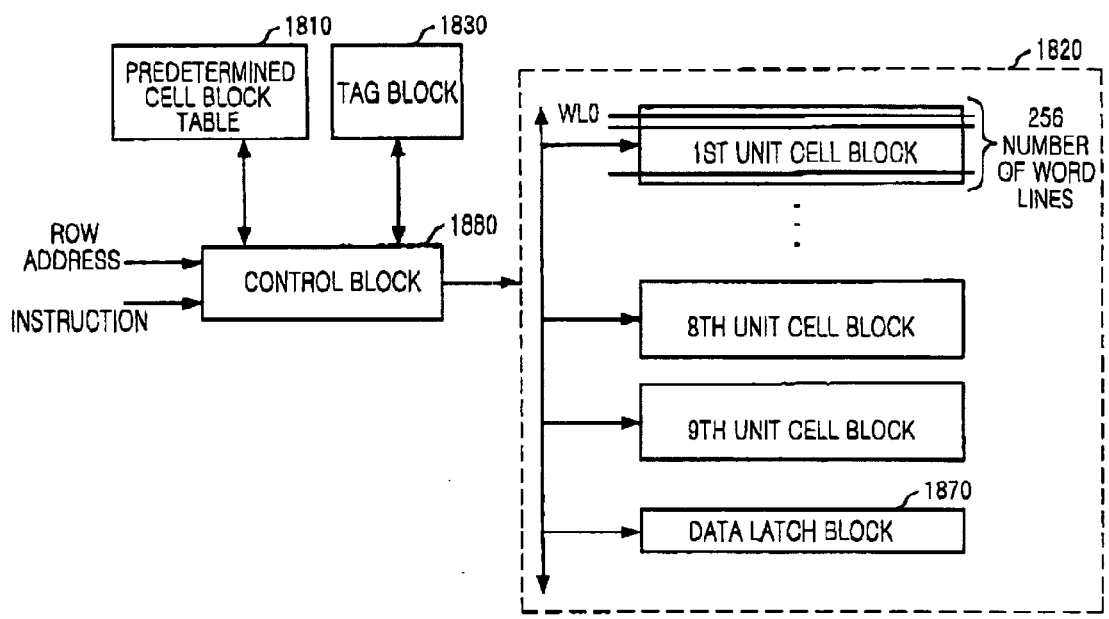
FIG. 18 is a block diagram showing a segment in the inventive memory device in accordance with another embodiment of the present invention.

FIG. 18 is the block diagram depicting a segment in the inventive memory device in accordance with another embodiment of the present invention. The structure or configuration of the segment shown in FIG. 18 is substantially identical to that of the segment shown in FIG. 16, except that a predetermined cell block table 1810 and a tag block 1830 are coupled to a control block 1880.

The predetermined cell block table 1810 includes a plurality of registers for storing predetermined restore cell block address information. The tag block 1830 generates a target restore cell block address corresponding to an access cell block address based on the predetermined restore cell block address information. The control block 1880 controls the predetermined cell block table 1810, the cell area 1820 and the tag block 1830 in order to support the intra cell block interleaving mode.

Figure 19:
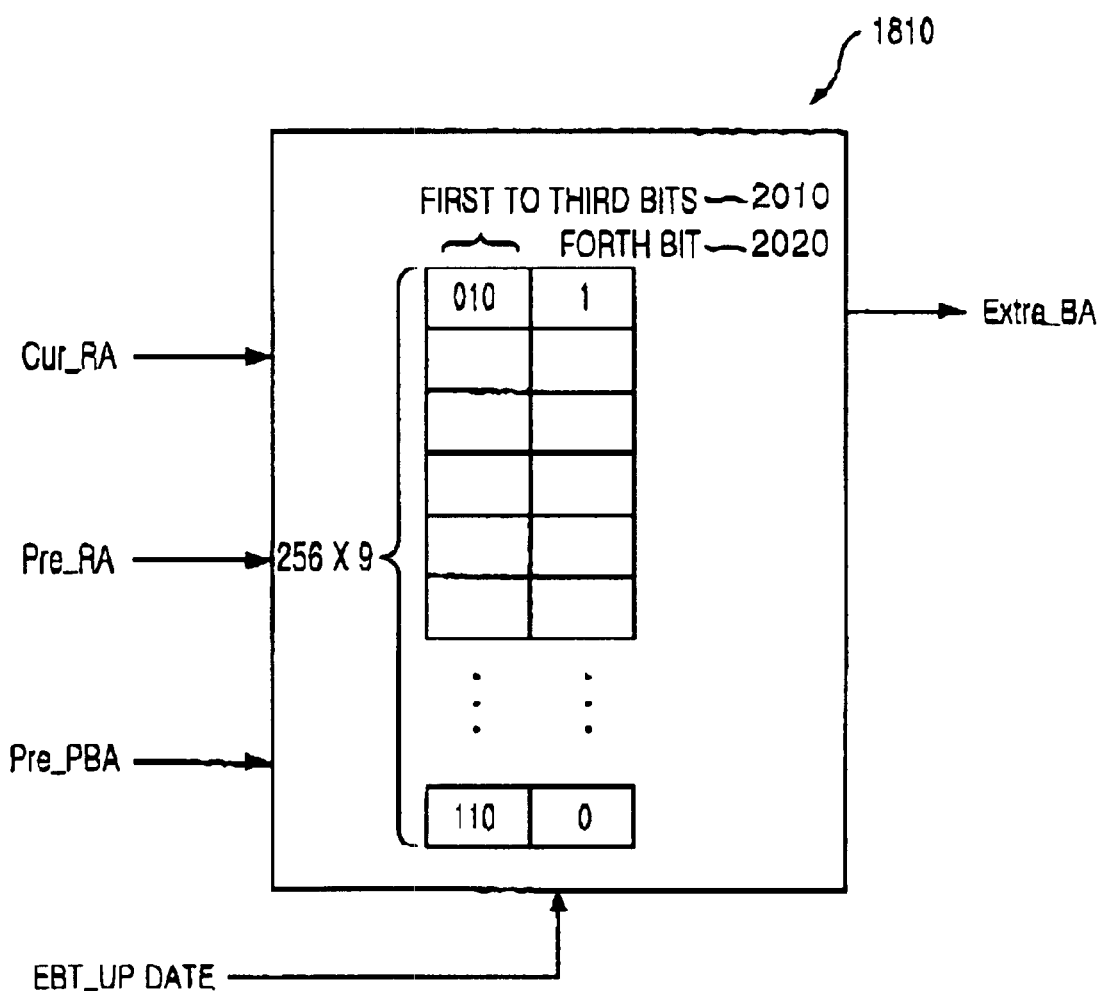
FIG. 19 is an exemplary block diagram describing a predetermined cell block table shown in FIG. 18.

FIG. 19 is a block diagram describing the predetermined cell block table 1810 shown in FIG. 18.

As shown, the predetermined cell block table 1810 includes M×(N+1) registers, each having the predetermined restore cell block address information. The predetermined restore cell block address information contains a predetermined restore cell block address and its condition information. The predetermined restore cell block address consists of, e.g., 3 bits, and its condition information of, e.g., 1 bit. The predetermined restore cell block address information represents a target cell block to be restored, corresponding to an accessed word line of unit cell block. Its condition information represents whether the target cell block to be restored is available or not.

The predetermined cell block table 1810 receives a current row address Cur_RA, a previous row address Pre_RA and a previous restore physical cell block address Pre_PBA. Also, the predetermined cell block table 1810 is updated by an updating signal EBT_UP DATE. The predetermined cell block table 1810 outputs an available restore cell block address Extra_BA to the tag block 1830.

Figure 20:
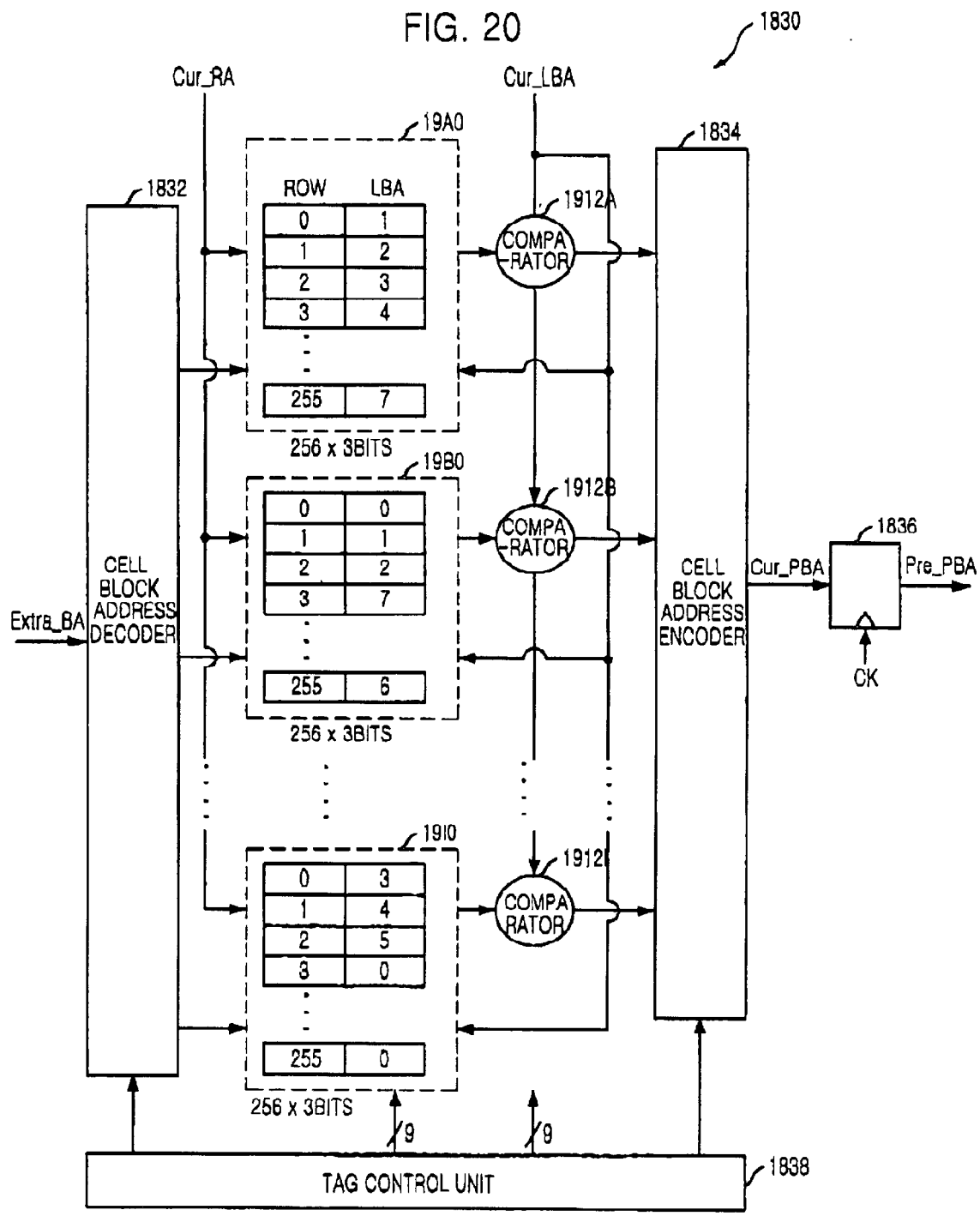
FIG. 20 is an exemplary block diagram depicting a tag block shown in FIG. 18.

FIG. 20 is a block diagram depicting a tag block 1830 shown in FIG. 18.

As shown, the tag block 1830 includes the N+1 number of unit tag tables 19I0 to 19I0 (herein, e.g., N is 8), the N+1 number of comparators 1912A to 1912B (herein, e.g., N is 8), a cell block address decoder 1832, a cell block address encoder 1834 and a tag control block 1838.

The cell block address decoder 1832 receives the available restore cell block address Extra_BA outputted from the predetermined cell block table 1810 and selects one among unit tag tables in response to the available restore cell block address Extra_BA. Then, the comparator, e.g., 1912A, compares an address of converting the current row address Cur_RA based on the selected unit tag table with the logical cell block address Cur_LBA. And last, the cell block address encoder 1834 outputs a current restore physical cell block address Cur_PBA which is encoded in response to a result of comparison. Herein, each of the unit tag tables 19A0 to 19I0 stores a restore cell block address information corresponding to N×256 word lines of unit cell blocks.

The tag block 1830 further includes a delay unit 1836 for delaying the current restore physical cell block Cur_PBA by one clock period to access a restore cell block.

Herein, each of unit tag tables 19A0 to 19I0 has 256 registers, and one register LBA consists of three bits. For instance, the first unit tag table 19A0 stores information what logical cell block is corresponded with each 256 numbers of the word lines included in the first unit cell block, and the second unit tag table 432B stores information what logical cell block is corresponded with each of 256 numbers of the word lines included in the second unit cell block.

In addition, in each tag table 19A0 to 19I0, the first register 0 stores the logical cell block address in response to the word line 'WL0' of each unit cell block, the second register 1 stores the logical cell block address in response to the word line 'WL1' of each unit cell block, and 256th register 255 stores the logical cell block address in response to the word line 'WL255' of each unit cell block.

Figure 21:
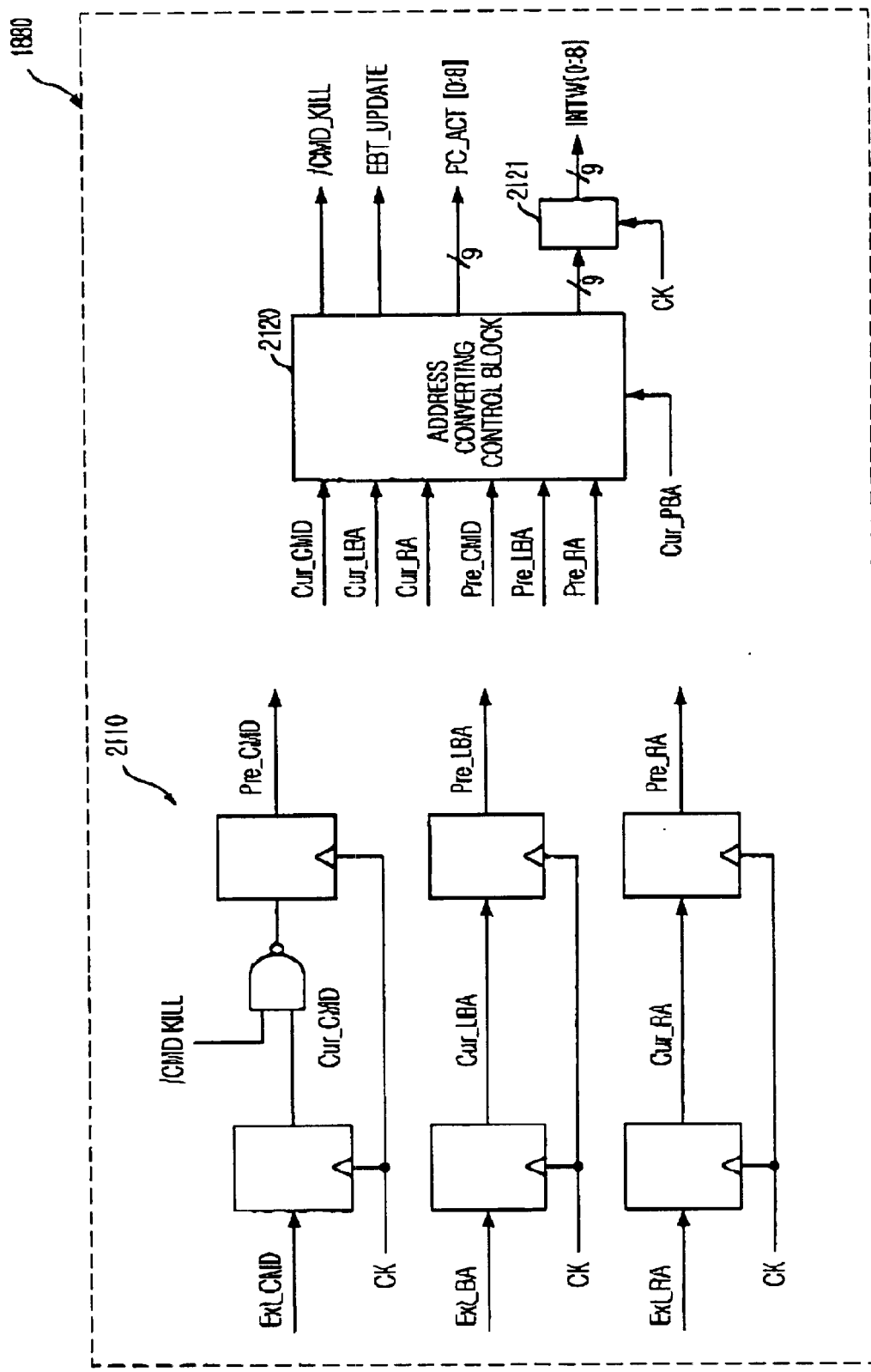
FIG. 21 is a block diagram showing a part of a control block shown in FIG. 18.

FIG. 21 is the block diagram of some part of the control block 420 shown in FIG. 18.

As shown, the control block 1880 has the signal input block 2110 for receiving an instruction Ext_CMD, a logical cell block address Ext_LBA and a local address Ext_RA from the external part and thereby outputting a current instruction Cur_CMD, a current logical cell block address Cur_LBA and the current row address Cur_RA in the present execution clock and a previous instruction Pre_CMD, a previous logical cell block address Pre_LBA, a previous row address Per_RA.

In addition, the address convert control block 2120 included in the control block 1880 receives the instruction Cur_CMD, the logical cell block address Cur_LBA and the local address Cur_RA in the present execution clock and the instruction Pre_CMD, the logical cell block address Pre_LBA and the local address Pre_RA in the prior execution clock. And then, the address convert control block 2120 outputs predetermined cell block update signal EBT_UPDATE, precharge active signal PC_ACT[0:8], the instruction kill signal CMD_KILL and an inner restoration signal INTW[0:8].

The predetermined cell block update signal EBT_UPDATE is used for updating the information stored in the predetermined cell block table 1810 when the restore physical cell block address Cur_PBA of the current operation clock is identical to that Pre_PBA of the previous operation clock.

In addition, the instruction kill signal CMD_KILL terminates the operation of the next instruction when the word line of the unit cell block is continuously accessed. The error is occurred if the tag information is read in the state that the information about the physical cell block address in response to the logical cell block address in the tag block 430 is not correctly updated in response to the prior instruction, when the word line of the unit cell block is continuously accessed.

The precharge active signal PC_ACT[0:8] is used for selecting the physical cell block address in response to the inputted instruction. The inner restoration signal INTW[0:8] is used for delivering the data accessed in the unit cell block selected by the present active instruction and thereby latched in the data latch block into the unit cell block of which determined word line is assigned and thereby restores the data, when the physical cell block address Cur_PBA of the present execution clock is same to that Pre_PBA of the prior execution clock.

The clock delay block 2121 delays the inner restoration signal INTW[0:8] for one clock so that the inner restoration signal INTW[0:8] is later than the percharge active signal PC_ACT[0:8]. This is needed for restoring the data using the inner restoration signal INTW[0:8], after selecting the unit cell block using the precharge signal PC_ACT[0:8]; selecting one word line in the selected unit cell block; and sensing and amplifying the data in response to the selected word line.

Figure 22:
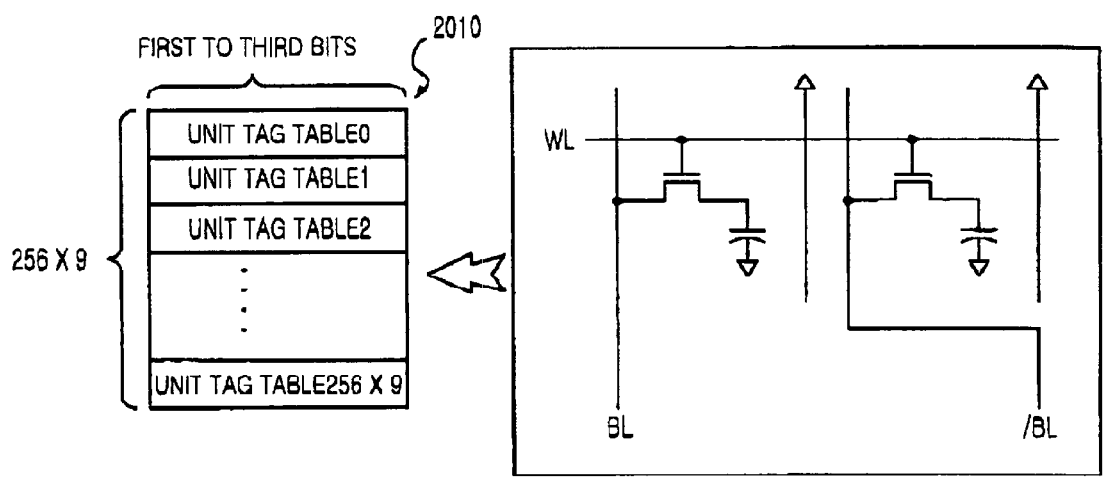
FIGS. 22 and 23 describe explanatory diagrams of the tag block shown in FIG. 20 in detail.
Figure 23:
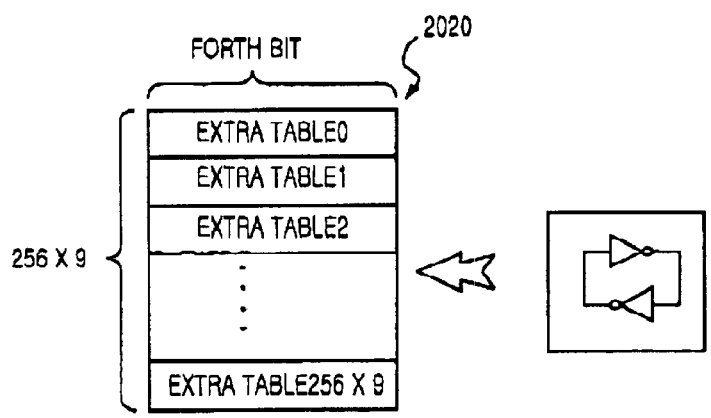

FIG. 22 is circuit diagram showing the first to third bits of each unit tag table 19A0 to 19I0 shown in FIG. 19, and FIG. 23 is circuit diagram of the forth bit of each unit tag table 19A0 to 19I0 shown in FIG. 19.

As shown, the first to third bits are dynamic cells and the forth bit is a static cell, in order to maintain operation speed. The static cell is used for the forth bit because th forth bit is more relatively often updated than the first to third bits.

Figure 24:
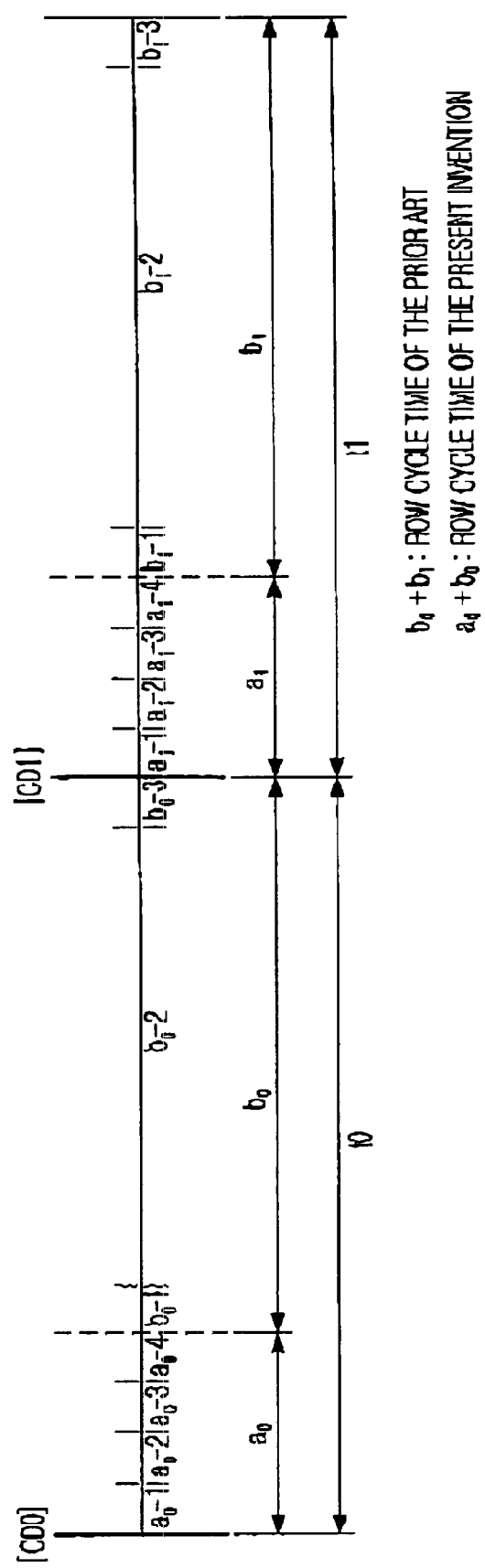
FIG. 24 is a timing diagram depicting operation of the memory device shown in FIG. 18.

FIG. 24 is a timing diagram depicting operation of the bank in the inventive memory device shown in FIG. 18.

Hereinafter, referring to FIGS. 18 to 24, there is described the operation of the memory device in accordance with the present invention in detail.

First of all, one instruction CD0 is inputted at a first timing period t0, and two timing periods is needed for operating one instruction, e.g., CD0, For example, during first and second timing period t0 and t1, the operation of the first instruction CD0 is carried out. Each timing period, e.g., t0, t1, . . . , is split into two timing sets, e.g., $a_0$ and $b_0$. At the timing set $a_0$, blocks related to a tag operate; and, at the other timing set $b_0$, blocks of the cell area 1820 operate.

First, the timing set $a_0$ is described in detail.

In $a_0$-1 timing set, the control block 1480 receives the logical cell block address for selecting one out of the 8 unit cell blocks included in the cell area 1820 and the local address for selecting one out of the 256 word lines.

And then, in $a_0$-2 timing set, the tag block 1830 converts the logical cell block address to the physical cell block address Cur_PBA.

In $a_0$-3 timing set, the predetermined block table 1810 senses a unit cell block including the predetermined word line of the word line WL0, in response to the present inputted local address Cur_RA. And the cell block address Extra_BA having the predetermined word line is outputted to the control block 420 and the tag black 430 in response to a result of comparison.

And then, in $a_0$-4 timing set, the predetermined cell block 410 is updated by the result of comparing the unit cell block selected by the first instruction CD0 with that selected by the prior instruction.

Continuously, there is described the operation of the cell area 1820 in response to the first instruction CD0 of the first timing period t0.

During $b_0$-1 timing set, in the first unit cell block which is selected in response to the converted physical cell block address Cur_PBA, the first word line in response to the local address is activated.

And then, during $b_0$-2 timing set, K bits first data in response to the first word line is sensed and amplified.

During $b_0$-3 timing set, K bits first data is latched in the data latch block 1870.

Then, in the read mode, i.e., the first instruction CD0 is a "read" instruction, the data selected by the column address among the K bits data latched in the data latch block 1870 is outputted while the second instruction CD1 is inputted. Meanwhile, in the write mode, i.e., the first instruction CD0 is a "write" instruction, the data inputted from the external part overwrites the data selected by the column address among the K bits data latched in the data latch block 1870.

At the second timing period t1, that the timing set when the K bits first data in response to the first instruction CD0 is actually outputted to the external part of the memory device. The K bits first data can be outputted, before another 4 Kb data in response to the second instruction CD1 is latched in the data latch block 1870.

Continuously, there is described at each timing set, e.g., $a_0, a_1, \ldots$, when the blocks related to tag operate in second timing period t1. The second instruction CD1 is also inputted in the second timing period t1.

At $a_1$-1 timing set, the row address inputted in response to the second instruction CD1 is split into the local address and the logical cell block address.

At $a_1$-2 timing set, the tag block 430 converts the logical cell block address Cur_LBA to the physical cell block address Cur_PBA.

At $a_1$-3 timing set, the predetermined block table 1810 senses the predetermined of the second word line WL3 in response to the local address Cur_RA inputted by the second instruction CD1 and thereby outputs the cell block address Extra_BA having the predetermined word line to the control block 1880 and the tag block 1830. Herein, the selected register is updated.

And then, in $a_1$-4 timing set, the unit cell block selected by the second instruction CD1 is compared with that selected by the first instruction CD0.

As a result of comparison, if the same unit cell block is continuously accessed by the first and the second instructions CD0 and CD1, the predetermined unit cell block of the first word line selected by the first instruction CD0 if substituted with the unit cell block in response to the first instruction CD0. Herein, substituting the predetermined word line means to updating information stored in the register of the predetermined cell bock table 1810.

For instance, the predetermined unit cell block of the word line 'WL1' in response to the first instruction CD0 is assigned as the forth unit cell block at the timing point of inputting the second instruction CD1; and, after updating the predetermined cell block table 1810, the predetermined unit cell block of the word line 'WL1' in response to the first instruction CD0 is changed from the forth unit cell block to the first unit cell block. Namely, in the predetermined cell block table 1810, the register in response to the word line 'WL1' is "011". After updating the predetermined cell block table 1810, the register is changed into "000".

Continuously, there is described the operation of the cell area 1820 in response to the second instruction CD1 of the second timing period t1.

In $b_1$-1 timing set, the second word line in response to the local address inputted by the second instruction CD1 is activated. Also, at same time, the predetermined unit cell block in response to the first word line selected by the first instruction CD0 in $a_0$-3 timing set of the first timing period t0 is activated.

And then, in $b_1$-2 timing set, the K bits first data latched in the data latch block 1870 is restored in the K bits unit cells in response to the predetermined unit cell block of the first word line. Also, the K bits second data in response to the second activated word line are simultaneously sensed and amplified.

In $b_1$-3 timing set, the K bits second data sensed and amplified in response to the second word line is latched in the data latch block 1870.

Then, in the read mode, i.e., the second instruction CD1 is a "read" instruction, the data selected by the column address among the K bits data latched in the data latch block 1870 is outputted while the second instruction CD1 is inputted. Meanwhile, in the write mode, i.e., the second instruction CD1 is a "write" instruction, the data inputted from the external part overwrites the data selected by the column address among the K bits data latched in the data latch block 1870.

In the intra cell block data access pattern, the memory device of the present invention not restores the first data but access the second data in the unit cell block, and the restoration operation of the first data is operated by the predetermined unit cell block.

Meanwhile, in the inter cell block data access pattern, the operation of the memory device is described.

First, the first data is sensed and amplified in the first unit cell block and latched in the data latch block 1870. Herein, the first data is restored in the first unit cell block, and the second data is sensed and amplified in another unit cell block and latched in the data latch block at a substantially simultaneous timing period.

Thus, the memory device of the present invention supports the inter cell block interleaving mode in case of the intra cell block data access pattern, and supports the intra cell block interleaving mode in case of the inter cell block data access pattern. As a result, the memory device can stably access data on high speed without depending on the data access pattern.

Figure 25:
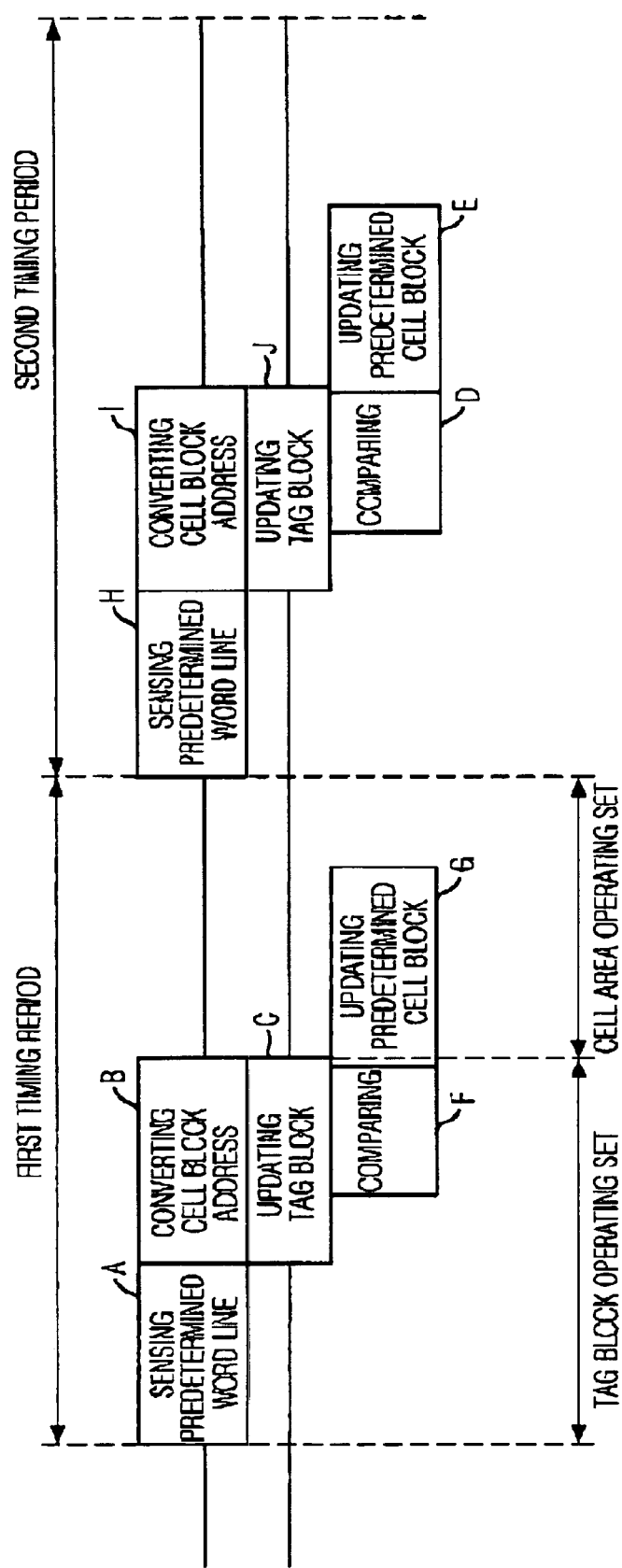
FIG. 25 is a timing diagram describing the operation of the memory device employing the tag block shown in FIG. 18.

FIG. 25 is a timing diagram depicting operation of the memory device shown in FIG. 18.

As shown, in operation timing of the blocks related to the tag, operation of the memory device includes the following step of inputting the local address and thereby sensing the predetermined word line A; converting the logical cell block address to the physical cell block address in the tag block 430 B; then, comparing two unit cell block accessed by the present active instruction and the prior instruction F; updating the predetermined cell block by the result from comparing them G. At this, the cell block can activate the selected word line, and so on, for updating the predetermined cell block G.

Figure 26:
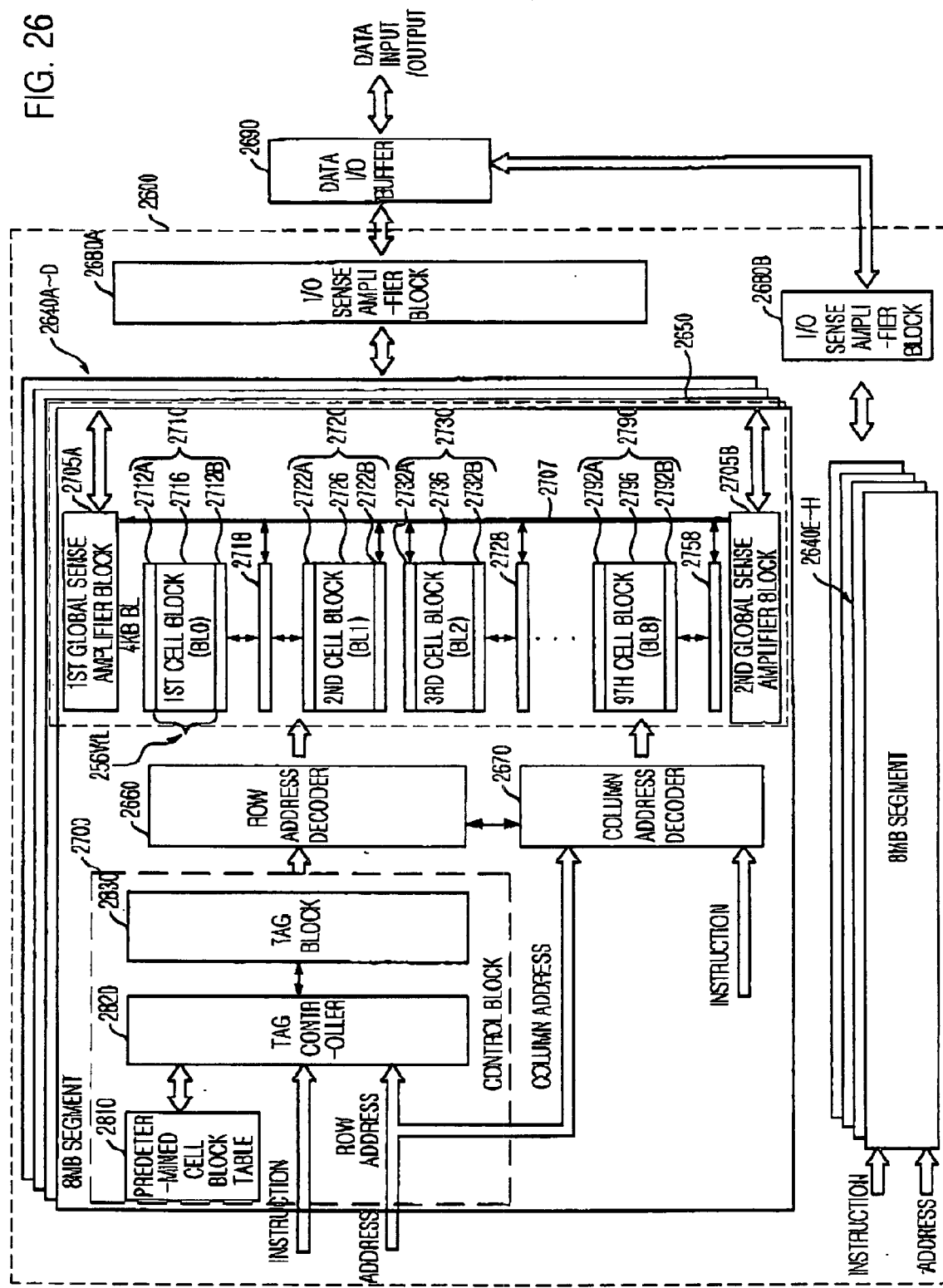
FIG. 26 is a block diagram showing a semiconductor memory device in accordance with another preferred embodiment of the present invention.

FIG. 26 is a block diagram showing a semiconductor memory device in accordance with another preferred embodiment of the present invention.

The memory device in accordance with the present embodiment has a plurality of banks, but one bank 2600 is described in FIG. 26 because each bank has the identical structure and configuration.

As shown, one bank 2650 has total eight segments 2640A to 2640H and I/O sense amplifier blocks 2580A and 2680B for amplifying the data outputted from the eight segments 2640A to 2640H and delivering the data or delivering the data outputted form a data input/output buffer 2690 to the segments 2640A to 2640H.

In addition, the segment 2640A has a low address decoder 2660 for decoding the address outputted from the control block 2700 and outputting it to the cell area 2650, and a column address decoder 2670 for outputting the inputted column address to the cell area 2650.

A size of the memory device shown in FIG. 26 is 256 Mb. If the memory device consists of 4 banks, one bank consists of 64 Mb unit cells. If one bank consists of 8 segments, a size of one segment is 8 Mb.

The cell area 2650 included in each segment consists of nine unit cell blocks 2710 to 2790, and one unit cell block has 256 word lines, 4 Kb(4×1024) bit lines, and 256×4 Kb unit cells. p The control block 2700 includes a tag block 2730 for converting the logical cell block address about nine unit cell blocks 2710 to 2790 to the physical cell block address, a predetermined cell block table 2710 for storing information about 256 predetermined word line, and a tag controller 2820 for controlling the tag block 2830 and the predetermined cell block table 2810.

Because the cell area 2650 has one more unit cell block than the unit cell block in response to the inputted cell block address, the inputted cell block address is considered as the logical cell block address and the tag block 2830 of the control block 2700 converts the logical cell block address to the physical cell block address. Also, the control block 2700 searches what unit cell block has the predetermined word line in response to the word line selected by the inputted row address.

In addition, each of nine unit cell block, e.g., 2710, included in the cell area 2650 has the local bit line sense amplifier blocks, e.g., 2712A and 2712B, one local bit line sense amplifier block 2712A senses and amplifies some of the K number of the data in response to the selected word line and the other local bit line sense amplifier 2712B senses and amplifies the others of the K bits the data.

The cell area 2650 has a first and a second global bit line sense amplifier blocks 2705A and 2705B for latching the data outputted from the local bit line sense amplifier block included in each unit cell 2710 to 2790, a global bit line 2707 for data transmission between each unit cell blocks, e.g., 2710 and the first and the second global bit line sense amplifier blocks 2705A and 2705B, and five global bit line connection units 2718 to 2758 for connecting the global bit line 2707 to the nine unit cell blocks 2710 to 2790.

The first and the second global bit line sense amplifier blocks 2705A and 2705B is basically provided with the local bit line sense amplifier and the sense amplifier for latching the data outputted from the local bit line sense amplifier block and amplifying the data signal reduced by being delivered throughout the global bit line.

Figure 27:
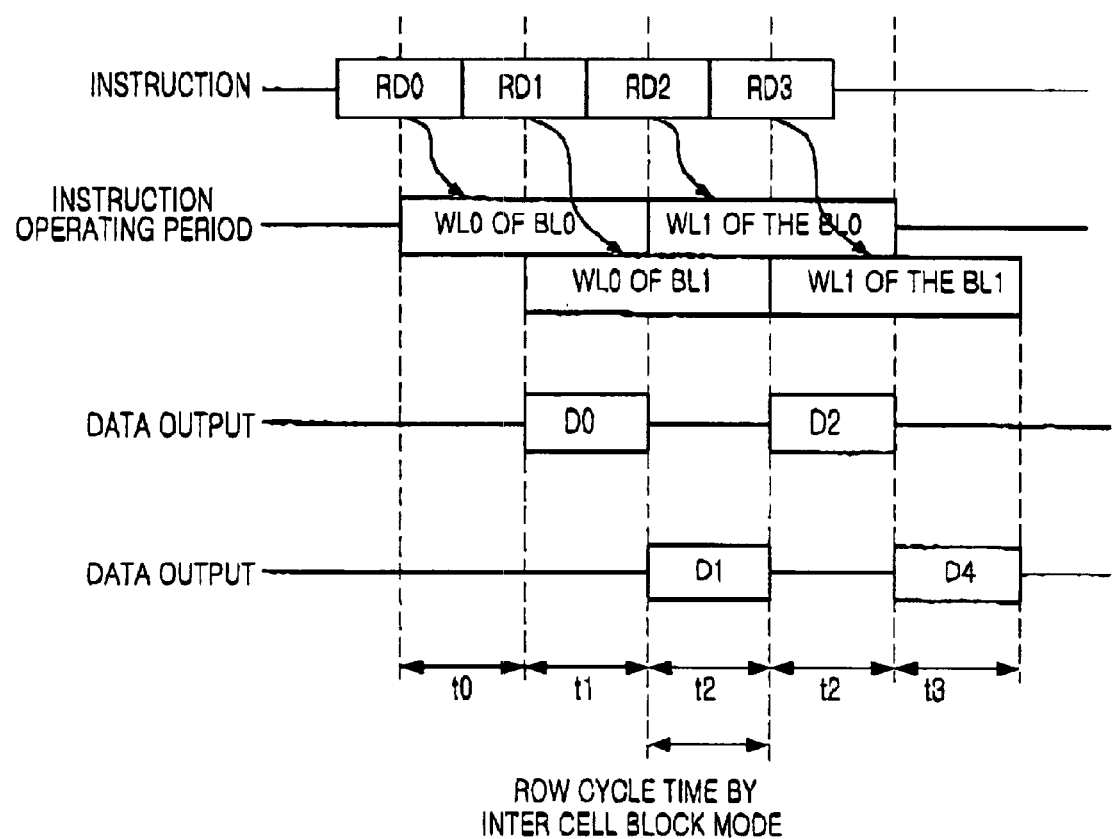
FIG. 27 is a timing diagram depicting an inter cell block interleaving mode in the memory device shown in FIG. 26.
Figure 28:
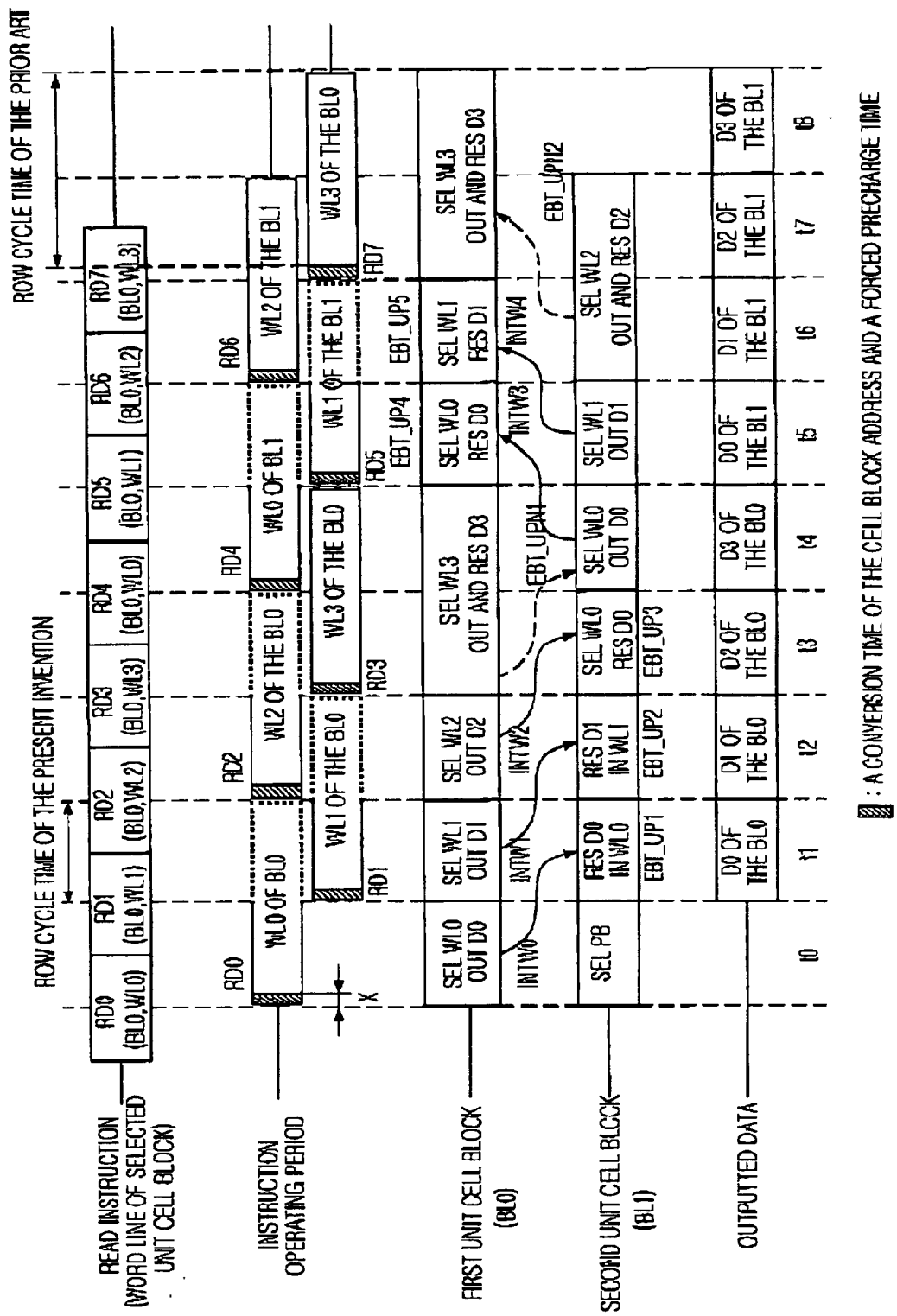
FIG. 28 is a timing diagram depicting operation of the memory device shown in FIG. 26 in a read mode.
Figure 29:
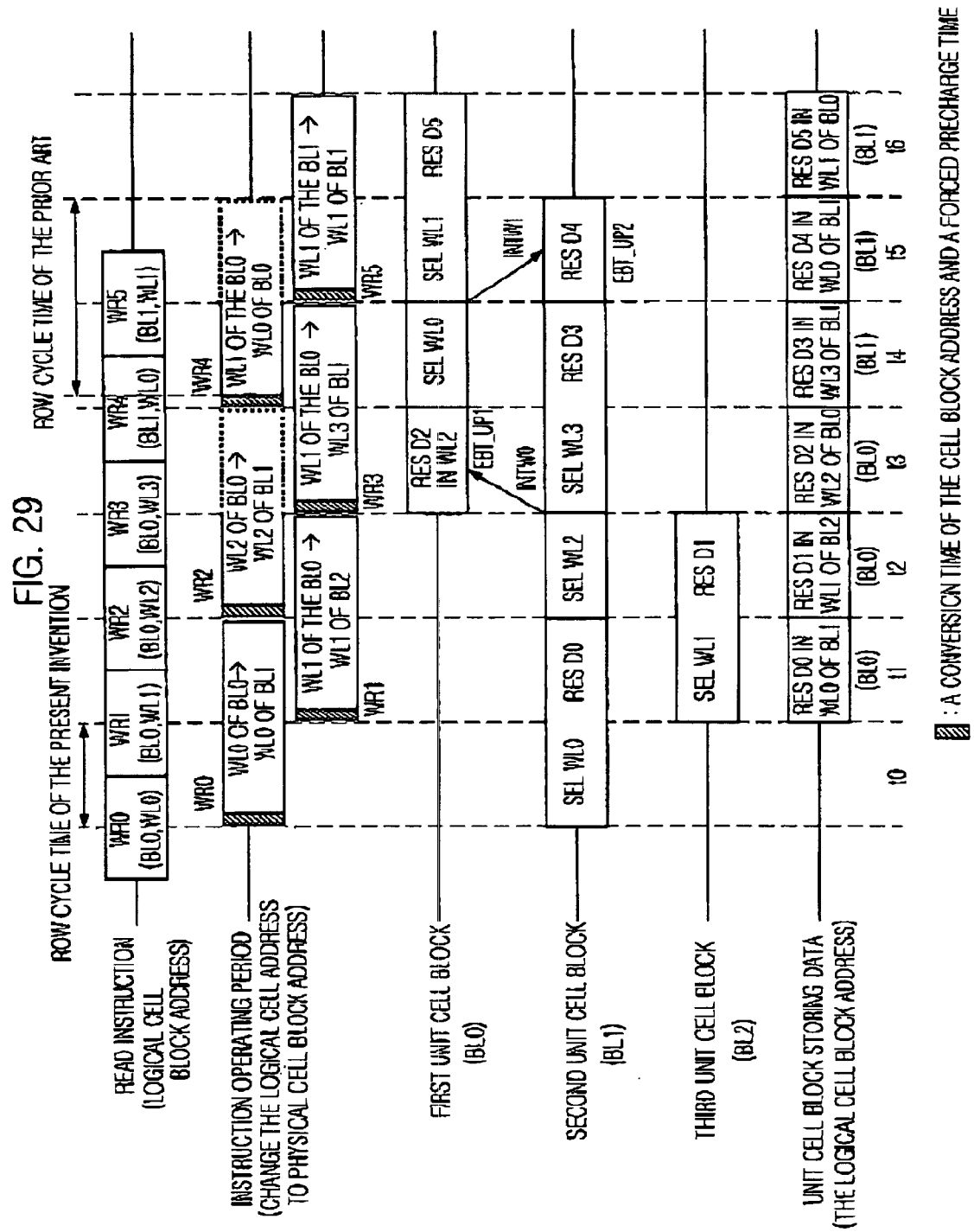
FIG. 29 is a timing diagram depicting operation of the memory device shown in FIG. 26 in a write mode.

FIG. 27 is a timing diagram depicting a cell block inter leaving mode in the memory device shown in FIG. 26, in the inter cell block data access. FIG. 28 is a timing diagram showing operation of memory device in the intra cell block data access of the read mode, and FIG. 29 is a timing diagram describing operation of memory device in FIG. 26 in the intra cell block data access of the write mode.

First, referring to FIG. 27, there is described the memory device in accordance with the present embodiment in the interleaving mode.

The row address inputted in response to one instruction has a cell block address for assigning the bank, the segment, and one unit cell block in the segment, and a local address for selecting one word line in the selected unit cell block. Also, the column address for selecting one out of the 4K number of the bit line included in one unit cell block is inputted in response to the instruction.

In first timing period t0, the logical cell block address in response to the first read instruction RD0 is converted to the physical cell block address, and the first unit cell block BL0 is selected by the converted physical cell block address.

At this, the word line WL0 of the first unit cell block BL0 is activated by the local address in response to the first read instruction RD0. The 4K bits the data stored in the 4K number of unit cell in response to the activated word line is sensed and amplified by the local bit line sense amplifier blocks, e.g., 2712A and 2712B.

The 4K bits sensed and amplified data is moved to the first and the second global bit line sense amplifier blocks 2705A and 2705B, and thereon latched. Then, one data D0 selected out of the 4 Kb data latched in the first and the second global bit line sense amplifier blocks 2705A and 2705B by the column address in response to the first read instruction RD0 is outputted to the I/O sense amplifier block 2680A. At this, the timing when the actual data D0 is outputted to the external circuit of the memory device is the second timing period t1.

In second timing period t1, the 4 Kb data latched in the first and the second global bit line sense amplifier block 2705A and 2705B in response to the first read instruction RD0 is moved to the 4K number of unit cells in response to the word line WL0 of the first unit cell block BL0.

In the other hand, during the data restoration in response to the first read instruction RD0, there is activated the word line WL0 of the second unit cell block BL1 selected in response to the second read instruction RD1 and the 4 Kb data in response to the activated word line WL0 are sensed and amplified by the local bit line sense amplifier blocks 2722A and 2722B included in the second unit cell block (BL1) 2720.

Then, the 4 Kb data sensed and amplified in response to the second read instruction RD1 are moved to the first and the second global bit line sense amplifier blocks 2705A and 2705B throughout the global bit line 2707 and thereby latched in there.

One selected by the column address in response to the second read instruction RD1 in the 4 Kb data latched in the first and the second global bit line sense amplifier blocks 171 and 173 is outputted to the I/O sense amplifier block 180A. At this, the timing period when the actual data D1 is outputted to the external circuit of the memory device is the third timing period t2.

Then, in the third timing period t3, the 4 Kb data latched in the first and the second global bit line sense amplifier blocks 2705A and 2705B in response to the second read instruction RD0 is moved to the 4K number of the unit cells in response to the word line WL0 of the second unit cell block (BL1) 152.

Thus, in the inter cell block data access pattern, the memory device in accordance with the present embodiment senses and amplifies the data in one unit cell block for restoring another data in the other unit cell block.

In the inter cell block data access patterns, the data read time is reduced for the data restoration time by operating in the interleaving mode and thereby the memory device is executed on high speed. The row cycle time by the unit cell block interleaving shown in FIG. 27 is called the timing set that the word line in response to the next instruction is activated after the word line is activated by inputting one instruction.

In addition, the execution that the data are written by turns between the unit cell blocks is not described because it is same to the read execution except overwriting the input data in response to the write instruction on the data selected in response to the write instruction in the 4 Kb data latched in the first and the second global bit line sense amplifier blocks 2705A and 2705B.

Next, referring to FIG. 28, operation of the memory device is described in case of the intra cell block data access pattern.

Assuming that the eight read instructions RD0 to RD7 are inputted as shown in FIG. 28, the contents marked in each read instruction is the word line of the unit cell block where the data is read. There are assumed the predetermined word lines of the word lines in response to the eight read instructions RD0 to RD7 in the second unit cell block (BL1) 2720.

At first timing period t0, the logical cell block address in response to the first inputted read instruction RD0 is converted to the physical cell block address. The oblique line part of each timing period is the timing set when the logical cell block is converted to the physical cell block address. At this, it is assumed that the unit cell block selected by the converted physical cell block address is same to that selected by the logical cell block address.

The word line WL0 of the first unit cell block BL0 is activated by the physical cell block address converted in response to the first read instruction RD0. And then, the data stored in the 4K number of the unit cells in response to the activated word line WL0 is sensed and amplified by the local sense amplifier block included in the first unit cell block BL0.

Then, the 4 Kb data sensed and amplified by the local sense amplifier block is moved to the first and the second global bit line sense amplifier blocks 2705A and 2705B and latched thereof throughout the global bit line 2707. One bit data selected among the 4K bits the data latched in the first and the second global bit line sense amplifier blocks 2705A and 2705B by the column address inputted in response to the first read instruction CD0 is outputted to the I/O sense amplifier block 2680A. Herein, actually, the data D0 is outputted to the external circuit of the memory device at the second timing period t1 throughout the I/O sense amplifier block 2680A and the data input/output buffer 2690.

Also, the word line WL0 of the second unit cell block BL1 is sensed as the predetermined word line of the word line WL0 at the first timing period t0.

Then, the local bit line sense amplifier block and the bit line are forcedly precharged at the second timing period t1, and there are eliminated the 4 Kb data stored in the local bit line sense amplifier block of the first unit cell block BL0 after sensed and amplified in response to the first read instruction.

And then, the word line WL1 of the first unit cell block BL0 is activated by the address in response to the second read instruction RD1. The data stored in the 4 Kb unit cells in response to the activated word line WL1 are sensed and amplified by the local bit line sense amplifier block included in the first unit cell block BL0.

In the other hand, the 4 Kb data latched in the first and the second global sense amplifier blocks 2705A and 2705B at this timing period t1, assuming that the 4K bits data stored by the first read instruction RD0, are moved to and stored in the 4 Kb unit cells in response to the word line WL0 of the second unit cell block BL1 assigned as the predetermined word line of the word line WL0. The data is moved throughout the global bit line 2705B, and the 'INTW0' shown in FIG. 28 presents the foregoing process.

Namely, while the 4 Kb data in response to the second read instruction RD1 is sensed and amplified in the first unit cell block BL0, the 4 Kb data latched in the first and the second global bit line sense amplifier blocks 2705A and 2705B in response to the first read instruction RD0 are moved to the local bit line sense amplifier block of the second unit cell block BL1, and the 4 Kb unit cells in response to the word line WL0 is restored.

Also, now and then, the word line WL0 of the second unit cell block BL1 is the logical first unit cell block BL0, and the word line WL0 of the first unit cell block BL0 is assigned to the predetermined word line of the word line WL0. There updates individually information about this in the predetermined cell block table 2710 and the tag block 2730, and the symbol 'EBT_UP1' shown in FIG. 26 describes this update operation.

Then, the 4 Kb data sensed and amplified in response to the second read instruction RD1 are moved to and latched in the first and the second global bit line sense amplifier blocks 2705A and 2705B, and the data D1 selected out of the latched data by column address in response to the second read instruction RD1 is outputted to the I/O sense amplifier block 2680A.

And then, at the third timing period t2, the word line WL2 of the first unit cell block BL0 in response to the third read instruction RD2 is activated, and the 4 Kb data in response to the activated word line WL2 moved to the first and the second global bit line sense amplifier block 2705A and 2705B and thereby latched after those are sensed and amplified.

In the other hand, the restoration execution about the second read instruction RD1 occurs in the 4K number of unit cells in response to the word line WL1 of the second unit cell block BL1, and the 'INTW1' shown in FIG. 28 presents this execution. At this time, there are updated the predetermined cell block table 2710 and the tag block 2730, and the 'EBT_UP2' presents this updating execution.

At the forth timing period t3, the restoration execution about the third read instruction RD2 occurs in the 4K number of unit cells in response to the word line WL0 of the second unit cell block BL1, and the 'INTW2' shown in FIG. 26 presents this execution. At this time, there are updated the predetermined cell block table 2710 and the tag block 2730, and the 'EBT_UP3' presents this updating execution.

In the other hand, the word line WL3 of the first unit cell block BL0 in response to the forth read instruction RD3 is activated, and the 4 Kb data in response to activated word line WL3 is sensed and amplified.

And then, at the fifth timing period t4, the restoration execution about the forth read instruction RD3 does not make the data move to the second unit cell block BL1 having the predetermined word line of the word line WL3, but occurs in the 4K number of unit cells in response to the word line WL3 of the first unit cell block BL0.

There is a reason that the word line WL0 in response to the fifth read instruction RD4 is immediately activated because execution about the fifth read instruction RD4 as a next instruction occurs in the second unit cell block BL1 and that about the forth read instruction as a prior instruction occurs in the first unit cell block BL0. Thus, it is unnecessary to update the predetermined cell block table 2710 because the predetermined word line of the word line WL3 is not changed at this time, and this is presented by the updating signal 'EBT_UPN'.

For continuous reference, if the fifth and the sixth read instructions RD4 and RD5 are inputted at each timing period t4 and t5, like forgoing statement, the 4 Kb data in response to the read instruction is sensed and amplified at first timing period, latched in the global bit line sense amplifier block, e.g., 2705A and 2705B, and then one data selected out of the 4K bits latched data is outputted. Then, at second timing period, the predetermined word line of the activated word line makes the data move to the assigned unit cell block and the restoration execution is occurred.

Referring FIG. 28, the memory device is operated in the intra cell block data access.

Though read instructions is actually operated during the dotted line part in each timing period, the data is moved and restored in the predetermined restore unit cell block, so there are updated the predetermined cell block table 2710 and the tag table 2730 in this timing set. The updating signals 'EBT_UP1' to 'EBT_UP5' present the update of the tag block 2730, and the updating signals 'EBT_UPN1' to 'EBT_UPN5' present the not update of the predetermined tag table.

In addition, the oblique line part, e.g., 'X' timing set, presents a timing set when there are forcedly precharged the data latched in the local bit line sense amplifier block of the unit cell block in accordance with the prior instruction by reading continuously the data in the same unit cell block and converting the logical cell block address to the physical cell block address.

In conclusion, when continuously reading in the same unit cell block, at first timing period, the memory device in accordance with the present embodiment amplifies the data in response to the inputted read instruction and the data is moved to the global bit line sense amplifier block, e.g., 2705A and 2705B and latched, at second timing period, the data latched in the global bit line sense amplifier block is moved to the unit cell block in which the predetermined word line of the word line activated by the read instruction and thereby restored.

Thus, in case that the data are continuously accessed in the same unit cell block, the data can be accessed on high speed because the following read instruction is inputted without the data restoration execution.

Referring to FIG. 29, there is described the execution of continuously writing the data in one unit cell block.

At first timing period t0, the logical cell block address inputted in response to the first write instruction WR0 is converted to the physical cell block address and the word line WL0 of the second unit cell block BL1 is activated.

Herein, though the cell block address inputted in response to the first write instruction WR0 selects the word line WL0 of the first logical unit cell block BL0, the actual data in response to the first logical unit cell block BL0 is stored in the unit cell in response to the word line WL0 of the second physical unit cell block BL1. In "instruction operating timing set" shown in FIG. 29, there are described information about the word line of the logical unit cell block inputted by converting execution of the cell block address inputted in response to the write instruction and the word line of the physical unit cell block selected after converting the cell block address.

Then, the 4 Kb data in response to the activated word line WL0 is sensed and amplified, moved to the first and the second global bit line sense amplifier blocks 2705A and 2705B, and thereby latched.

And then, there is eliminated one bit data selected among the 4 Kb data in response to the activated word line WL0 by the column address inputted in response to the first write instruction WR0, and the data D0 inputted from external circuit in response to the write instruction WR0 is latched instead of the eliminated data.

At second timing period t1, the 4 Kb data sensed and amplified by the first write instruction WR0 is restored in the 4K number of unit cells in response to the word line WL0 of the second unit cell block BL0. Thus, the write execution is similar to the read execution except replacing the one of the latched data with the data inputted from external circuit after sensing, amplifying, and latching the data.

In the other hand, at this timing period t1, the logical cell block address is converted to the physical cell block address in response to the second write instruction WR1, and the word line WL1 of the third unit cell block BL2 is activated in accordance with the converted physical cell block address. Then, the 4 Kb data in response to the activated word line WL1 are sensed and amplified, being latched in the first and the second global bit line sense amplifier blocks 710 and 730.

And then, there is eliminated one data selected by the column address inputted in response to the second write instruction WR1 and the data D1 inputted from the external circuit in response to the second write instruction WR1 is latched instead of the eliminated data.

At third timing period t2, the 4 Kb data latched in the first and the second global bit line sense amplifier blocks 2705A and 2705B in response to the second write instruction WR1 are restored in the 4K number of the unit cells coupled to the word line WL1 of the third unit cell block BL2.

In the other hand, there is activated the word line WL2 of the second unit cell block BL1 in response to the third write instruction WR2. Then, the 4 Kb data in response to the activated word line WL2 are sensed and amplified, being latched in the first and the second global bit line sense amplifier blocks 2705A and 2705B.

And then, there is eliminated one data selected by the column address inputted in response to the third write instruction WR2, and the data D0 inputted from the external circuit in response to the third write instruction WR2 is latched instead of the eliminated data.

At forth timing period t3, the 4 Kb data latched in the first and the second global bit line sense amplifier blocks 2705A and 2705B in response to the third write instruction WR2 are not restored in the second unit cell block BL1, but restored in 4K number of the unit cells in response to the word line WL2 of the first unit cell block BL0 assigned as the predetermined word line of the word line WL2. The 'INTW0' shown in FIG. 29 describes the forgoing process.

At this time, the predetermined word line of the word line WL2 changes the word line WL2 of the first unit cell block BL0 into the word line WL2 of the second unit cell block BL1, and information about this updates in the predetermined cell block table 2710. Also, the tag table 2730 is updated because of changing information about the logical cell block address, and this is described by the 'EBT_UP1'.

After this time, the predetermined word line of the word line WL2 is the word line WL2 of the second unit cell block BL0. Also, the word line WL2 of the second unit cell block BL1 is the word line WL2 of the logical cell block address 'BL0' in the prior step, but the word line WL2 of the first unit cell block BL0 is the word line WL2 of the logical cell block address 'BL0' past this time.

After that, execution about the forth write instruction WR3 is same to that about the first write instruction WR0.

Then, because the data must be continuously written in the first unit cell block BL0 when there is executed the fifth and the sixth write instructions WR4 and WR5, like the forgoing execution, the 4 Kb data latched in response to the fifth write instruction WR4 at sixth timing period t5 are restored in the 4 Kb unit cells in response to the word line WL0 of the second unit cell block BL1 assigned as the predetermined word line of the word line WL0. The 'INTW1' shown in FIG. 29 describes this process.

The dotted line part of the instruction activating timing set shown in FIG. 29 presents a timing set when the data in response to the prior instruction is moved to the unit cell block of which word line is assigned as the predetermined word line and restored in there, because the data in response to the next instruction is written in the same unit cell block.

In conclusion, the memory device in accordance with the present embodiment uses the cell block interleaving method for writing the data when the data is written in each other unit cell block, and restores the data by moving it to the unit cell block of which word line is assigned as the predetermined word line when the data is continuously written in the same unit cell block. This is possible because the memory device has the 256 number of the predetermined word line by including one more the unit cell block than the unit cell blocks in response to the inputted cell block address.

Therefore, in the write mode, the data can be written on high speed because the next write instruction is operated without depending on the data restoration time of the current data.

In addition, it is possible to write the data on high speed because the date restoration time is always reduced without depending on the data writing patterns, whether the data are continuously written in the one unit cell block or in each other unit cell block.

Figure 30:
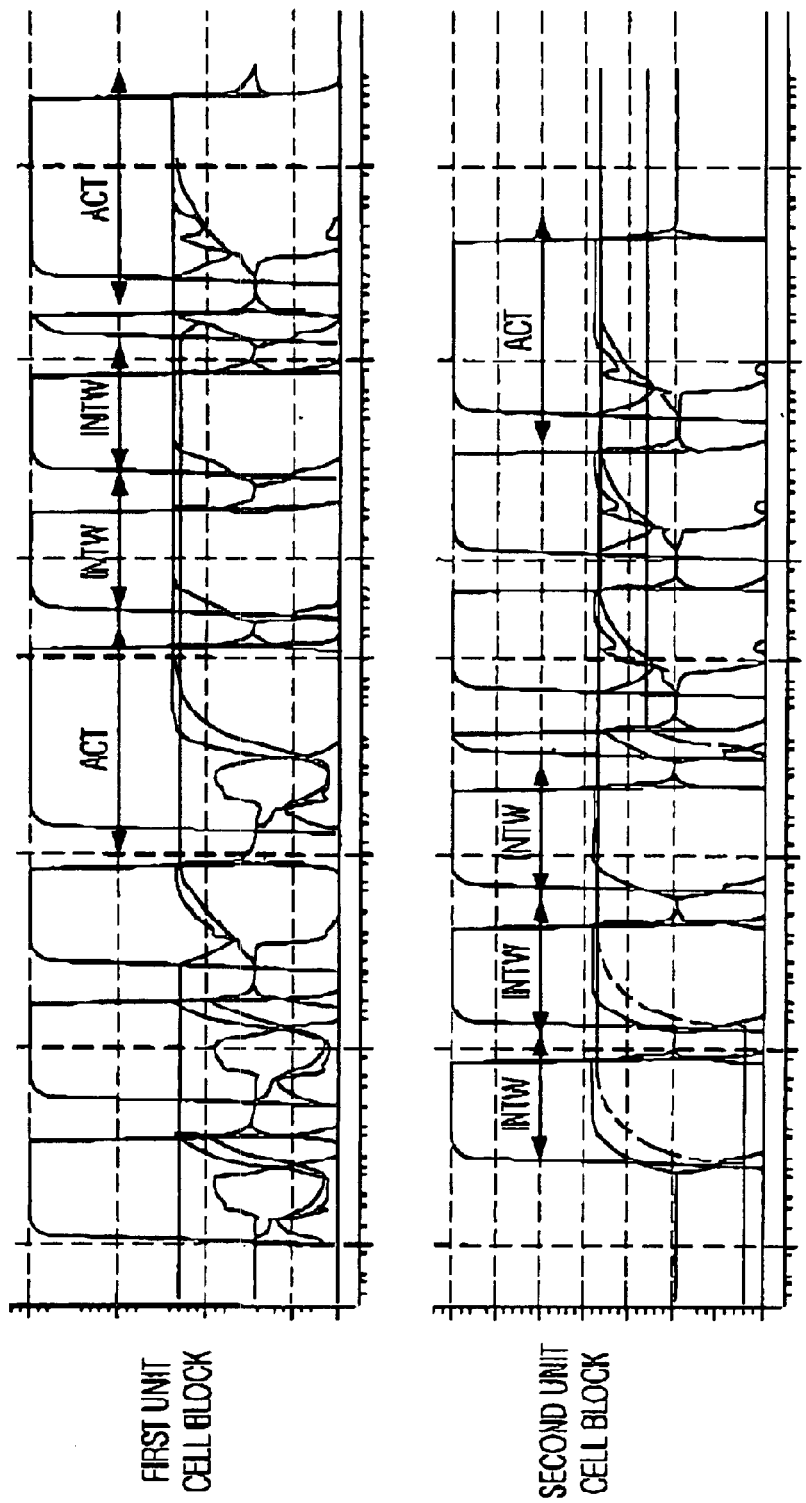
FIG. 30 is a simulation waveform showing operation of the memory device shown in FIG. 26 in the read mode.

FIG. 30 is a simulation waveform showing operation of the memory device in intra cell block data access of read mode.

As shown, the restoration operation about the read data is occurred in the unit cell block of which word line is assigned as the predetermined word line because the following read instruction continuously reads the data in the same unit cell block when the read instructions RD0 to RD2 and RD4 to RD5 is activated, and there are occurred total 5 times of data transmittance and restoration execution, e.g., 'INTW' shown in FIG. 30. Also, because the next instruction accesses other unit cell block when the read instructions RD3, RD6, and RD7 is executed, the data restoration operation, e.g., 'ACT' shown in FIG. 30, is occurred in one selected unit cell block.

Figure 31:
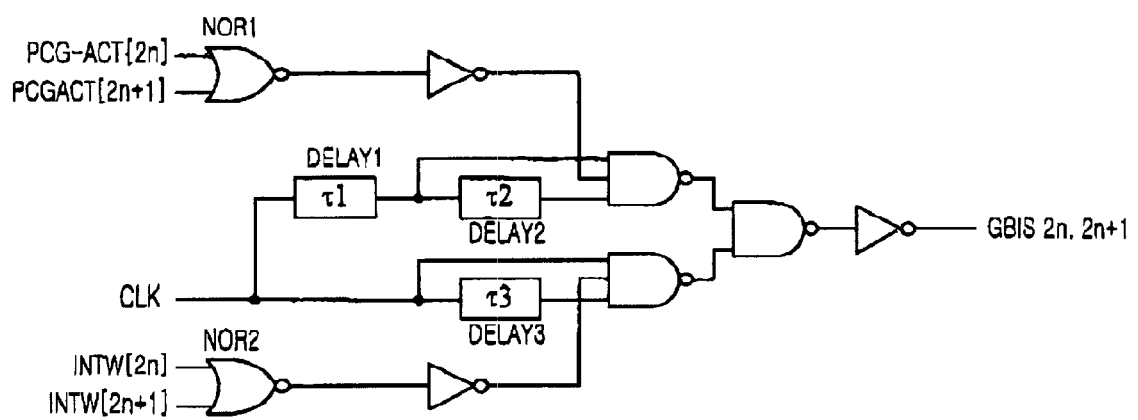
FIG. 31 is a schematic circuit diagram describing a circuit for generating signals used for a global bit line connection unit shown in FIG. 24.

FIG. 31 is a schematic circuit diagram describing a circuit for generating connection control signals used in the global bit line connection units, e.g., 2718, 2728, . . . , and 2758, shown in FIG. 26.

As a circuit described in FIG. 29 is a circuit for controlling the global bit line connection units, e.g., 2718, a first NOR gate NOR1 receives signals PCG-ACT[2n] and PCG-ACT[2n+1] for sensing and amplifying the data in response to the word line selected by the instruction, and a second NOR gate NOR2 receives signals INTW[2n] and INTW[2n+1] for moving and restoring the data when the same unit cell block is continuously accessed and outputs a global bit line control signal GBIS for controlling the global bit line connection unit. The 1, 2, 3 means delaying time delayed by each of delay blocks Delay1 to Delay3.

Figure 32:
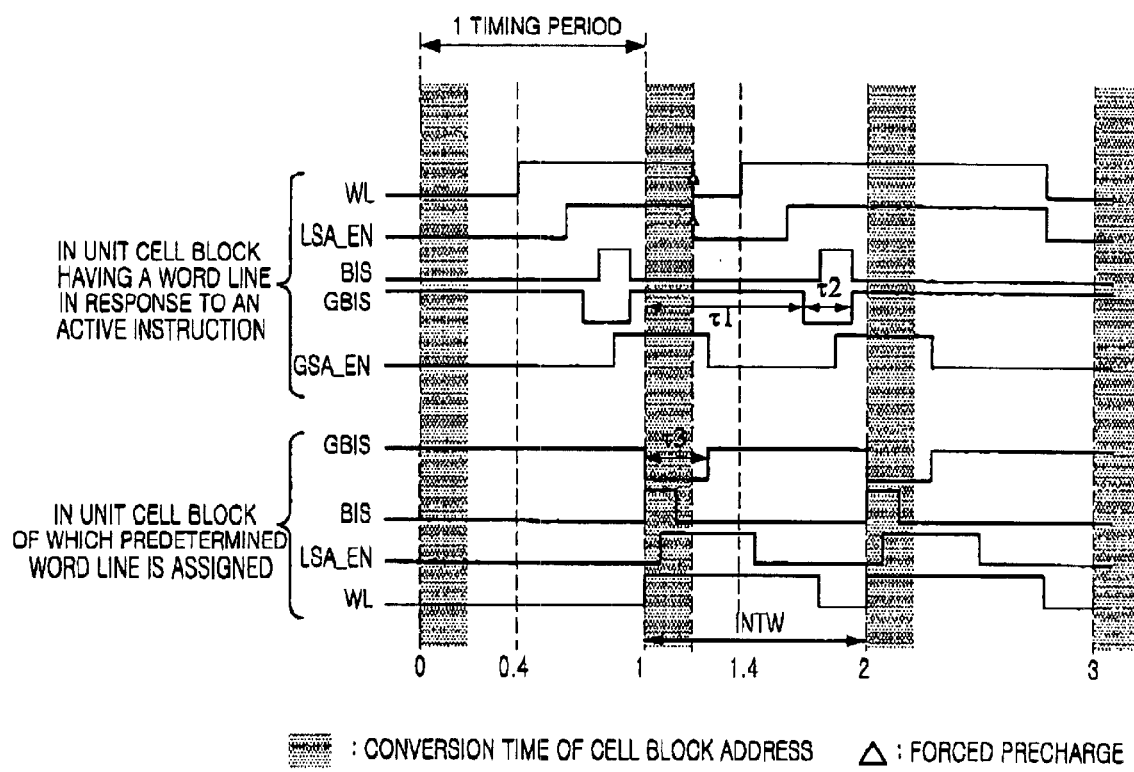
FIG. 32 is a timing diagram showing operation of the memory device in response to the signals generated from th circuit shown in FIG. 31.

FIG. 32 is a timing diagram showing operation of the memory device in response to the signal generated from the circuit shown in FIG. 31.

The oblique line part shown in FIG. 32 means a time when the logical cell block address is converted to the physical cell block address in each of timing periods. The delaying times 1, 2, and 3 shown in FIG. 32 is determined by the delay blocks Delay1 to Delay3 shown in FIG. 31.

The 'LSA_EN' shown in FIG. 32 is a enable signal of the local bit line sense amplifier, the 'GBIS' is a enable signal of the global bit line sense amplifier, and the 'GSA_EN' is a enable signal of the global sense amplifier block.

In addition, ' ' is forcedly inactivated when the second instruction next activated accesses the word line activated by the first instruction in the same unit cell block, and the 'INTW' presents that the predetermined word line of the word line in response to the first instruction moves the data to the unit cell block of which word line is assigned as the predetermined word line and thereby latches the data in there. In the memory device of the present invention as shown in FIG. 32, it is understood that the converting time of the cell block address and the forcedly precharging time occupy 40 percent of total one timing period.

Referring to the foregoing statement, for implementing the memory device in accordance with the present invention, the memory device must include one unit cell block per one cell area in the segment, the predetermined cell block table, and the tag block, etc. In addition, because the global bit line sense amplifier and the global bit line are further included, there is more a additional area than the typical memory device However, the memory device of the present invention can be accessed more on high speed than the prior memory device because the execution time of the memory device is reduced for the data restoration time by adding the above stated blocks Assuming that the row cycle time of the memory device in accordance with the prior art is tRC, that in accordance with the present invention is MAX{0.5×(tBAT,+tRP+tRC), tINTW}. Namely, in '0.5×(tBAT,+tRP+tRC)' and 'tINTW', which one is longer time than the other determines the row cycle time of the memory device.

Herein, the 'tBAT' is the converting time of the cell block address, the 'tRP' is the precharging time, the 'tRC' is the previous row cycle time, and the 'tINTW' is the restoration time by moving the internally latched data to the unit cell block of which word line is assigned as the predetermined word line.

Herein, for implementing a preferred embodiment, as the 'tRP' is the forcedly precharge execution occurred when every instruction is operated, for immediately accessing next data when the data are accessed in the same unit cell block, it means to sensing and amplifying the data at the prior timing, disabling the local bit line sense amplifier, and precharging the local bit line.

The row cycle time of the memory device in accordance with the present invention is determined by which one is longer time than the other determines the row cycle time of the memory device, and typically, it is determined to '0.5×(tBAT,+tRP+tRC)' because '0.5×(tBAT,+tRP+tRC)' is longer than 'tINTW'.

If the row cycle time of the memory device is '0.5×(tBAT,+tRP+tRC)', because reducing by the data restoration time even though further adding the forcedly precharging time and the time when the logical cell block address is converted to the physical cell block address, the row cycle time is reduced about 30% to about 40%, referring to comparing the row cycle time of the present invention shown in FIGS. 28 and 29 with that of the conventional memory device.

For instance, if one instruction executes for 15 n second, in the conventional memory device, the row cycle time is two timing period, namely 30 n second. However, in the present invention, assuming that the cell block converting time is 3 n second and the forcedly precharging time is 3 n, the row cycle time is 21 n second adding one timing period 15 n second with 6 n second additional timing.

In the other hand, the memory device in accordance with the preferred embodiment moves the data if the unit cell block accessed by the next instruction is identical to that accessed by the previous instruction, and updates the tag if the data is moved.

However, for implementing the memory device in accordance with the present invention, both activating the word line of the unit cell block accessed at the present timing and moving to the unit cell block including the predetermined word line of the selected word line to restore can be occurred at simultaneous time in the memory device. In this case, the data is always stored in two unit cell blocks, the unit cell block storing the actual data is determined by the tag table. In this case, if the data sensed and amplified in the unit cell block is latched in the global bit line sense amplifier block whenever the instruction is executed, the memory device is implemented for forcedly precharging the data latched in the local bit line sense amplifier block of the unit cell block.

In addition, in the preferred embodiment, the memory device receives the data or outputs the data at latching time after sensing and amplifying the data at first timing, but it is possible to implement the memory device for receiving or outputting the data in response to the instruction at the data restoration execution that is the second timing when the instruction is activated.

One of the above methods is properly selected according to design technique of the memory device, and the data is accessed on high speed unrelated to the data restoration time using which above method the memory device is implemented by.

It is possible for the memory device in accordance with the preferred embodiment to execute on high speed because of reducing the data access time, but adding to time tBAT converting the logical cell block address to the physical cell block address and forcedly precharging time tRP which are not included in the prior memory device.

For high speed execution in the present invention, it is provided the memory device having row cycle time reducing for forcedly precharging time tRP and converting time tBAT of the cell block address from the memory device shown in FIG. 26.

Figure 33:
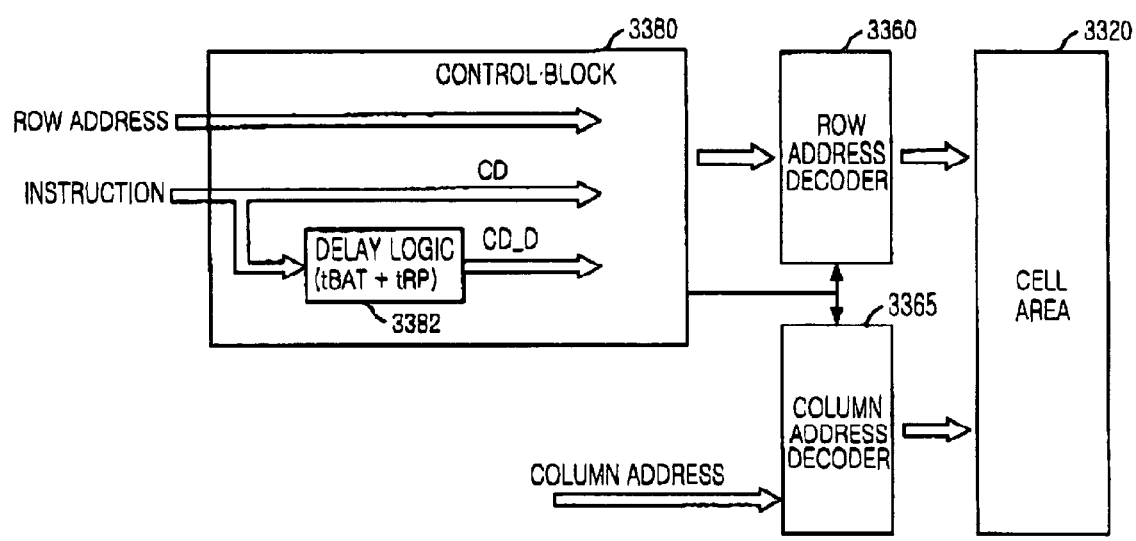
FIG. 33 is a block diagram depicting a memory device having a reduced row cycle time.

FIG. 33 is a block diagram showing the memory device having a reduced row cycle time.

As shown, the memory device of the present invention directly receives the instruction CD from the control block 3380, and generates the second instruction CD_D, delaying the instruction CD for forcedly precharging time tRP and converting time tBAT of the cell block address outputted from the delay block 3382. The control block 3380 converts the logical cell block address to the physical cell block address and operates forcedly precharging execution, and the delayed instruction CD_D controls the cell area 3320 for operating other executions needed in the data access process.

Figure 34:
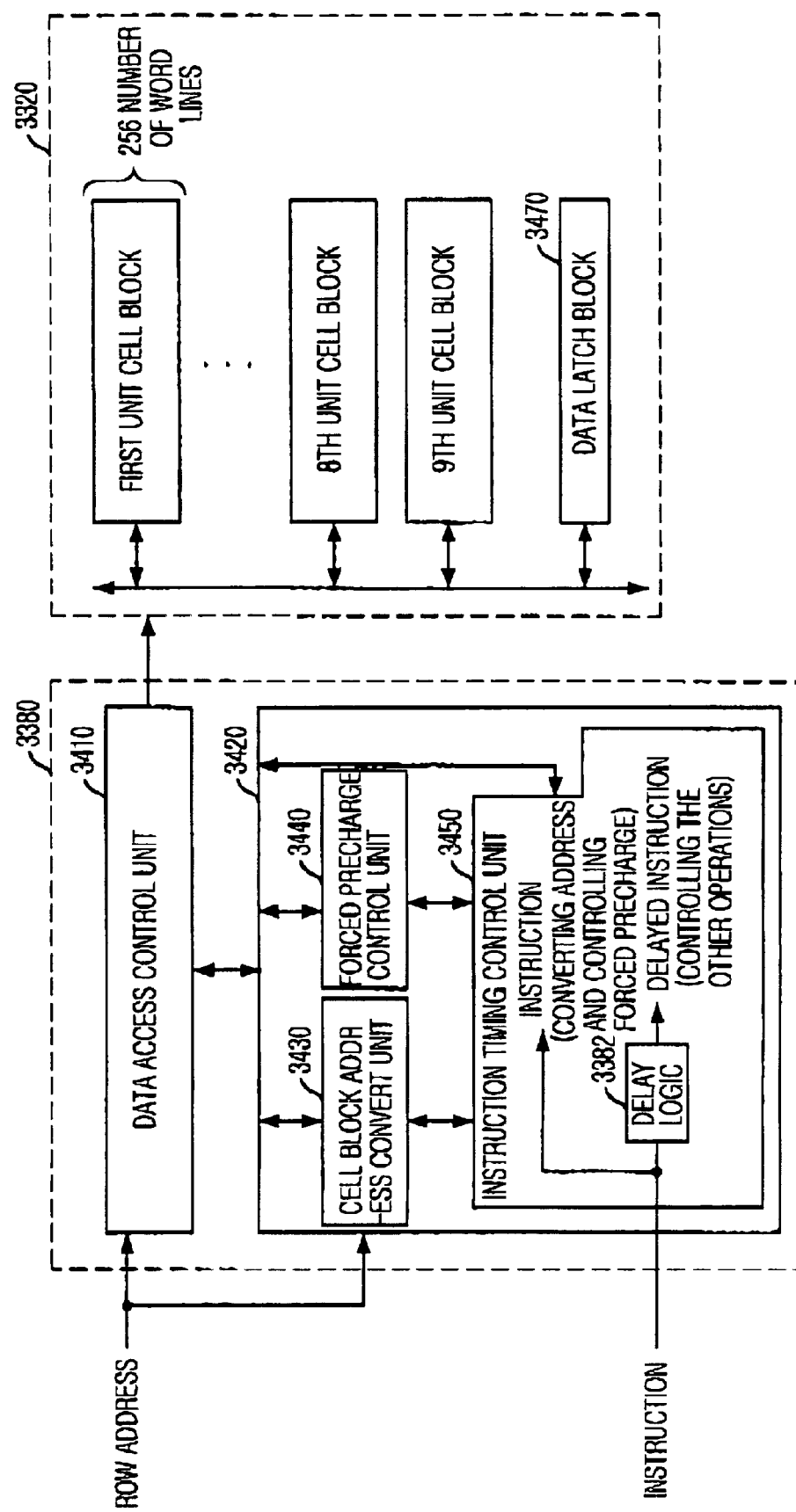
FIG. 34 is a block diagram describing the memory device shown in FIG. 33 in detail.

FIG. 34 is a block diagram describing the memory device shown in FIG. 33 in detail.

As shown, the memory device includes a cell area including N+1 number of unit cell blocks adding N number of the unit cell blocks individually having M number of word lines for responding to an inputted row address and an additional unit cell block having M number of the word lines; a data access control block for controlling operation that data accessed in a first unit cell block selected in the N+1 number of the unit cell blocks are restored either in the first unit cell block or in a second unit cell block; and an instruction control block for controlling operation that a cell block address in response to a second instruction being at an active next timing period is conversed and a bit line in response to a first instruction is forcedly precharged during accessing data in response to the first present active instruction.

The data access control block controls operation that not a first data is restored in a first unit cell block but a second data is accessed in the first unit cell block and the first data is restored in the firs unit cell block, when the first and the second data is continuously accessed in the first unit cell block.

The data access control block controls operation that a second data is accessed in the second unit cell block at a timing period when a first data is restored in the first unit cell block when the first and second data are accessed in the first and the second unit cell blocks by turns.

Figure 35:
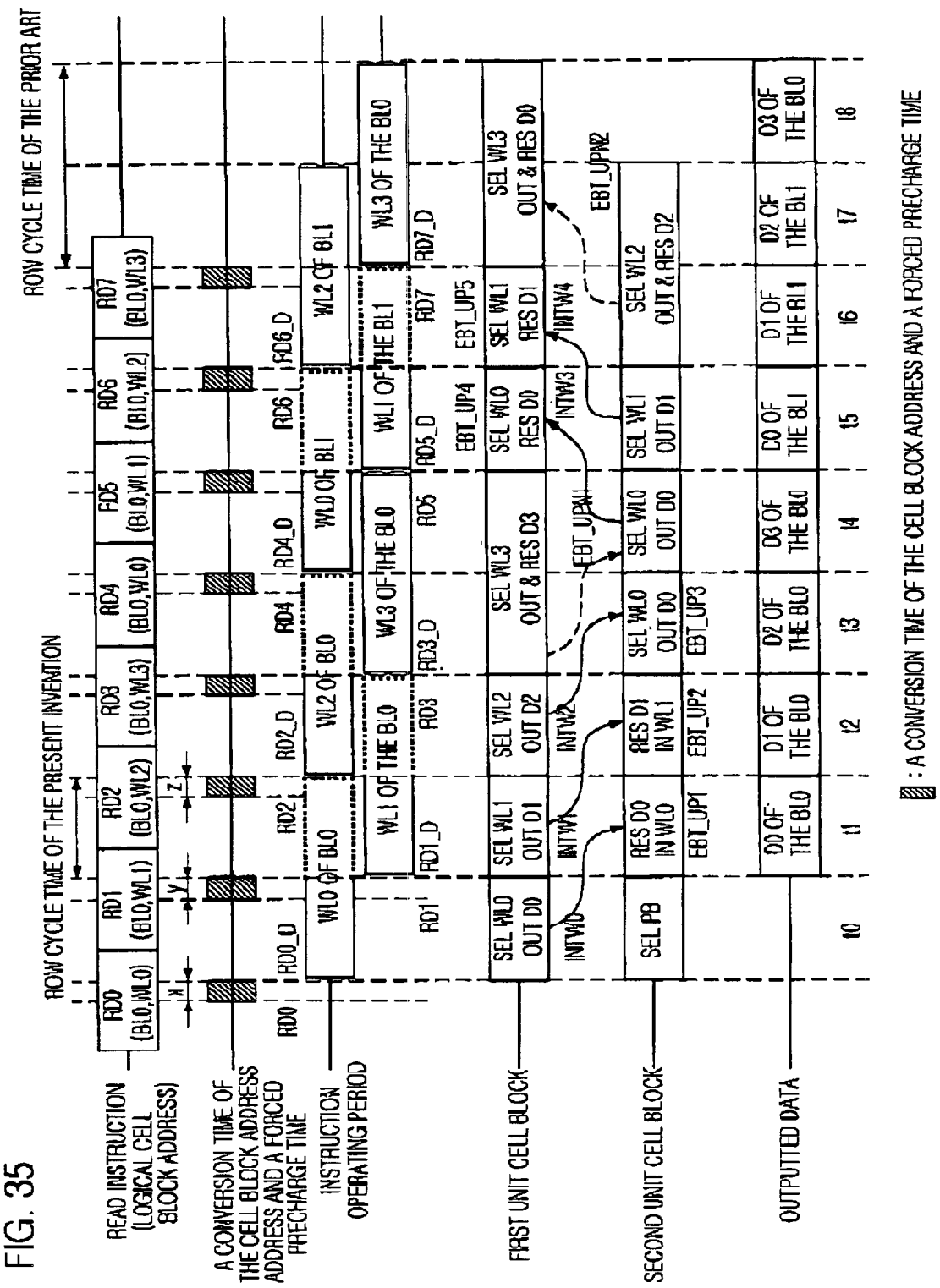
FIG. 35 is a timing diagram depicting operation of the memory device shown in FIG. 34 in response to continuously inputted reed instructions.

FIG. 35 is a timing diagram depicting operation of the memory device shown in FIG. 34 in response to continuously inputted read instruction. Hereinafter, referring to FIGS. 33 to 35, there is described operation of the memory device.

First, the memory device converts the logical cell block address in response to the first inputted read instruction RD0 to the physical cell block address, and operates forcedly precharging operation. At this, if the unit cell block accessed in response to the prior instruction is same to that in response to the first read instruction RD0 activated at the present, the precharging operation does not operates the restoration execution of the prior read instruction but operates forced precharging operation. However, like this, there is not occurred the actual forced precharging operation in the first read execution of the memory device because there is not the previous instruction.

Thus, when the memory device of the present invention operates the first instruction, there is latency, e.g., 'X' timing set in FIG. 35, for forced precharging time tRP and converting time tBAT of the cell block address.

In the other hand, the delay block 3382 in the instruction timing control block 3450 generates the first delayed instruction RD0_D delayed for forced precharging time tRP and converting time tBAT of the cell block address.

Then, at first timing period t0, the data access control block 3380 is controlled for activating the word line WL0 of the first unit cell block BL0 in response to the first delayed instruction RD0_D outputted from the instruction control block 3420. And the 4 Kb data in response to the activated word line WL0 are sensed and amplified by the local bit line sense amplifier.

Then, the 4K bits sensed and amplified data are moved to and latched in the data latch block 3470. One data D0 selected out of the 4K bits sensed and amplified data by the column address inputted in response to the first read instruction CD0 is outputted to the I/O sense amplifier block, referring to 2600 of FIG. 26. Herein, like a foregoing statement, the output data D0 is outputted to the external circuit of the memory device throughout the input/output buffer, and so on.

In the other hand, at first timing t0, the instruction control block 3420 receives the second read instruction RD1 and converts the logical cell block address in response to the second read instruction to the physical cell block address. Then, the instruction control block 3420 compares the first read instruction RD0 with the unit cell block having the data accessed by the second read instruction RD1. At this, because the data is read in the same unit cell block by the first and the second read instruction RD0 and RD1, there are forcedly precharged the 4 Kb data latched in the local bit line sense amplifier block of the first unit cell block BL0 after sensed and amplified in response to the first read instruction RD0, e.g., 'Y' timing set of FIG. 35.

In addition, at 'Y' timing set, the instruction timing control block 3450 generates the second delayed instruction RD1_D delaying the second read instruction RD1 for forced precharging time tRP and converting time tBAT of the cell block address.

Then, at second timing period t1, the word line WL1 of the first unit cell block BL0 is activated in response to the second delayed read instruction RD1_D. And the 4 Kb data in response to the activated word line WL1 is sensed and amplified by the local bit line sense amplifier, moved to the data latch block 3470. Then, one data D1 selected out of the 4 Kb data latched in the data latch block 450 by the column address inputted in response to the second read instruction RD1 is outputted to the I/O sense amplifier.

In the other hand, at this timing period t1, there is activated the word line WL0 of the second unit cell block BL1, which is assigned as the predetermined word line of the word line WL0 activated in response to the first read instruction, and the data latched in the data latch block 3470 are moved to the 4K number of the unit cells in response to word line WL0 of the second unit cell block BL1 and thereby latched in. The 'INTW0' describes this execution.

Then, at second timing period t1, the third read instruction RD2 is inputted to the instruction control block 3420, and the logical cell block address in response to the third read instruction is converted to the physical cell block address. And, the instruction timing control block 3450 compares the second read instruction RD1 with the unit cell block having the data accessed by the third read instruction RD2. At this, because the data is read in the same unit cell block by the second and the third read instruction RD1 and RD2, there are forcedly precharged the 4 Kb data latched in the local bit line sense amplifier block of the first unit cell block BL0 after sensed and amplified in response to the second read instruction RD1, e.g., 'Z' timing set of FIG. 35.

In addition, at 'Z' timing set, the instruction timing control block 3450 generates the third delayed instruction RD2_D delaying the third read instruction RD2 for forced precharging time tRP and converting time tBAT of the cell block address.

At third timing period t2, the word line WL2 of the first unit cell block BL0 is activated by the third delayed read instruction RD2_D delayed for forced precharging time tRP and converting time tBAT of the cell block address from the delay block 440.

And the 4 Kb data in response to the activated word line WL2 is sensed and amplified by the local bit line sense amplifier, moved to the data latch block 3470. Then, one data D2 selected out of the 4 Kb data latched in the data latch block 3470 by the column address inputted in response to the third read instruction RD2 is outputted to the I/O sense amplifier.

In the other hand, at this timing period t2, there is activated the word line WL1 of the second unit cell block BL1, which is assigned as the predetermined word line of the word line WL1 activated in response to the second read instruction RD1, and the data latched in the data latch block 3470 are moved to the 4K number of the unit cells in response to word line WL1 of the second unit cell block BL1 and thereby latched in. The 'INTW1' describes this execution.

Operation of the memory device shown in FIG. 34 like foregoing statement in similar to that shown in FIG. 25, but there are differences that the memory device uses the inputted read instruction for converting the cell block address and, for execution related to activating word line, sensing and amplifying the data in the unit cell, restoring it, and so on, executing forced precharging execution and thereby the delayed read instruction RD_D delayed for forced precharging time tRP and converting time tBAT of the cell block address.

In this way, at initial operation of the memory device, the row cycle time has the latency, e.g., 'X' of FIG. 35, of forced precharging time tRP and converting time tBAT of the cell block address in response to the first activated road instruction, however it reduces for forced precharging time tRP and converting time tBAT of the cell block address since the second read instruction is activated.

There is a reason that the row cycle time is not affected because executions in response to the following read instruction, both forced precharging and conversion of the cell block address, are occurred when the data is sensed and amplified in response to the prior read instruction.

In above description, there is described the read operation of the memory device shown in FIG. 34, and the explanation about the write operation is omitted because the write operation is similar to the read operation. Namely, at the write execution, instead of outputting the data selected out of the data latched in the data latch block 3470, it is different for the memory device to overwrite the data inputted from the external circuit to the data selected out of the data latched in the data latch block 3470.

FIG. 36 is a timing diagram showing operation of the memory device shown in FIG. 34, comparing with operation of the memory device shown in FIG. 18, for easily understanding operation of the memory device in accordance with the present invention.

As shown, the first instruction CD0 operates to convert the cell block address and to forcedly precharge at $a_0$ timing set, and the first delayed instruction CD0_D delaying the first instruction CD0 for 'tRP+tBAT' operates to activate word line and to sense/amplify the data in response to the activated word line at $b_0$ timing set. And the second instruction CD1 operating next timing is inputted to convert the cell block address at a1 timing set of $b_0$ period, then there is occurred the forced precharging execution in response to the first instruction. At $b_1$ timing set, the second delayed instruction CD1_D delaying the first instruction CD0 for 'tRP+tBAT' operates to activate word line and to sense/amplify the data in response to the activated word line at $b_0$ timing set.

Thus, the row cycle time of the memory device shown in FIG. 34 is decided into MAX{0.5×tRC,tINTW}. At this time, 'tRC' is the prior row cycle time $b_0+b_1$, and 'tINTW' is a time for activating the predetermined word line of the word line in response to the operating instruction, moving the data to the unit cell block of which word line is assigned as predetermined word line from the data latch block and thereby restoring.

The row cycle time MAX{0.5×tRC,tINTW} of the memory device shown in FIG. 34 eliminates 'tBAT' for converting the cell block address and 'tRP' for precharging forcedly from the row cycle time MAX{0.5×(tRC,+tRP+tRC),tINTW} of the memory device described in foregoing statement.

Because 'tINTW' is typically longer than 'tRP', the row cycle time is substantially 0.5×tRC, so it is possible for the memory device shown in FIG. 34 to reduce the row cycle time for maximum a half vis-à-vis the row cycle time of the memory device in accordance with the prior art. Namely, as shown in FIG. 36, the row cycle time of the memory device in accordance with the prior art is $b_0+b_1$, but that in accordance with the present invention is $b_0$.

In the present invention, the memory device for accessing the data on high speed is implemented, free to the data restoration time that certainly occupies large part of the data access time in the memory device using the capacitor as the memory unit element.

In addition, there is provided the method and the apparatus of the memory device for high speed data access unrelated to a data access pattern that the data are either continuously accessed in one cell block or accessed by turns in each of cell blocks. Thus, in the system including the memory device of the present invention as main memory device, total speed of the system is dramatically improved unrelated to the data access pattern.

While the present invention has been described with respect to the particular embodiments, it will be apparent to those skilled in the art that various changes and modifications may be made without departing from the spirit and scope of the invention as defined in the following claims.

What is claimed is:

1. A memory device, comprising;
   at least two cell blocks connected to a global bit line for outputting data in response to an instruction;

at least one global bit line connection unit for selectively connecting the global bit line to each cell block under control of a control block, one global bit line connection unit being allocated between the two cell blocks; and said control block for controlling output of data stored in each cell block to the global bit line and restoration of the outputted data of the global bit line to the original cell block or another cell block which is determined by depending upon whether data in response to a next instruction is outputted from the original cell block or another cell block.

2. The memory device as recited in claim 1, wherein each cell block includes;
- a first cell array including a plurality of unit cells and outputting data;
- a first bit line sense amplifier block for amplifying data outputted from the first cell array and outputting the amplified data to the global bit line; and
- a first bit line sense amplifier connection unit for connecting the first cell array to the first bit line sense amplifier block and disconnecting the first cell array to the first bit line sense amplifier block as soon as the data are sensed in the first bit line sense amplifier block.

3. The memory device as recited in claim 2, wherein each cell block includes:
- a second bit line sense amplifier block for amplifying data inputted from the global bit line; and
- a second bit line sense amplifier connection unit for connecting or disconnecting the first cell array to the second bit line sense amplifier block.

4. The memory device as recited in claim 3, further comprising a latch means for transiently latching the data supplied to the global bit line in response to the instruction.

5. The memory device as recited in claim 4, wherein the control block controls to restore the data latched by the latch means in the first cell block and to read another data stored in the first cell block or another cell block in response to the next instruction at a substantially simultaneous timing period.

6. The memory device as recited in claim 5, wherein the control block controls to output the data latched by the latch means in response to the active instruction.

* * * * *

UNITED STATES PATENT AND TRADEMARK OFFICE
CERTIFICATE OF CORRECTION

| | | |
|---|---|---|
| PATENT NO. | : 6,937,535 B2 | Page 1 of 1 |
| APPLICATION NO. | : 10/696144 | |
| DATED | : August 30, 2005 | |
| INVENTOR(S) | : Ahn et al. | |

It is certified that error appears in the above-identified patent and that said Letters Patent is hereby corrected as shown below:

Col. 10, Line 64, please remove "th" and insert -- the --.

Signed and Sealed this

Fourth Day of December, 2007

JON W. DUDAS
*Director of the United States Patent and Trademark Office*